United States Patent
Bertin et al.

(10) Patent No.: US 9,715,927 B2
(45) Date of Patent: *Jul. 25, 2017

(54) 1-R RESISTIVE CHANGE ELEMENT ARRAYS USING RESISTIVE REFERENCE ELEMENTS

(71) Applicant: Nantero Inc., Woburn, MA (US)

(72) Inventors: Claude L. Bertin, Venice, FL (US); Lee Cleveland, Santa Clara, CA (US)

(73) Assignee: Nantero, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/079,458

(22) Filed: Mar. 24, 2016

(65) Prior Publication Data

US 2016/0217855 A1    Jul. 28, 2016

Related U.S. Application Data

(63) Continuation of application No. 14/603,037, filed on Jan. 22, 2015, now Pat. No. 9,299,430.

(51) Int. Cl.
*G11C 17/00* (2006.01)
*G11C 13/00* (2006.01)
(Continued)

(52) U.S. Cl.
CPC ...... *G11C 13/0069* (2013.01); *G11C 13/0004* (2013.01); *G11C 13/004* (2013.01);
(Continued)

(58) Field of Classification Search
CPC ............ G11C 13/0069; G11C 13/0004; G11C 13/0007; G11C 13/0011; G11C 11/5678
(Continued)

(56) References Cited

U.S. PATENT DOCUMENTS 6,057,637 A    5/2000    Zettl
6,128,214 A    10/2000    Kuekes et al.
(Continued)

FOREIGN PATENT DOCUMENTS

EP    1489621    12/2004
GB    2364933    2/2002
(Continued)

OTHER PUBLICATIONS

Ago, et al., "Workfunction of Purified and Oxidized Carbon Nanotubes," Synthetic Metals, vol. 103, 1999, pp. 2494-2495.
(Continued)

*Primary Examiner* — Pho M Luu
(74) *Attorney, Agent, or Firm* — Nantero, Inc.

(57) ABSTRACT

Methods for reading and programming one or more resistive change elements within a 1-R resistive change element array are disclosed. These methods include using measurement and storage elements to measure the electrical response of one or more selected cells within an array and then comparing that stored electrical response to the electrical response of a reference element within the array to determine the resistive state of the one or more selected cells. These methods also include programming methods wherein selectable current limiting elements are used to permit or inhibit programming currents from flowing through selected and unselected cells, respectively. These methods further include programming methods that use specific biasing of array lines to provide sufficient programming currents through only selected cells.

18 Claims, 40 Drawing Sheets

(51) Int. Cl.
*G11C 13/02* (2006.01)
*G11C 11/56* (2006.01)
(52) U.S. Cl.
CPC ...... *G11C 13/0007* (2013.01); *G11C 13/0026* (2013.01); *G11C 13/0028* (2013.01); *G11C 13/0038* (2013.01); *G11C 13/0061* (2013.01); *G11C 13/025* (2013.01); *G11C 11/5678* (2013.01); *G11C 13/0011* (2013.01); *G11C 2013/0054* (2013.01); *G11C 2013/0078* (2013.01); *G11C 2213/71* (2013.01); *G11C 2213/72* (2013.01); *G11C 2213/77* (2013.01)
(58) Field of Classification Search
USPC .............................. 365/100, 163, 113, 148
See application file for complete search history.

(56) References Cited

U.S. PATENT DOCUMENTS

| | | | |
|---|---|---|---|
| 6,256,767 | B1 | 7/2001 | Kuekes et al. |
| 6,277,318 | B1 | 8/2001 | Bower |
| 6,314,019 | B1 | 11/2001 | Kuekes et al. |
| 6,342,276 | B1 | 1/2002 | You |
| 6,409,567 | B1 | 6/2002 | Amey, Jr. et al. |
| 6,422,450 | B1 | 7/2002 | Zhou et al. |
| 6,423,583 | B1 | 7/2002 | Avouris et al. |
| 6,445,006 | B1 | 9/2002 | Brandes et al. |
| 6,495,116 | B1 | 12/2002 | Herman |
| 6,495,258 | B1 | 12/2002 | Chen et al. |
| 6,515,339 | B2 | 2/2003 | Shin et al. |
| 6,528,020 | B1 | 3/2003 | Dai et al. |
| 6,548,841 | B2 | 4/2003 | Frazier et al. |
| 6,630,772 | B1 | 10/2003 | Bower et al. |
| 6,645,628 | B2 | 11/2003 | Shiffler, Jr. et al. |
| 6,706,402 | B2 | 3/2004 | Ruckes et al. |
| 6,707,098 | B2 | 3/2004 | Hofmann et al. |
| 6,759,693 | B2 | 7/2004 | Vogeli et al. |
| 6,803,840 | B2 | 10/2004 | Hunt et al. |
| 6,808,746 | B1 | 10/2004 | Dai et al. |
| 6,809,465 | B2 | 10/2004 | Jin |
| 6,833,558 | B2 | 12/2004 | Lee et al. |
| 6,835,591 | B2 | 12/2004 | Ruckes et al. |
| 6,858,197 | B1 | 2/2005 | Delzeit |
| 6,863,942 | B2 | 3/2005 | Ren et al. |
| 6,888,773 | B2 | 5/2005 | Morimoto |
| 6,890,780 | B2 | 5/2005 | Lee |
| 6,894,359 | B2 | 5/2005 | Bradley et al. |
| 6,899,945 | B2 | 5/2005 | Smalley et al. |
| 6,905,892 | B2 | 6/2005 | Esmark |
| 6,918,284 | B2 | 7/2005 | Snow et al. |
| 6,919,592 | B2 | 7/2005 | Segal et al. |
| 6,919,740 | B2 | 7/2005 | Snider |
| 6,921,575 | B2 | 7/2005 | Horiuchi et al. |
| 6,924,538 | B2 | 8/2005 | Jaiprakash et al. |
| 6,946,410 | B2 | 9/2005 | French et al. |
| 6,955,937 | B1 | 10/2005 | Burke et al. |
| 6,969,651 | B1 | 11/2005 | Lu et al. |
| 6,990,009 | B2 | 1/2006 | Bertin et al. |
| 7,015,500 | B2 | 3/2006 | Choi et al. |
| 7,057,402 | B2 | 6/2006 | Cole et al. |
| 7,075,817 | B2 | 7/2006 | Rinerson et al. |
| 7,115,901 | B2 | 10/2006 | Bertin et al. |
| 7,115,960 | B2 | 10/2006 | Bertin et al. |
| 7,161,403 | B2 | 1/2007 | Bertin |
| 7,335,395 | B2 | 2/2008 | Ward et al. |
| 7,365,632 | B2 | 4/2008 | Bertin et al. |
| 7,479,654 | B2 | 1/2009 | Bertin et al. |
| 7,781,862 | B2 | 8/2010 | Bertin et al. |
| 7,835,170 | B2 | 11/2010 | Bertin et al. |
| 8,000,127 | B2 | 8/2011 | Hamilton et al. |
| 8,008,745 | B2 | 8/2011 | Bertin et al. |
| 8,217,490 | B2 | 7/2012 | Bertin et al. |
| 8,319,205 | B2 | 11/2012 | Bertin et al. |
| 8,331,130 | B2 * | 12/2012 | Yasuda ............ G11C 13/0007 365/148 |
| 8,351,239 | B2 | 1/2013 | Kim et al. |
| 8,619,450 | B2 * | 12/2013 | Hamilton ............... B82Y 10/00 365/100 |
| 9,070,878 | B2 * | 6/2015 | Shepard ................. H01L 45/06 |
| 9,263,126 | B1 * | 2/2016 | Viviani ................ G11C 13/004 |
| 9,299,430 | B1 * | 3/2016 | Bertin ................ G11C 13/0069 |
| 2001/0004979 | A1 | 6/2001 | Han et al. |
| 2001/0023986 | A1 | 9/2001 | Mancevski |
| 2002/0136047 | A1 | 9/2002 | Scheuerlein |
| 2002/0160111 | A1 | 10/2002 | Sun et al. |
| 2002/0175390 | A1 | 11/2002 | Goldstein et al. |
| 2003/0004058 | A1 | 1/2003 | Li et al. |
| 2003/0122111 | A1 | 7/2003 | Glatkowski |
| 2003/0177450 | A1 | 9/2003 | Nugent |
| 2003/0200521 | A1 | 10/2003 | DeHon et al. |
| 2004/0005723 | A1 | 1/2004 | Empedocles et al. |
| 2004/0007528 | A1 | 1/2004 | Bakajin et al. |
| 2004/0023253 | A1 | 2/2004 | Kunwar et al. |
| 2004/0031975 | A1 | 2/2004 | Kern et al. |
| 2004/0041154 | A1 | 3/2004 | Watanabe et al. |
| 2004/0043527 | A1 | 3/2004 | Bradley et al. |
| 2004/0071949 | A1 | 4/2004 | Glatkowski et al. |
| 2004/0099438 | A1 | 5/2004 | Arthur et al. |
| 2004/0104129 | A1 | 6/2004 | Gu et al. |
| 2004/0132070 | A1 | 7/2004 | Star et al. |
| 2004/0181630 | A1 | 9/2004 | Jaiprakash et al. |
| 2004/0238887 | A1 | 12/2004 | Nihey et al. |
| 2004/0253167 | A1 | 12/2004 | Silva et al. |
| 2004/0265550 | A1 | 12/2004 | Glatkowski et al. |
| 2004/0266106 | A1 | 12/2004 | Lee |
| 2005/0053525 | A1 | 3/2005 | Segal et al. |
| 2005/0056877 | A1 | 3/2005 | Ruckes et al. |
| 2005/0079659 | A1 | 4/2005 | Duan et al. |
| 2005/0095938 | A1 | 5/2005 | Rosenberger et al. |
| 2005/0212014 | A1 | 9/2005 | Horibe et al. |
| 2006/0237537 | A1 | 10/2006 | Empedocles |
| 2006/0250843 | A1 | 11/2006 | Bertin et al. |
| 2006/0250856 | A1 | 11/2006 | Bertin et al. |
| 2006/0258122 | A1 | 11/2006 | Whitefield et al. |
| 2006/0264053 | A1 | 11/2006 | Yates et al. |
| 2006/0281256 | A1 | 12/2006 | Carter et al. |
| 2006/0281287 | A1 | 12/2006 | Yates et al. |
| 2006/0292716 | A1 | 12/2006 | Gu et al. |
| 2007/0004191 | A1 | 1/2007 | Gu et al. |
| 2008/0157126 | A1 | 7/2008 | Bertin et al. |
| 2009/0021976 | A1 | 1/2009 | Liaw et al. |
| 2009/0027977 | A1 | 1/2009 | Rinerson et al. |
| 2011/0051499 | A1 | 3/2011 | Hamilton |
| 2013/0170283 | A1 | 7/2013 | Lan et al. |
| 2014/0166959 | A1 | 6/2014 | Bertin et al. |
| 2014/0254242 | A1 | 9/2014 | Siau |

FOREIGN PATENT DOCUMENTS

| | | |
|---|---|---|
| JP | 2000203821 | 7/2000 |
| JP | 2001035362 | 2/2001 |
| JP | 2004090208 | 3/2004 |
| WO | WO-98/39250 | 9/1998 |
| WO | WO-99/65821 | 12/1999 |
| WO | WO-00/48195 | 8/2000 |
| WO | WO-01/03208 | 1/2001 |
| WO | WO-02/45113 | 6/2002 |
| WO | WO-02/48701 | 6/2002 |
| WO | WO-03/016901 | 2/2003 |
| WO | WO-03/034142 | 4/2003 |

OTHER PUBLICATIONS

Ajayan, et al., "Applications of Carbon Nanotubes," Topics Appl. Phys., vol. 80, 2001, pp. 391-425.
Amblard, G., "Development and characterization of carbon nanotube processes for NRAM technology," Proc. of SPIE 2011, vol. 7970, pp. 797017-1-797017-7.
Avouris, P., "Carbon Nanotube Electronics," Chemical Physics, 2002, vol. 281, pp. 429-445.
Awano, Y., "Graphene for VLSI: FET and Interconnect Applications," IEDM 2009 Technical Digest, pp. 10.1.1-10.1.4.

(56) References Cited

OTHER PUBLICATIONS

Banerjee, et al., "Functionalization of Carbon Nanotubes with a Metal-Containing Molecular Complex," Nano Letters, vol. 2, No. 1, 2002, pp. 49-53.
Bachtold, et al., "Logic Circuits Based on Carbon Nanotubes," Physica E 16, 2003, pp. 42-46.
Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.
Bonard, et al., "Monodisperse Multiwall Carbon Nanotubes Obtained with Ferritin as Catalyst," Nano Letters, vol. 2, No. 6, 2002, pp. 665-667.
Brock, et al., "Carbon Nanotube Memories and Fabrics in a Radiation Hard Semiconductor Foundry," 2005 IEEE Conference, 9 pgs.
Brown, K. M., "System in package "The Rebirth of SIP"," 2004 IEEE Custom Integrated Circuits, May 2004, 6 pgs.
Cassell, et al., "Large Scale CVD Synthesis of Single-Walled Carbon Nanotubes," J. Phys. Chem. B, vol. 103, 1999, pp. 6484-6492.
Chen, et al., "Heterogeneous Single-Walled Carbon Nanotube Catalyst Discovery and Optimization," Chem. Mater., vol. 14, 2002, pp. 1891-1896.
Chen, et al., "Self-Aligned Carbon Nanotube Transistors with Charge Transfer Doping," Appl. Phys. Ltrs., 2005, No. 86, pp. 123108-1-123108-3.
Chen, et al. "Self-aligned Carbon Nanotube Transistors with Novel Chemical Dopinig," IEDM 04, 2004, pp. 695-698.
Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Chiang, et al., "Purification and Characterization of Single-Wall Carbon Nanotubes (SWNTs) Obtained from the Gas-Phase Decomposition of CO (HiPco Process)," J. Phys. Chem. B, vol. 105, 2001, pp. 8297-8301.
Collins, et al., "Engineering Carbon Nanotubes and Nanotube Circuits Using Electrical Breakdown," Science, 2001, vol. 292, pp. 706-709.
Crowley, et al., "512 Mb PROM with 8 layers of antifuse/Diode cells," IEEE International Solid-State Circuits Conference, vol. XLVI, Feb. 2003, pp. 284-285.
Cui, et al., "Carbon Nanotube Memory Devices of High Charge," Applied Phys. Ltrs., vol. 81, No. 17, Oct. 2002, pp. 3260-3262.
Dai, et al., "Controlled Chemical Routes to Nanotube Architectures, Physics, and Devices," J. Phys. Chem. B, vol. 103, 1999, pp. 11246-11255.
Delzeit, et al., "Multilayered Metal Catalysts for Controlling the Density of Single-Walled Carbon Nanotube Growth," Chem. Phys. Ltrs., vol. 348, 2001, pp. 368-374.
Derycke, et al., "Carbon Nanotube Inter- and Intramolecular Logic Gates," Nano Letters, 2001, vol. 1, No. 9, 4 pgs.
Derycke, et al., "Controlling Doping and Carrier Injection in Carbon Nanotube Transistors," Appl. Phys. Ltrs., 2002, vol. 80, No. 5, pp. 2773-2775.
Desai, et al., "Freestanding Carbon Nanotube Specimen Fabrication," Proceeding 2005 5$^{th}$ IEEE Conference on Nanotechnology, Nagoya, Japan, Jul. 2005, 4 pgs.
Duan, et al., "Nonvolatile Memory and Programmable Logic and Molecule-Gated Nanowires," Nano Letters, 2002, XXXX, vol. 0, No. 0, A-D, 4 pgs.
Engel, et al., "Thin Film Nanotube Transistors Based on Self-Assembled, Aligned, Semiconducting Carbon Nanotube Arrays," ACS Nano, 2008, vol. 2, No. 12, pp. 2445-2452.
Franklin, et al., "An Enhanced CVD Approach to Extensive Nanotube Networks with Directionality," Adv. Mater., vol. 12, No. 12, 2000, pp. 890-894.
Fuhrer, et al., "High-Mobility Nanotube Transistor Memory," Nano Letters, vol. 2, No. 7, 2002, pp. 755-759.

Haddon, et al., "Purification and Separation of Carbon Nanotubes," MRS bulletin, Apr. 2004, pp. 252-259 (www.mrs.org/publications/bulletins).
Hafner, et al., "Catalytic Growth of Single-Wall Carbon Nanotubes from Metal Particles," Chem. Phys. Ltrs., vol. 296, 1998, pp. 195-202.
Heinz, et al., "Carbon Nanotubes as Schottky Barrier Transistors," Phys. Rev. Ltrs., 2002, vol. 89, No. 10, pp. 106801-1-106801-4.
Homma, et al., "Single-Walled Carbon Nanotube Growth on Silicon Substrates Using Nanoparticle Catalysts," Jpn, J. Appl. Phys., vol. 41, 2002, pp. L89-L91.
Hone, J., "Phonons and Thermal Properties of Carbon Nanotubes," Topics Appl. Phys., 2001, vol. 80, pp. 273-286.
Huai, Y., "Spin-Transfet Torque MRAM (STT-MTAM): Challenges and Prospects," AAPS Bulletin, vol. 18, No. 6, Dec. 2008, pp. 33-40.
Huang, et al., "Logic Gates and Computation from Assembled Nanowire Building Blocks," Science, 2001, vol. 294, pp. 1313-1317.
International Search Report, International Patent Application No. PCT/US05/18467 dated Oct. 1, 2007, 5 pgs.
International Search Report, International Patent Application No. PCT/US05/18539 dated Sep. 18, 2006, 4 pgs.
International Search Report, International Patent Application No. PCT/US05/45316 dated Sep. 6, 2005, 2 pgs.
Javey, et al., "Carbon Nanotube Transistor Arrays to Multistage Complementary Logic and ring Oscillators," Nano Letters, 2002, XXXX, vol. 0, No. 0, A-D, 4 pgs.
Javey, et al., "High-κ Dielectrics for Advanced Carbon-Nanotube Transistors and Logic Gates," Nature Materials, 2002, vol. 1, pp. 241-246.
Javey, et al., "Carbon Nanotube Field-Effect Transistors with Integrated Ohmic Contacts and High-κ Dielectrics," Nano Letters, 2004, vol. 4, No. 3, pp. 447-450.
Jeong, et al., "A Purification Method of Single-Wall Carbon Nanotubes Using H2S and 02 Mixture Gas," Chem. Phys. Ltrs., vol. 344, Aug. 2001, pp. 18-22.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Johnson, R.C., IBM fellow unrolls blueprint for nano,: EE Times, 3 pgs., Mar. 6, 2006. http://www.eetimes.com/showArticle.jhtml?.ArticleID=1815000394.
Joselevich, et al., "Vectorial Growth of Metallic and Semiconducting Single-Wall Carbon Nanotubes," Nano Letters, vol. 0, No. 0, A-E, 2002.
Kahn, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pgs.
Kinaret, et al., "Carbon-Nanotube-Based Nanorelay," App. Phys. Ltrs., 2003, vol. 82, No. 8, pp. 1287-1289.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Kong, et al., "Quantum Interference and Ballistic Transmission in Nanotube Electron Wavegrinders," The American Physical Society, 2001, vol. 87, No. 10, pp. 106801-1-106801-4.
Langer, et al., "Electrical resistance of a carbon nanotube bundle," J. Mater. Res., 1994, vol. 9, No. 4, pp. 927-932.
Li, et al., "Carbon Nanotube Nanoelectrode Array for Ultrasensitive DNA Detection," Nano Letters, vol. 3, No. 5, 2003, pp. 597-602.
Li, et al., "Growth of Single-Walled Carbon Nanotubes from Discrete Catalytic Nanoparticles of Various Sizes," J. Phys. Chem. B, vol. 105, 2001, pp. 11424-11431.
Li, et al., "Preparation of Monodispersed Fe—Mo Nanoparticles as the Catalyst for CVD Synthesis of Carbon Nanotubes," Chem. Mater., vol. 13, 2001, pp. 1008-1014.

(56) References Cited

OTHER PUBLICATIONS

Lin, et al., "Novel Carbon Nanotube FET Design with Tunable Polarity," IEDM 04-687, 2004, pp. 29.2.1-29.2.4.
Luyken, et al., "Concepts for Hybrid CMOS-Molecular Non-Volatile Memories," Nanotechnology, 2003, vol. 14, pp. 273-276.
Martel, et al., "Carbon Nanotube Field-Effect Transistors and Logic Circuits," DAC 2002, New Orleans, Louisiana, 5 pgs.
Nerushev, et al., "Carbon Nanotube Films Obtained by Thermal Chemical Vapour Deposition," J. Mater. Chem., vol. 11, 2001, pp. 1122-1132.
Niu, et al., "High Power Electrochemical Capacitors Based on Carbon Nanotube Electrodes," Appl. Phys. Ltrs., vol. 70, No. 11, Mar. 1997, pp. 1480-1482.
Novak, et al., "Nerve Agent Using Networks of Single-Walled Carbon Nanotubes," Appl. Phys. Ltr, vol. 83, No. 19, Nov. 2003, pp. 4026-4028.
Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Sensors and Actuators B, vol. 113, 2006, pp. 55-63.
Peigney, et al., "A Study of the Formation of Single- and Double-Walled Carbon Nanotubes by a CVD Method," J. Phys. Chem. B, vol. 105, 2001, pp. 9699-9710.
Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.
Radosavijevic et al., "Nonvolatile Molecular Memory Elements Based on Ambipolar Nanotube Field Effect Transistors," Nano Letters, 2002, vol. 2, No. 7, pp. 761-764.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, 2000, vol. 289, pp. 94-97.
Servalli, G., "A 45nm Generation Phase Change Memory Technology," IEDM 2009 Technical Digest, pp. 5.7.1-5.7.4.
Shelimov, et al., "Purification of Single-Wall Carbon Nanotubes by Electronically Assisted Filtration," Chem. Phys. Ltrs., vol. 282, 1998, pp. 429-434.
Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.
Snow, et al., "Random Networks of Carbon Nanotubes as an Electronic Material," App. Phys. Ltrs., vol. 82, No. 13, Mar. 2003, pp. 2145-2147.
Sotiropoulou, et al., "Carbon Nanotube Array-Based Biosensor," Anal Bioanal Chem, vol. 375, 2003, pp. 103-105.
Star, et al., "Nanoelectronic Carbon Dioxide Sensors," Adv. Mater., vol. 16, No. 22, 2004, pp. 2049-2052.
Star, et al., "Nanotube Optoelectronic Memory Devices," Nano Letters, vol. 4, No. 9, 2004, pp. 1587-1591.
Valentini, et al., "Sensors for sub-ppm NO2 Gas Detection Based on Carbon Nanotube Thin Films," Appl. Phys. Ltrs., vol. 82, No. 6, Feb. 2003, pp. 961-963.
Ward, et al., "A Non-Volatile Nanoelectromechanical Memory Element Utilizing a Fabric of Carbon Nanotubes," IEEE 2004, pp. 34-38.
Wind, et al., "Fabrication and Electrical Characterization of Top Gate Single-Wall Carbon Nanotube Field-Effect Transistors," IBM T.J. Watson Research Center, Yorktown Heights, NY, 14 pgs.
Wind, et al., "Vertical Scaling of Carbon Nanotube Field-Effect Transistors using Top Gate Electrodes," Appl. Phys. Ltrs., 2002, vol. 80, No. 20, pp. 3817-3819.
Zhang, et al., "Metal Coating on Suspended Carbon Nanotubes and its Implications to Metal-tube Interaction," Chem. Phys. Ltrs., vol. 331, 2000, pp. 35-41.
Zhang, et al., "Select Pathways to Carbon Nanotube Film Growth," Adv. Mater., vol. 13, No. 23, Dec. 2001, pp. 1767-1770.
Zhang, et al., "Formation of Metal Nanowires on Suspended Single-Walled Carbon Nanotubes," Appl. Phys. Ltrs., vol. 77, No. 19, Nov. 2000, pp. 3015-3017.
Zhao, et al., "Frequency-Dependent Electrical Transport in Carbon Nanotubes," Phys. Review B, vol. 64, 2001, pp. 201402-1-201402-4.
Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.
EPO Extended Search Report, Application No. 16152133.1, dated Jul. 27, 2016, 3 pgs.

* cited by examiner

| Array Configuration | 16 Cells per Bit Line | 32 Cells per Bit Line | 64 Cells per Bit Line | 128 Cells per Bit Line | 256 Cells per Bit Line | 512 Cells per Bit Line | 1024 Cells per Bit Line |
|---|---|---|---|---|---|---|---|
| Linear Resistive Change Elements and Fixed Voltage Reference (1401) | +0 mV / -0 mV | X | X | X | X | X | X |
| Linear Resistive Change Elements and Array Reference Line (1402) | +30 mV / -29 mV | +15 mV / -14 mV | +8 mV / -7 mV | +4 mV / -4 mV | +2 mV / -2 mV | X | X |
| Non-Linear Resistive Change Elements and Fixed Voltage Reference (1403) | +52 mV / -52 mV | +28 mV / -29 mV | +14 mV / -15 mV | +7 mV / -8 mV | +4 mV / -4 mV | +2 mV / -2 mV | X |
| Non-Linear Resistive Change Elements and Array Reference Line (1404) | +68 mV / -81 mV | +40 mV / -41 mV | +21 mV / -21 mV | +11 mV / -10 mV | +6 mV / -5 mV | +3 mV / -3 mV | X |
| 2X Non-Linear Resistive Change Elements and Array Reference Line (1405) | +92 mV / -148 mV | +64 mV / -78 mV | +38 mV / -40 mV | +21 mV / -21 mV | +11 mV / -11 mV | +6 mV / -5 mV | +3 mV / -3 mV |
| Measurement and Storage Element Resolution (mV) | | +/- 20 | | | +/- 10 | +/- 5 | +/- 3 |

| CELLS PER BIT LINE ("n") | READING A NON-LINEAR CELL IN RESET STATE (20MΩ) | | READING A NON-LINEAR CELL IN SET STATE (1MΩ) | | SET vs RESET MARGIN | FIXED REFERENCE VOLTAGE ($V_{REF}$) | SMALLEST READ SIGNAL ($V_{BL} - V_{REF}$) | |
|---|---|---|---|---|---|---|---|---|
| | $V_{BL}$ with $R_{EQ}$=20MΩ (highest possible value) | $V_{BL}$ with $R_{EQ}$=3MΩ (lowest possible value) | $V_{BL}$ with $R_{EQ}$=20MΩ (highest possible value) | $V_{BL}$ with $R_{EQ}$=3MΩ (lowest possible value) | (Lowest $V_{BL}$ for SET cell vs Highest $V_{BL}$ for RESET cell) | Value selected to fall between lowest $V_{BL}$ for SET cell and highest $V_{BL}$ for RESET cell) | Reading a RESET cell (logic "0") | Reading a SET cell (logic "1") |
| 16 | 63 mV | 10 mV | 571 mV | 167 mV | 104 mV | 115 mV | -52 mV | 52 mV |
| 32 | 31 mV | 5 mV | 392 mV | 88 mV | 57 mV | 60 mV | -29 mV | 28 mV |
| 64 | 16 mV | 2 mV | 241 mV | 45 mV | 30 mV | 31 mV | -15 mV | 14 mV |
| 128 | 8 mV | 1 mV | 136 mV | 23 mV | 15 mV | 16 mV | -8 mV | 7 mV |
| 256 | 4 mV | 1 mV | 73 mV | 12 mV | 8 mV | 8 mV | -4 mV | 4 mV |
| 512 | 2 mV | 0 mV | 38 mV | 6 mV | 4 mV | 4 mV | -2 mV | 2 mV |
| 1024 | 1 mV | 0 mV | 19 mV | 3 mV | 2 mV | 2 mV | -1 mV | 1 mV |

| CELLS PER BIT LINE | READING A NON-LINEAR CELL IN A RESET STATE (20MΩ) WITH R$_{EQ}$ = 20MΩ (minimum leakage) ||| READING A NON-LINEAR CELL IN A RESET STATE (20MΩ) WITH R$_{EQ}$ = 3MΩ (maximum leakage) ||| READING A NON-LINEAR CELL IN A SET STATE (1MΩ) WITH R$_{EQ}$ = 20MΩ (minimum leakage) ||| READING A NON-LINEAR CELL IN A SET STATE (1MΩ) WITH R$_{EQ}$ = 3MΩ (maximum leakage) |||
|---|---|---|---|---|---|---|---|---|---|---|---|---|
| | V$_{BL}$ during DATA phase | V$_{BL}$ during REF phase | Largest READ Signal (RESET cell / min leakage) | V$_{BL}$ during DATA phase | V$_{BL}$ during REF phase | Smallest READ Signal (RESET cell / max leakage) | V$_{BL}$ during DATA phase | V$_{BL}$ during REF phase | Largest READ Signal (SET cell / min leakage) | V$_{BL}$ during DATA phase | V$_{BL}$ during REF phase | Smallest READ Signal (SET cell / max leakage) |
| 16 | 38 mV | 385 mV | -346 mV | 9 mV | 90 mV | -81 mV | 444 mV | 316 mV | 135 mV | 154 mV | 86 mV | 68 mV |
| 32 | 24 mV | 238 mV | -214 mV | 5 mV | 46 mV | -41 mV | 328 mV | 210 mV | 118 mV | 85 mV | 45 mV | 40 mV |
| 64 | 14 mV | 135 mV | -122 mV | 2 mV | 23 mV | -21 mV | 215 mV | 126 mV | 89 mV | 44 mV | 23 mV | 21 mV |
| 128 | 7 mV | 72 mV | -65 mV | 1 mV | 12 mV | -10 mV | 127 mV | 70 mV | 57 mV | 23 mV | 12 mV | 11 mV |
| 256 | 4 mV | 38 mV | -34 mV | 1 mV | 6 mV | -5 mV | 70 mV | 37 mV | 33 mV | 12 mV | 6 mV | 6 mV |
| 512 | 2 mV | 19 mV | -17 mV | 0 mV | 3 mV | -3 mV | 37 mV | 19 mV | 18 mV | 6 mV | 3 mV | 3 mV |
| 1024 | 1 mV | 10 mV | -9 mV | 0 mV | 1 mV | -1 mV | 19 mV | 10 mV | 9 mV | 3 mV | 1 mV | 1 mV |

| CELLS PER BIT LINE | READING A 2X NON-LINEAR CELL IN A RESET STATE (20MΩ) WITH R_EQ = 20MΩ (minimum leakage) | | | READING A 2X NON-LINEAR CELL IN A RESET STATE (20MΩ) WITH R_EQ = 6MΩ (maximum leakage) | | | READING A 2X NON-LINEAR CELL IN A SET STATE (1MΩ) WITH R_EQ = 20MΩ (minimum leakage) | | | READING A 2X NON-LINEAR CELL IN A SET STATE (1MΩ) WITH R_EQ = 6MΩ (maximum leakage) | | |
|---|---|---|---|---|---|---|---|---|---|---|---|---|
| | $V_{BL}$ during DATA phase | $V_{BL}$ during REF phase | Largest READ Signal (RESET cell / min leakage) | $V_{BL}$ during DATA phase | $V_{BL}$ during REF phase | Smallest READ Signal (RESET cell / max leakage) | $V_{BL}$ during DATA phase | $V_{BL}$ during REF phase | Largest READ Signal (SET cell / min leakage) | $V_{BL}$ during DATA phase | $V_{BL}$ during REF phase | Smallest READ Signal (SET cell / max leakage) |
| 16 | 38 mV | 385 mV | -346 mV | 16 mV | 164 mV | -148 mV | 444 mV | 353 mV | 91 mV | 250 mV | 158 mV | 92 mV |
| 32 | 24 mV | 238 mV | -214 mV | 9 mV | 87 mV | -78 mV | 328 mV | 226 mV | 102 mV | 150 mV | 86 mV | 64 mV |
| 64 | 14 mV | 135 mV | -122 mV | 5 mV | 45 mV | -40 mV | 215 mV | 131 mV | 84 mV | 83 mV | 45 mV | 38 mV |
| 128 | 7 mV | 72 mV | -65 mV | 2 mV | 23 mV | -21 mV | 127 mV | 71 mV | 56 mV | 44 mV | 23 mV | 21 mV |
| 256 | 4 mV | 38 mV | -34 mV | 1 mV | 12 mV | -11 mV | 70 mV | 37 mV | 33 mV | 23 mV | 12 mV | 11 mV |
| 512 | 2 mV | 19 mV | -17 mV | 1 mV | 6 mV | -5 mV | 37 mV | 19 mV | 18 mV | 12 mV | 6 mV | 6 mV |
| 1024 | 1 mV | 10 mV | -9 mV | 0 mV | 3 mV | -3 mV | 19 mV | 10 mV | 9 mV | 6 mV | 3 mV | 3 mV |

| Case # | # Data WLs | # BLs | RL | RH | Maximum Array Current | | Minimum Array Current | |
|---|---|---|---|---|---|---|---|---|
| | | | | | # BLs SET; $V_{SET}$; $I_{SET}$ | # Unselected BLs; $V_{UNSEL}$; $I_{UNSEL-MAX}$ | # BLs SET; $V_{SET}$; $I_{SET}$ | # Unselected BLs; $V_{UNSEL}$; $I_{UNSEL-MIN}$ |
| 1A | 128 | 256 | 1 MΩ | 20 MΩ | 1;<br>2 V; 2 µA | 255;<br>1.3 V; 760 µA | 1;<br>2 V; 2 µA | 255;<br>1.1 V; 6 µA |
| 1B | Same | Same | Same | Same | 4;<br>2 V; 8 µA | 252;<br>1.3 V; <760 µA | 4;<br>2 V; 8 µA | 252;<br>1.1 V; <6 µA |
| 2A | Same | Same | 100 kΩ | 2 MΩ | 1;<br>2 V; 20 µA | 255;<br>1.3 V; 800 µA | 1;<br>2 V; 20 µA | 255;<br>1.3 V; 46 µA |
| 2B | Same | Same | Same | Same | 4;<br>2 V; 80 µA | 252;<br>1.3 V; <800 µA | 4;<br>2 V; 80 µA | 252;<br>1.3 V; <46 µA |

2200

*NOTE: SET voltage (VSET) = 2V. In this example, all Bit Lines are charged to VSET/2 (1V) prior to SET WRITE operation*

FIG. 22

1-R RESISTIVE CHANGE ELEMENT ARRAYS USING RESISTIVE REFERENCE ELEMENTS

CROSS-REFERENCE OF RELATED CASES

This application is a continuation of U.S. Pat. No. 9,299,430, entitled "Methods for Reading and Programming 1-R Resistive Change Element Arrays," filed Jan. 22, 2015. Further, this application is related to the following U.S. patents, which are assigned to the assignee of the present application, and are hereby incorporated by reference in their entirety:

U.S. Pat. No. 6,835,591, filed on Apr. 23, 2002, entitled Methods of Nanotube Films and Articles;

U.S. Pat. No. 7,335,395, filed on Jan. 13, 2003, entitled Methods of Using Pre Formed Nanotubes to Make Carbon Nanotube Films, Layers, Fabrics, Ribbons, Elements, and Articles;

U.S. Pat. No. 6,706,402, filed on Mar. 16, 2004, entitled Nanotube Films and Articles;

U.S. Pat. No. 7,115,901, filed on Jun. 9, 2004, entitled Non-Volatile Electromechanical Field Effect Devices and Circuits Using Same and Methods of Forming Same; and U.S. Pat. No. 7,365,632, filed on Sep. 20, 2005, entitled Resistive Elements Using Carbon Nanotubes.

U.S. Pat. No. 7,781,862, filed on Nov. 15, 2005, entitled Two-Terminal Nanotube Devices and Systems and Methods of Making Same;

U.S. Pat. No. 7,479,654, filed on Nov. 15, 2005, entitled Memory Arrays Using Nanotube Articles with Reprogrammable Resistance;

U.S. Pat. No. 8,217,490, filed on Aug. 8, 2007, entitled Nonvolatile Nanotube Diodes and Nonvolatile Nanotube Blocks and Systems Using Same and Methods of Making Same;

U.S. Pat. No. 7,835,170, filed on Aug. 8, 2007, entitled Nonvolatile Nanotube Diodes and Nonvolatile Nanotube Blocks and Systems Using Same and Methods of Making Same;

U.S. Pat. No. 8,319,205, filed on Aug. 6, 2009, entitled Nonvolatile Nanotube Programmable Logic Devices and a Nonvolatile Nanotube Field Programmable Gate Array Using Same;

U.S. Pat. No. 8,351,239, filed on Oct. 23, 2009, entitled Dynamic Sense Current Supply Circuit and Associated Method for Reading and Characterizing a Resistive Memory Array; and U.S. Pat. No. 8,000,127, filed on Nov. 13, 2009, entitled Method for Resetting a Resistive Change Memory Element.

This application is related to the following U.S. Patent Applications, which are assigned to the assignee of the application, and are hereby incorporated by reference in their entirety:

U.S. Patent Application No. 2011 0051499, filed on Sep. 1, 2010, entitled A Method for Adjusting a Resistive Change Element Using a Reference; and U.S. Patent Application No. 2014 0166959 filed on Dec. 12, 2012, entitled Carbon Based Nonvolatile Cross Point Memory Incorporating Carbon Based Diode Select Devices And MOSFET Select Devices For Memory And Logic Applications.

BACKGROUND

1. Technical Field

The present disclosure relates generally to arrays of resistive change elements, and, more specifically, to improved methods for reading and programming such arrays without the need for cell in situ selection and current limiting elements.

2. Discussion of Related Art

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a high resistive state (which might correspond to a logic "0") and a low resistive state (which might correspond to a logic "1"). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store four bits of data. Or a resistive change element might be arranged to switch between $2^n$ resistive states, so as to store n bits of data.

Within the current state of the art, there is an increasing need to scale and increase the cell density of arrays of resistive change element arrays. However, as technology is developed within the state of the art to provide increasingly smaller resistive change elements, the physical dimensions of individual array cells within a resistive change element array becomes, in certain applications, limited by the physical dimensions of selection circuitry used within traditional resistive change element array cells. To this end, it would be advantageous if a method for reading and programming arrays of resistive change elements were realized such that individual array cells could be rapidly accessed (read) or adjusted (programmed) without the need for in situ selection circuitry or other current controlling devices within each cell.

SUMMARY

The present disclosure relates to methods for programming and reading arrays of resistive change elements and, more specifically, to such methods wherein cells within an array can be rapidly programmed or read without the need for in situ selection or current controlling circuitry within each cell.

In particular, the present disclosure provides a method for determining the resistive state of at least one resistive change element within a resistive change element array. This method comprises first providing a resistive change element array. This resistive change element array comprises a plurality of word lines, a plurality of bit lines; and a plurality of resistive change elements. Each of these resistive change elements has a first terminal and a second terminal, wherein the first terminal of each resistive change element is in electrical communication with a word line and the second terminal of each resistive change element is in electrical communication with a bit line. The resistive change element array further comprises at least one resistive reference element, this resistive reference element having a first terminal in electrical communication with a word line and a second terminal in electrical communication with a bit line.

This method for determining the resistive state of at least one resistive change element comprises first initializing all of the bit lines and all of the word lines within the resistive change element array to a ground. This method then selects one word line within the resistive change element array and charges this selected word line to a preselected voltage while holding all other word lines at ground and allowing all bit lines to float. This method then discharges the selected word line through at least one resistive change element and observes at least one discharge current through at least one resistive change element.

This method for determining the resistive state of at least one resistive change element then re-initializes all of the bit lines and all of the word lines within the resistive change element array to a ground. This method then selects at least one resistive reference element and charges the word line in electrical communication with the at least one selected resistive reference element to a preselected voltage while holding all other word lines at ground and allowing all bit lines to float. This method then discharges the word line in electrical communication with the at least one selected resistive reference element through the at least one selected resistive reference element and observes at least one discharge current through at least one selected resistive reference element. This method then compares at least one discharge current observed through at least one of the resistive change element and at least one discharge current observed through at least one of the selected resistive reference elements to determine the resistive state of at least one resistive change element.

Further, the present disclosure also provides a method for adjusting the resistive state of at least one resistive change element within a resistive change element array. This method first comprises comprising providing a resistive change element array. This resistive change element array comprises a plurality of word lines, a plurality of bit lines; and a plurality of resistive change elements. Each resistive change element has a first terminal and a second terminal, wherein the first terminal of each resistive change element is in electrical communication with a word line and the second terminal of each resistive change element is in electrical communication with a bit line.

This method for adjusting the resistive state of at least one resistive change element within a resistive change element array first initializes all of the bit lines and all of the word lines within the resistive change element array to a ground. This method then selects one word line, wherein this selected word line is in electrical communication with at least one resistive change element to be adjusted. This method then floats all of said word lines that are not selected. This method then pulls all of the bit lines to ground through selectable current limiting elements. Each of these selectable current limiting elements can be configured in at least two states: a first configured state that permits a sufficient programming current to flow through a selectable current limiting element and a second configured state that inhibits a sufficient programming current from flowing through a selectable current limiting element. This method then configures those selectable current limiting elements associated with those bit lines in electrical communication with a resistive change element to be adjusted into the first configured state and configures those selectable current limiting elements associated with those bit lines in electrical communication with a resistive change element not to be adjusted into the second configured state. This method then drives the selected word line to a preselected voltage and discharges the selected word line through at least one resistive change element to provide at least one programming current through at least one resistive change element. And this at least one programming current adjusts the electrical resistance of at least one resistive change element from a first resistive state to a second resistive state.

Under another aspect of the present disclosure, within this method for adjusting the resistive state of a resistive change element the first resistive state is lower than the second resistive state.

Under another aspect of the present disclosure, within this method for adjusting the resistive state of a resistive change element the first resistive state is higher than the second resistive state.

Under another aspect of the present disclosure, within this method for adjusting the resistive state of a resistive change element the resistive state of every resistive change element in electrical communication with the selected word line is adjusted simultaneously.

Under another aspect of the present disclosure, within this method for adjusting the resistive state of a resistive change element the first resistive state corresponds to a first logic value and the second logic state corresponds to a second logic value.

Under another aspect of the present disclosure, within this method for adjusting the resistive state of a resistive change element all the resistive change elements in electrical communication with the selected word line are programmed with the same logic value after the selected word line has discharged.

Further, the present disclosure also provides a method for adjusting the resistive state of a single resistive change element within a resistive change element array. This method first comprises comprising providing a resistive change element array. This resistive change element array comprises a plurality of word lines, a plurality of bit lines; and a plurality of resistive change elements. Each resistive change element has a first terminal and a second terminal, wherein the first terminal of each resistive change element is in electrical communication with a word line and the second terminal of each resistive change element is in electrical communication with a bit line.

This method for adjusting the resistive state of a single resistive change element within a resistive change element array first floats all of the bit lines and all of the word lines within the resistive change element array. This method then selects one of the plurality of resistive change elements. This method then drives the bit line in electrical communication with the selected resistive change element to a preselected voltage and drives the word line in electrical communication with the selected resistive change element to ground. This method then discharges the bit line in electrical communication with the selected resistive change element through the selected resistive change element to provide a programming current through the selected resistive change element. This programming current adjusts the electrical resistance of the selected resistive change element from a first resistive state to a second resistive state.

Under another aspect of the present disclosure, within this method for adjusting the resistive state of a single resistive change element the first resistive state is lower than the second resistive state.

Under another aspect of the present disclosure, within this method for adjusting the resistive state of a single resistive change element the first resistive state is higher than the second resistive state.

Under another aspect of the present disclosure, within this method for adjusting the resistive state of a single resistive change element the first resistive state corresponds to a first logic value and the second logic state corresponds to a second logic value.

Under another aspect of the present disclosure, within this method for adjusting the resistive state of a single resistive change element the current limiting path is sufficient to prevent a discharge current through an unselected resistive change element from being large enough to adjust the resistive state of the unselected resistive change element.

Under another aspect of the present disclosure, within the programming and reading methods presented, the resistive change elements are two-terminal nanotube switching elements.

Under another aspect of the present disclosure, within the programming and reading methods presented, the resistive change elements are metal oxide memory elements.

Under another aspect of the present disclosure, within the programming and reading methods presented, the resistive change elements are phase change memory elements.

Under another aspect of the present disclosure, within the programming and reading methods presented, the resistive change element array is a memory array.

Other features and advantages of the present disclosure will become apparent from the following description of the invention, which is provided below in relation to the accompanying drawings.

BRIEF DESCRIPTION OF THE DRAWINGS

In the Drawings,

FIG. 14 is a table detailing the smallest (minimum) READ signal levels resulting from performing READ operations according to the methods of the present disclosure as detailed in FIGS. 7A and 7B on a number of exemplary array configurations.

FIG. 15A is a table detailing resulting bit line voltages ($V_{BL}$) realized through performing a READ operation according to the methods of the present disclosure as detailed in FIG. 7A on a number of exemplary array configurations wherein the arrays use non-linear resistive change elements (as described with respect to FIG. 13).

FIG. 15B is a table detailing resulting bit line voltages ($V_{BL}$) realized through performing a READ operation according to the methods of the present disclosure as detailed in FIG. 7B on a number of exemplary array configurations wherein the arrays use non-linear resistive change elements (as described with respect to FIG. 13).

FIG. 15C is a table detailing resulting bit line voltages ($V_{BL}$) realized through performing a READ operation according to the methods of the present disclosure as detailed in FIG. 7B on a number of exemplary array configurations wherein the arrays use 2× non-linear resistive change elements (as described with respect to FIG. 13).

FIG. 22 is table summarizing WRITE voltages and currents as detailed within the exemplary resistive change element arrays discussed with respect to FIGS. 20A-20D and 21A-21D.

DETAILED DESCRIPTION

Figure 1:
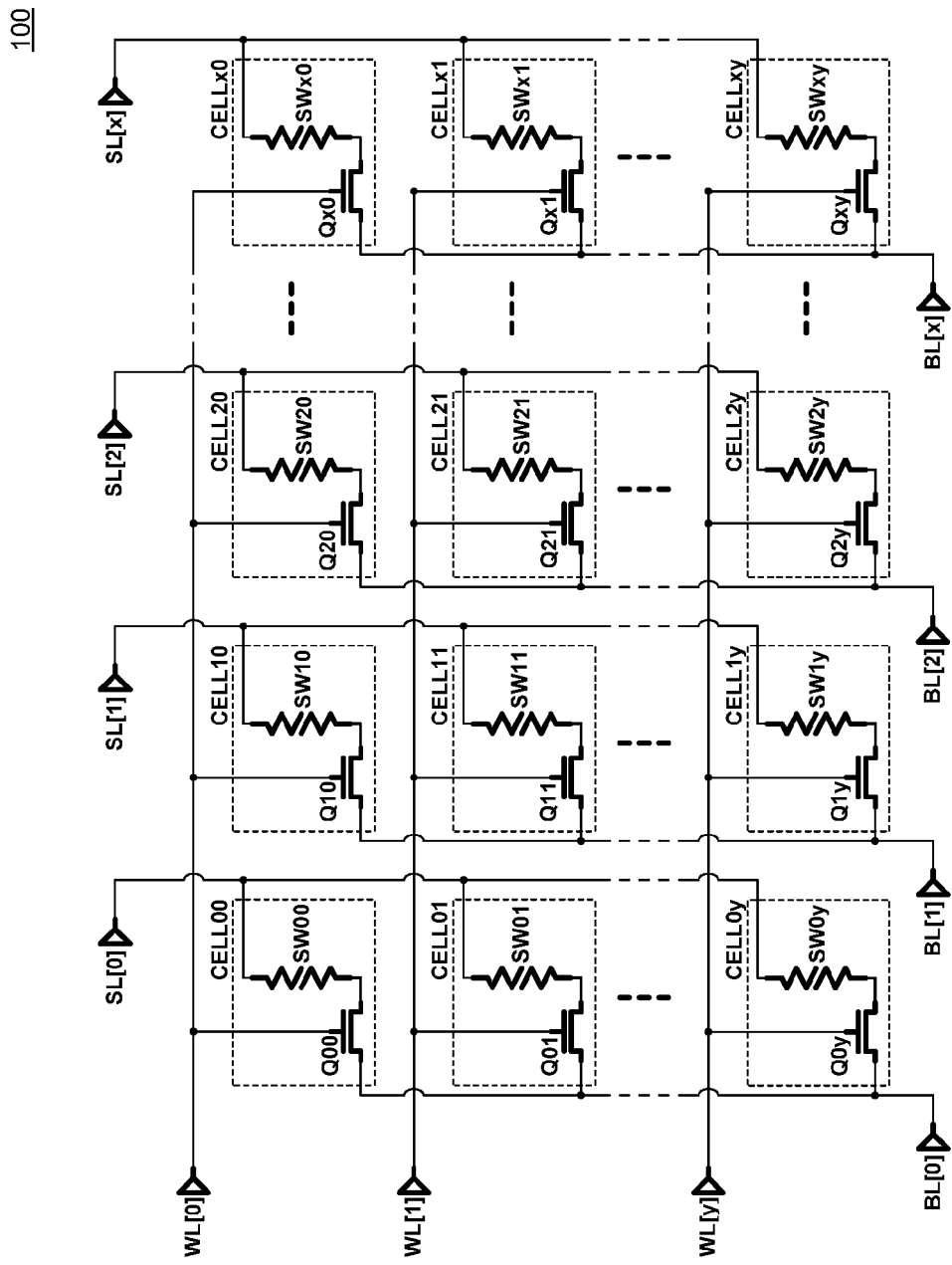
FIG. 1 is a simplified schematic illustrating an exemplary typical architecture for an array of resistive change elements wherein FET selection devices are used within the cells of the array.

The present disclosure relates to resistive change element arrays and methods for programming and reading the resistive states of resistive change elements within an array. As will be discussed in detail below, the programming and reading methods of the present disclosure are well suited for use within arrays of 1-R resistive change element cells. These 1-R resistive change element arrays (examples of which are shown in FIGS. 3, 5, 6A, and 6B and discussed in detail below with respect to those figures) are characterized in that these cells are comprised only of a two-terminal resistive change element and do not include any in situ selection circuitry or other current limiting elements. The programming and reading methods of the present disclosure include charging certain array lines within a resistive change element array simultaneously and then grounding specific array lines while allowing other array lines to "float" in order to direct discharge currents through only selected cells. In some cases, within the methods of the present disclosure, current limiting elements are used on certain array lines— these current limiting elements being situated outside of the array cells or, in some applications, outside of the array itself—to inhibit programming currents from flowing through certain array cells. In this way, as described in detail below, the methods of the present disclosure can be used to reliably and rapidly program—that is, adjust the resistive state of a resistive change element from a first value to a desired second value—and read—that is, determine the resistive state of a resistive change element within one or more cells within an array—without the need for certain design and layout restrictions that are inherent with many conventional programming and reading methods.

Several process steps as described within the methods of the present disclosure require that one or more array lines be "floated" after being charged to a desired voltage level. It should be noted that within the scope of the present disclosure, "floating" an array line is driving that line (or simply disconnecting the line from the circuit element used to drive the desired voltage onto the line) such that the pre-charged voltage on the array line is temporarily retained due to line capacitance. As will be shown in detail below, this "floating" technique is used within the programming and READ methods of the present disclosure to provide array line discharge paths through selected cells (and prevent such paths through unselected cells) without the need for selection circuitry in situ with array cells.

As will be described in detail below, the present disclosure teaches methods for programming (that is performing SET and RESET operations) and accessing (that is, performing READ operations) on resistive change elements within an array. Within certain embodiments of the present disclosure, arrays of resistive change elements are arranged such that a first terminal of each resistive change element is electrically coupled to a word line and a second terminal of each resistive change element is electrically coupled to a bit line. In this way, within such arrangements, each resistive change element is uniquely accessible via a particular word line and bit line combination. FIGS. 3, 5, 6A, and 6B (discussed in detail below) provide examples of such resistive change element arrays. Some aspects of the present disclosure provide methods (again, as will be explained in detail below) for programming and accessing the resistive change elements within such an array without the need for local, in situ selection circuitry or current limiting devices.

To this end, the present disclosure provides a method for performing a READ operation on one or more cells within a resistive change element array. That is, an operation wherein one or more elements within a resistive change element array is accessed via associated word lines and bit lines to determine the resistive state stored within the array element or elements. Within some aspects of the present disclosure, such a READ method makes use of a fixed voltage reference (as depicted, for example, in FIG. 6A) that is either generated within the memory array circuit itself or provided by external control circuitry. As will be described in more detail below, within such a READ operation a selected word line is driven to a pre-selected READ voltage and then allowed to discharge through one or more selected array elements to a measurement and storage element responsive to the bit line or bit lines associated with the one or more selected array elements. The discharge voltage/ current measured through each of the selected cells is then compared to the fixed voltage reference to determine the resistive state stored in each of selected array cells. As will be discussed below, in certain applications the use of such a fixed voltage reference in this way can provide faster and lower voltage READ operations. This READ method according to the methods of the present disclosure is described in detail within the discussion of FIGS. 7A, 8A-8B, 10A-10B, and 14A-14C below.

Figure 6A:
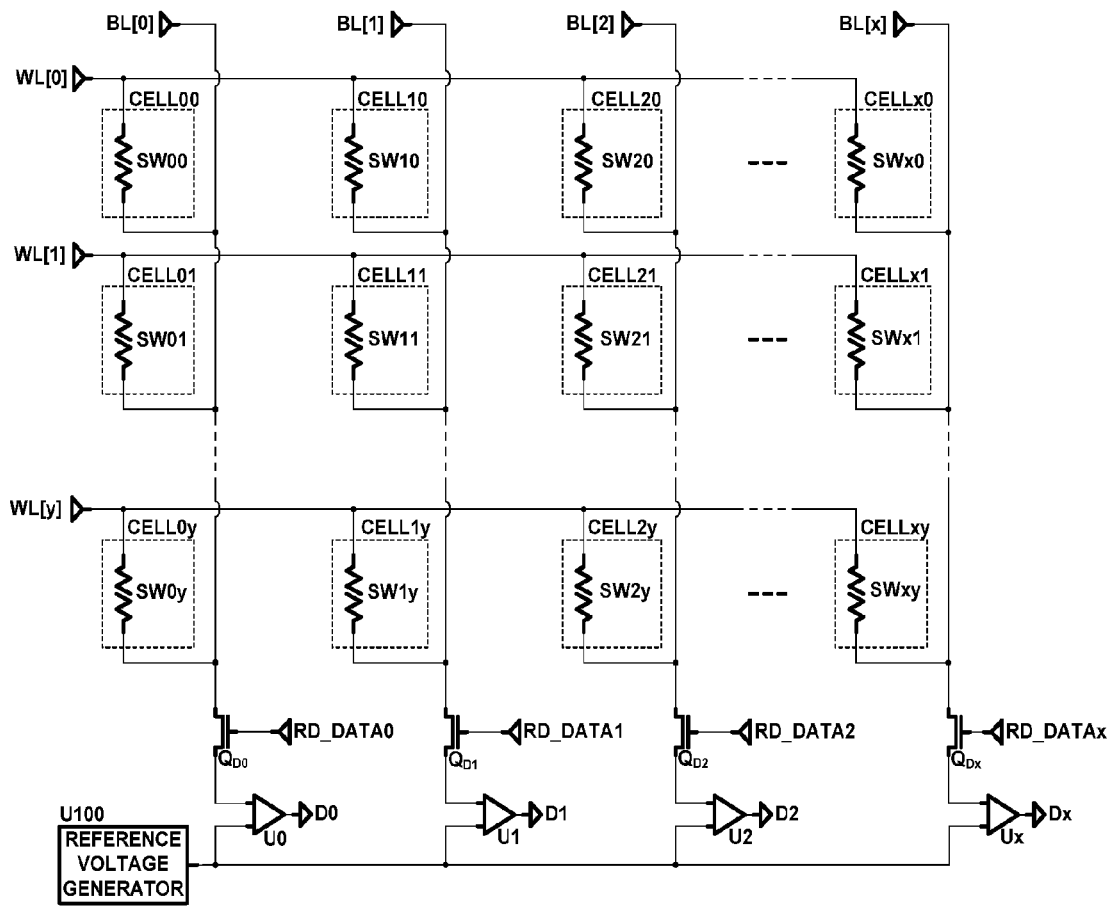
FIG. 6A is a simplified schematic illustrating an exemplary architecture for an array of 1-R resistive change element cells wherein no selection devices or other current limiting circuitry are used within the cells of the array (as with FIG. 3) but also including a fixed voltage reference and exemplary measurement and storage elements responsive to each bit line, as described within certain embodiments of the present disclosure.
Figure 6B:
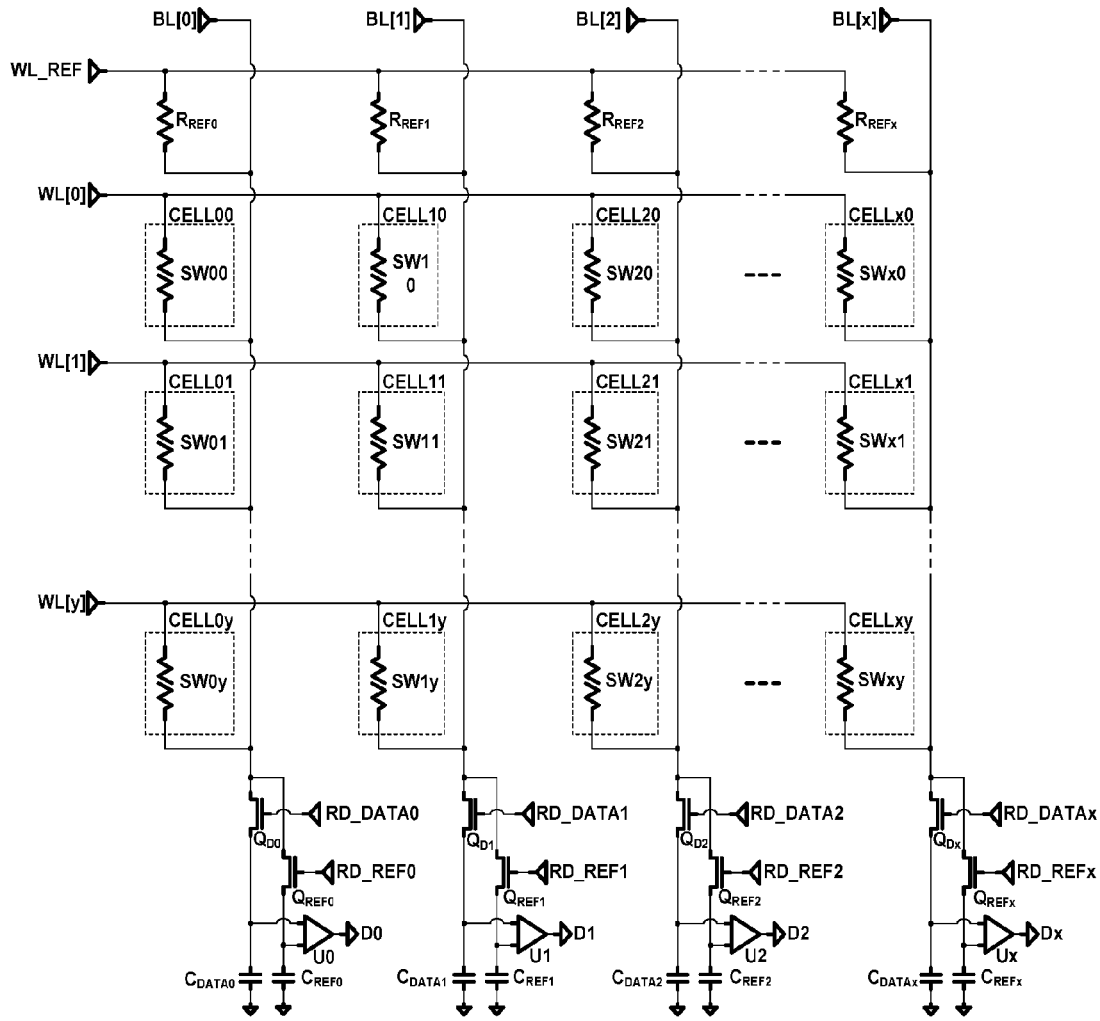
FIG. 6B is a simplified schematic illustrating an exemplary architecture for an array of 1-R resistive change element cells wherein no selection devices or other current limiting circuitry are used within the cells of the array (as with FIG. 3) but also including reference resistive elements for each bit line and exemplary measurement and storage elements responsive to each bit line, as described within certain embodiments of the present disclosure.

Within other aspects of the present disclosure, such a READ method makes use of resistive reference elements within the array itself (as depicted, for example, in FIG. 6B). Each of these reference elements has a first terminal electrically coupled to a reference word line (a dedicated array line used to provide test voltages/currents to the resistive reference elements) and a second terminal of each electrically coupled to a bit line. As will be described in more detail below, in a first operation phase a selected word line is driven to a pre-selected READ voltage and then allowed to discharge through one or more selected array elements to a measurement and storage element responsive to the bit line or bit lines associated with the one or more selected array elements. In a second operation phase, the array's reference word line is driven to the same pre-selected READ voltage and allowed to discharge through each of the reference elements associated with the selected bit lines to the same measurement and storage elements. The discharge voltage/ currents measured from the first operation phase and the second operation phase are then compared for each of the selected array elements to determine the resistive state stored in each of selected array cells. In this way, the voltage discharge of a selected cell (or cells) can simply be compared to the voltage discharge of a reference element in the same environment, instead of being measured and compared to some expected value outside the array. Alternatively, the reference element may be selected in a first operation phase and data elements may be selected in a second operation phase. As will be discussed below, in certain applications the use of reference elements in this way can provide faster and lower voltage READ operations. This READ method according to the methods of the present disclosure is described in detail within the discussion of FIGS. 7B, 9A-9D, 11A-11B, and 15A-15D below.

Further, a programming operation (that is a SET or a RESET operation, as defined herein) according to some aspects of the present disclosure can be used to SET or RESET one or more resistive change elements associated with a selected word line within a resistive change element array. Within some aspects of the present disclosure, such a programming method involves first initializing all of the array lines to ground (0V), then floating all of the word lines within the array. The bit lines within the array are then pulled to ground through selected current limiting elements (such as, but not limited to, current sources, programmable power supplies, and resistive elements). Those bit lines associated with array elements to be adjusted (that is, programmed) are pulled through current limiting elements that permit relatively high currents to flow through the selected elements, and those bit lines associated with array elements not to be adjusted are pulled through current limiting elements that permit only low currents to flow. The selected word line is then driven to the required programming voltage ($V_P$), and programming currents are allowed to flow through the selected resistive change elements (the current limiting elements prevent sufficient programming currents from flowing through unselected array elements). The polarity of such a programming operation according to the methods of the present disclosure can be reversed by instead pulling all bit lines within the array up to a selected programming voltage ($V_P$) through selected current limiting elements and then grounding the selected word line. In this way, the AC transient behavior of the resistive change element array can be used to selectively provide programming currents in either direction through a group of selected resistive change element cells within an array without the need for local, in situ selection circuitry within each array cell. This selected current limiting programming method according to the present disclosure is described in more detail with the discussion of FIGS. 16A-16B, 17A-17B, and 18A-18B below.

The present disclosure also provides a programming method that uses selected biasing of the word lines and bit lines within a resistive change element array to direct a sufficient programming current through a single array element to be programmed while prevented such currents from flowing through the other elements within the array. Within this programming method, all the array lines (that is all bit line and all word lines) are initially floated. The bit line associated with the selected array element is driven to the required programming voltage ($V_P$), and then the word line associated with the selected array element is driven to ground (0V). In this way a programming current in induced to flow through the selected array element from bit line to word line. The polarity of this programming current can be reversed by driving the word line associated with selected array element to the programming voltage ($V_P$) and driving the bit line associated with the selected array element to ground (0V). Unselected elements in the array may provide "leakage" current paths between the selected bit line and the selected word line. However, as will be explained in detail below, these leakage currents can be limited (for example, by the selection of the programming voltage, the resistance values used within the resistive change elements, or the size of the array) such as to prevent currents large enough to induce a change in the resistive state of unselected elements within the array. In this way, the AC transient behavior of the resistive change element array can be used to selectively provide a programming current in either direction through a single element within an array without the need for local, in situ selection circuitry within each array cell. This directed current path programming method according to the present disclosure is described in more detail within the discussion of FIGS. 19 and 20A-20C below.

It should be noted that although the preceding discussions of programming and accessing methods of resistive change elements according to methods of the present disclosure generally describe programming and read currents flowing from word line to bit line, the methods of the present disclosure are not limited in this regard. Indeed, as will be described in detail below, a programming or read current could be pre-charged and floated onto a bit line associated with a selected cell (or cells), for example, and the word line (or lines) associated with the selected cell (or cells) grounded to provide programming and read currents that flow from bit line to word line. As such, the methods of the present disclosure provide programming and accessing methods compatible with both uni-polar (that is, single polarity) and bi-polar (that is, dual polarity) resistive change element operations.

Resistive change cells store information through the use of a resistive change element within the cell. Responsive to electrical stimulus, this resistive change element can be adjusted between at least two non-volatile resistive states. Typically, two resistive states are used: a low resistive state (corresponding, typically, to a logic '1,' a SET state) and a high resistive state (corresponding, typically, to a logic '0,' a RESET state). In this way, the resistance value of the resistive change element within the resistive change element cell can be used to a store a bit of information (functioning, for example, as a 1-bit memory element). According to other aspects of the present disclosure, more than two resistive states are used, allowing a single cell to store more than one bit of information. For example, a resistive change memory cell might adjust its resistive change element between four non-volatile resistive states, allowing for the storage of two bits of information in a single cell.

Within the present disclosure the term "programming" is used to describe an operation wherein a resistive change element is adjusted from an initial resistive state to a new desired resistive state. Such programming operations can include a SET operation, wherein a resistive change element is adjusted from a relatively high resistive state (e.g., on the order of 10 MΩ) to a relatively low resistive state (e.g., on the order of 100 kΩ). Such programming operations (as defined by the present disclosure) can also include a RESET operation, wherein a resistive change element is adjusted from a relatively low resistive state (e.g., on the order of 100 kΩ) to a relatively high resistive state (e.g., on the order of 1 MΩ). Additionally, a READ operation, as defined by the present disclosure, is used to describe an operation wherein the resistive state of a resistive change element is determined without significantly altering the stored resistive state.

Resistive change elements can use, for example, two-terminal nanotube switching elements, phase change memory, metal oxide memory cells, or conductive bridge memory (CBRAM) as well as other materials and designs.

Resistive change elements (and arrays thereof) are well suited for use as non-volatile memory devices for storing digital data (storing logic values as resistive states) within electronic devices (such as, but not limited to, cell phones, digital cameras, solid state hard drives, and computers). However, the use of resistive change elements is not limited to memory applications. Indeed, arrays of resistive change elements as well as the advanced architectures taught by the present disclosure could also be used within logic devices or within analog circuitry.

Typically, a resistive change element is adjusted (programmed) between different resistive states by applying electrical stimulus across the element. For example, one or more programming pulses of specific voltages, currents, and pulse widths (as required by the needs of a specific application) can be applied across a resistive change element to adjust the electrical resistance of a resistive change element from an initial resistance value to a new desired resistance value. A second programming pulse (or pulses) can be used to adjust the resistive change element back to the first initial resistive state or, depending on the specific application, a third resistive state.

Further, the state of a resistive change element can be determined, for example, by applying a DC test voltage across the resistive change element and measuring the current through the resistive change element. In some applications this current can be measured using a power supply with a current feedback output, for example, a programmable power supply or a sense amplifier. In other applications this current can be measured by inserting a current measuring device in series with the resistive change element. Alternatively, the state of a resistive change element can also be determined, for example, by driving a fixed DC current through the resistive change element and measuring the resulting voltage across the resistive change element. In both cases, the electrical stimulus applied to resistive change element is limited such as to not alter the resistive state of the element. In this way, a READ operation can determine the state of a resistive change memory element.

A resistive change element can be formed from a plurality of materials, such as, but not limited to, metal oxide, solid electrolyte, phase change material such as a chalcogenide glass, and carbon nanotube fabrics. For example, U.S. Pat. No. 7,781,862 to Bertin et al., incorporated herein by reference, discloses a two terminal nanotube switching device comprising a first and second conductive terminals and a nanotube fabric article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through said nanotube fabric layer. By carefully controlling this electrical stimulus within a certain set of predetermined parameters (as described by Bertin in U.S. Pat. No. 7,781,862) the resistivity of the nanotube article can be repeatedly switched between a relatively high resistive state and relatively low resistive state. In certain embodiments, these high and low resistive states can be used to store a bit of information.

As described by the incorporated references, a nanotube fabric as referred to herein for the present disclosure comprises a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure.

While some examples of resistive change cells and elements within the present disclosure specifically reference carbon nanotube based resistive change cells and elements, the methods of the present disclosure are not limited in this regard. Indeed, it will be clear to those skilled in the art that the methods of the present disclosure are applicable to any type of resistive change cell or element (such as, but not limited to, phase change and metal oxide).

Referring now to FIG. 1, an exemplary architecture for a resistive change element array 100 is illustrated in a simplified schematic diagram. Within the exemplary architecture 100, field effect transistors (FETs) are used within each resistive change element cell to provide a selectability function to that cell. That is, the FET devices (Q00-Qxy) provide a means to access a desired resistive change element while isolating unselected elements.

Specifically looking now to FIG. 1, the array 100 comprises a plurality of cells (CELL00-CELLxy), each cell including a resistive change element (SW00-SWxy) and a selection device (Q00-Qxy). The individual array cells (CELL00-CELLxy) within resistive change array 100 are selected for reading and programming operations using arrays of source lines (SL[0]-SL[x]), word lines (WL[0]-WL[y]), and bit lines (BL[0]-BL[x]) as will be described below.

Responsive to control signals applied to the word lines (WL[0]-WL[y]), the selection devices (Q00-Qxy) within the individual array cells permit access or electrically isolate the resistive change elements (SW00-SWxy). A specific individual cell (for example, CELL00) can be accessed by driving the associated word line (WL[0] for CELL00) with electrical stimuli sufficient to turn on the desired cell's selection FET (Q00 for CELL00). The electrical stimuli required to program (that is, SET or RESET) or READ the selected resistive change element (SW00 for CELL00) can then be applied across the bit line (BL[0] for CELL[0]) and the select line (SL[0] for CELL00) associated with the selected cell. With the selection device (Q00 in this example) enabled, a conductive path is provided between the bit line and the select line through the selected resistive change element, and the provided programming or reading stimuli is driven across only the selected resistive change element (SW00 for CELL00). The other cells associated with the bit line and select line being used are on separate word lines and are thus not enabled. In this way, the exemplary resistive change element array architecture 100 of FIG. 1 provides a means for individually accessing and addressing all of the cells within the array and directing applied electrical stimuli sufficient to program (that is, SET or RESET) or READ any of the cells within the array.

As described above, the resistive change element array architecture 100 of FIG. 1 provides an access and addressing scheme that requires each cell be responsive to three separate control lines. Further, it requires that each cell include an in situ FET select device, and further that this FET select device be power rated high enough to withstand the programming voltages required by the resistive change elements being used within the array. This can, in certain applications, result in an FET selection device that is significantly large as compared to the physical size of the resistive change element being used or even as compared to the desired physical dimension boundaries of an array cell. As resistive change element arrays are scaled down and cell densities increased, these and other design requirements of the array architecture 100 of FIG. 1 can represent, within certain applications, significant limitations with respect to the both circuit design and scaling.

Figure 2:
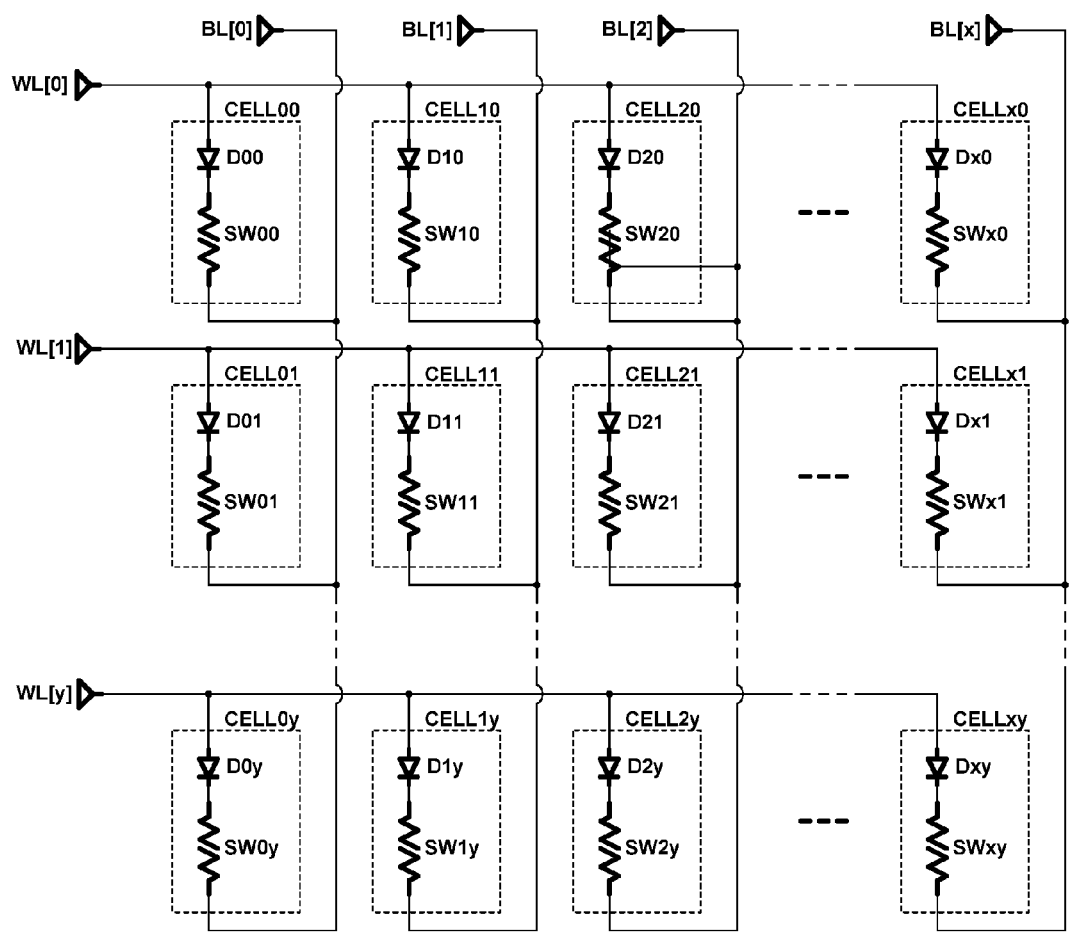
FIG. 2 is a simplified schematic illustrating an exemplary typical architecture for an array of resistive change elements wherein diode selection devices are used within the cells of the array.

Referring now to FIG. 2, a second exemplary architecture for a resistive change element array 200 is illustrated in a simplified schematic diagram. Within the exemplary architecture 200, diodes are used within each resistive change element cell to provide a selectability function to the cell. That is, the diode devices (D00-Dxy) provide a means to access a desired resistive change element while isolating unselected elements.

Specifically looking now to FIG. 2, the array 200 comprises a plurality of cells (CELL00-CELLxy), and each cell comprises a resistive change element (SW00-SWxy) in series with a selection device (D00-Dxy). The individual array cells (CELL00-CELLxy) within resistive change element array 200 are selected for reading and programming operations using arrays of word lines (WL[0]-WL[y]) and bit lines (BL[0]-BL[x]) as will be described below.

By driving its arrays of words lines (WL[0]-WL[y]) and bit lines (BL[0]-BL[x]) with a specific bias, the resistive change element array architecture 200 of FIG. 2 can enable a selected array cell by forward biasing that cell's selection diode while either reverse biasing or simply providing no voltage drop across the section diodes of the remaining unselected cells. For example, to access CELL00 a sufficient READ, SET, or RESET voltage (or current) is applied to WL[0] while BL[0] is driven to ground (0V). The remaining word lines (WL[1]-WL[y]) are driven to ground (0V), and the remaining bit lines (BL[1]-BL[x]) are driven at the same voltage supplied to WL[0]. In this way, the selection diodes within the remaining cells on the selected bit line (BL[0])—that is, CELL01-CELL0y—remain unbiased, each of the cells seeing 0V on both its associated word line and its associated bit line. Similarly, the selection diodes within the remaining cells on the selected word line (WL[0])—that is, CELL10-CELLx0—also remain unbiased, each of those cells seeing the applied programming or READ voltage on both its associated word line and its associated bit line. And finally, the selection diodes within the remaining cells in the array—that is, CELL11-CELLxy—are reversed biased, each of those cells seeing 0V on its associated word line and the applied programming voltage or READ voltage on its associated bit line. In this way, only D00 is forward biased, and the applied programming or READ voltage (or current) is applied only over the selected resistive change element SW00.

As described above, the resistive change element array architecture 200 of FIG. 2 provides an addressing scheme that requires each cell be responsive to only two separate control lines as compared with the three control lines required by the array architecture 100 of FIG. 1. While this represents a significant simplification in architecture and layout, the array architecture 200 of FIG. 2 still requires that each cell include an in situ selection device (a diode in this case). As with the FET selection device of array architecture 100 of FIG. 1, this selection diode must be power rated high enough to withstand the programming voltages required by the resistive change elements being used within the array—this includes a reverse bias rating greater than the programming voltage and current required by the resistive change element being used. As with the FET selection devices of FIG. 1, this can, in certain applications, result in a diode selection device that is significantly large as compared to the physical size of the resistive change element being used or even as compared to the desired physical dimension boundaries of an array cell. Additionally, the array architecture 200 of FIG. 2 does not permit bipolar operation of the resistive change elements. That is, programming (SET and RESET) currents and READ currents can only be applied in only one direction: the polarity associated with the forward bias direction of the selection diodes. In certain applications, bipolar operation—for example, wherein a SET operation would be performed with an electric current flowing through a resistive change element from a bit line to word line, and a RESET operation would be performed with a current flowing from a word line to a bit line—is desirable within a programming scheme for a particular resistive change element technology or configuration. As resistive change element arrays are scaled down and cell densities increased, these and other design requirements of the array architecture 200 of FIG. 2 can represent, within certain applications, significant limitations with respect to the both circuit design and scaling.

Figure 3:
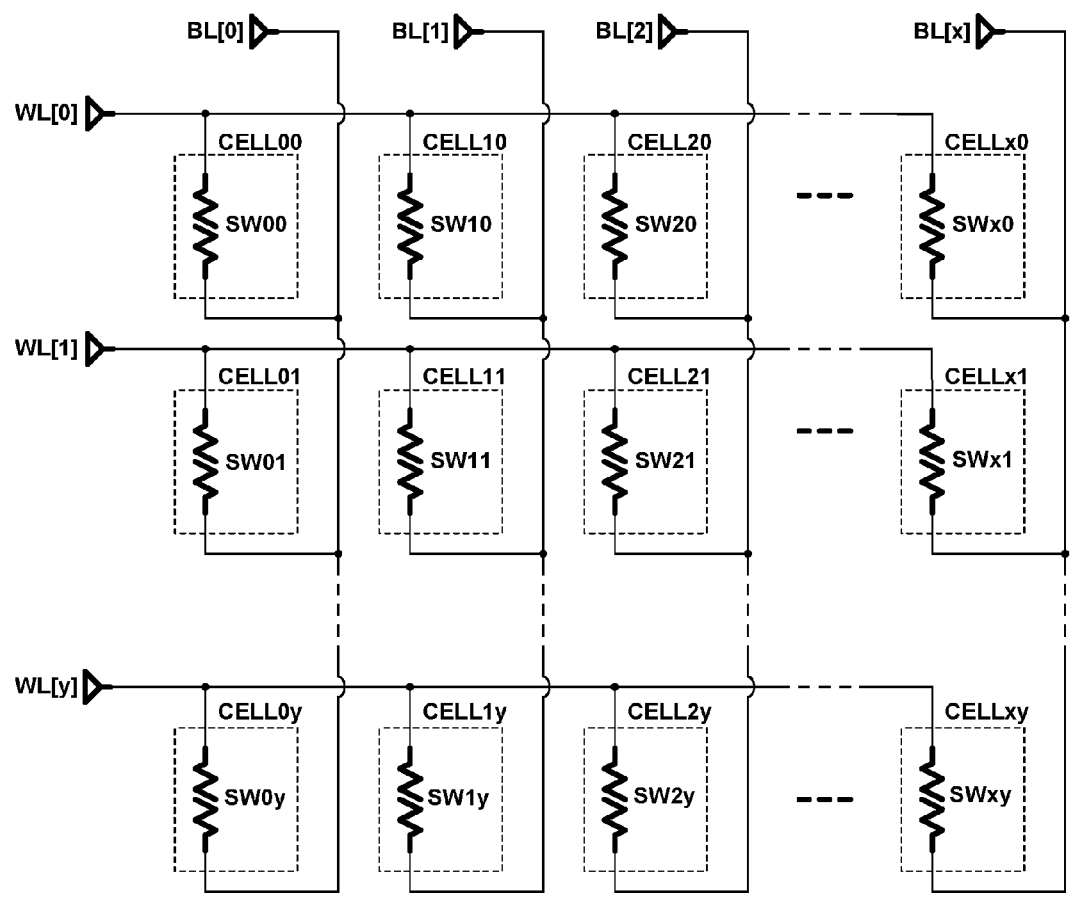
FIG. 3 is a simplified schematic illustrating an exemplary typical architecture for an array of 1-R resistive change element cells wherein no selection devices or other current limiting circuitry are used within the cells of the array.

Referring now to FIG. 3, a third exemplary architecture for a resistive change element array 300 is illustrated in a simplified schematic diagram. Within the exemplary architecture 300, no selection devices or other current limiting elements are used within the resistive change element cells. That is, each cell is comprised only of a resistive change element that is accessed via two control lines (a word line and a bit line).

As with the array architecture 200 detailed in FIG. 2, the array architecture 300 of FIG. 3 can address individual resistive change cells within the array by driving the word lines and bit lines with a specific bias. In the absence of any selection devices within the individual array cells (CELL00-CELLxy), an access operation to array architecture 300 must provide a sufficient electrical stimulus—as required for a programming (SET or RESET) or READ operation—to a selected array cell and, at the same time, prevent the other cells in the array from experiencing any electrical stimuli that would alter their stored resistive state.

For example, to access CELL00 within array architecture 300 of FIG. 3, a sufficient READ, SET, or RESET voltage (or current) is applied to WL[0] while BL[0] is driven to ground (0V). The remaining word lines (WL[1]-WL[y]) and the remaining bit lines (BL[1]-BL[x]) are driven at half the voltage (or current) supplied to WL[0]. In this way, only half of an applied programming or READ voltage (or current) is applied to the resistive change elements within the remaining cells on the selected bit line (BL[0])—that is, CELL01-CELL0y—and within the remaining cells on the selected word line (WL[0])—that is, CELL10-CELLx0. That is, CELL01-CELL0y each see half of the applied programming or READ voltage on their associated word line and 0V on their associated bit lines, and CELL10-CELLx0 see the full programming or READ voltage on their associated word lines but only half the programming or READ voltage on their associated bit line. The remaining cells in the array—that is, CELL11-CELLxy—are unbiased, each of those cells seeing half of the applied programming or READ voltage (or current) on both its associated word line and on its associated bit line, resulting in no voltage drop or current flow across/through the resistive change elements in those cells. In this way, the applied programming or READ voltage is applied only over the selected resistive change element SW00, and while some of the unselected cells within the array are partially biased during the access and addressing operation, the electrical stimuli applied to those cells is not sufficient to alter the resistive state of those cells or disturb the programming or READ operation being performed on the selected cell.

Figure 4:
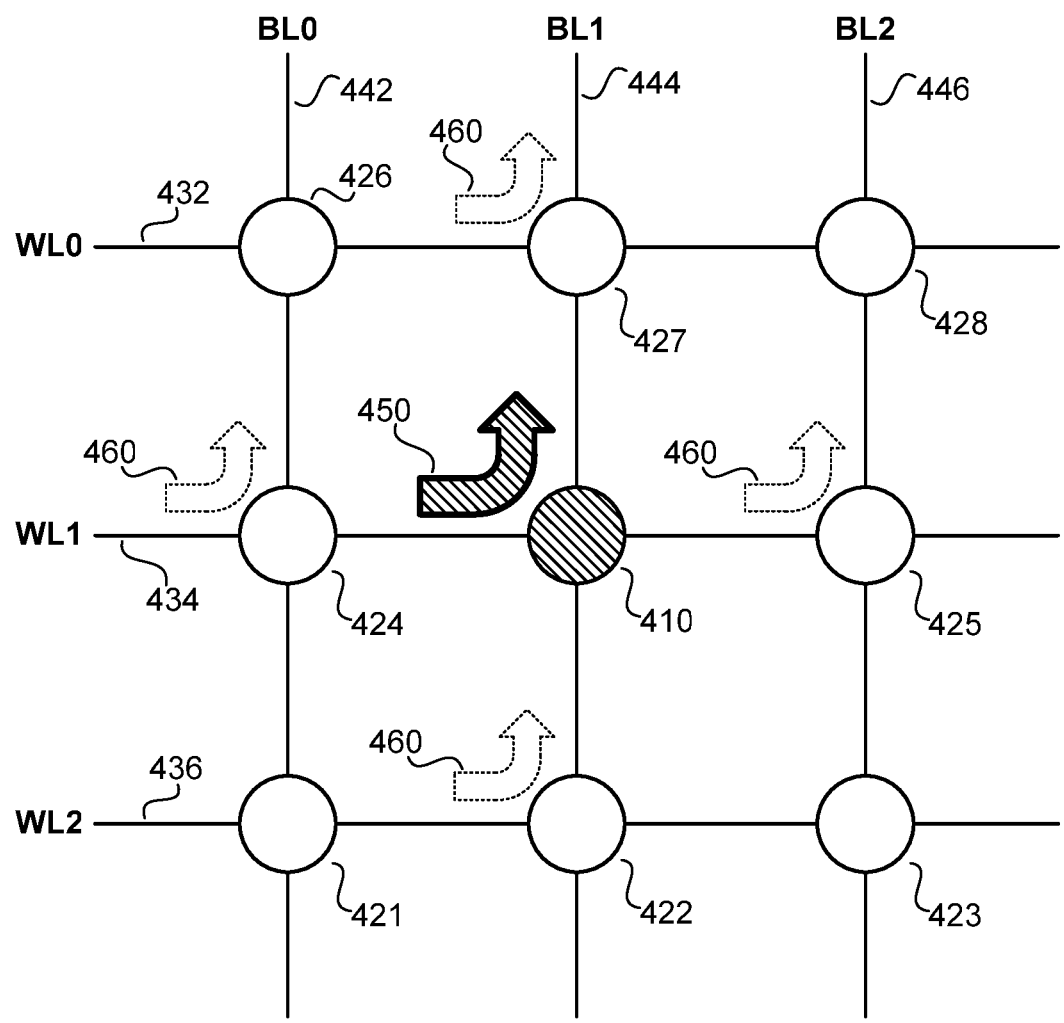
FIG. 4 is a diagram illustrating parasitic current flows present within a 1-R resistive change element array architecture (as shown in FIG. 3, for example) during a static DC programming or read operation.

FIG. 4 is a diagram 400 illustrating the electric currents through a selected cell and also the cells adjacent to a selected cell during a conventional static DC programming or READ operation performed on the 1-R resistive change element array of FIG. 3 (as is described with respect to FIG. 3 above). Within the diagram 400, the selected cell 410 is accessed by driving a sufficient programming (SET or RESET) or READ voltage (such voltage requirements determined by the specific needs of a particular application or type of resistive change element being used) onto WL1 and pulling BL1 down to ground (0V). Responsive to this applied electrical stimuli, a programming or READ current 450 is generated from WL1 to BL1 through the selected resistive change cell 410. Additionally (as described in detail above with respect to FIG. 3), a voltage at half the level of the voltage applied to WL1 is applied to the unselected word lines (WL0 and WL2) and the unselected bit lines (BL0 and BL2). In this way, unselected cells 421, 423, 426, and 428 remain unbiased (each of these cells seeing half of the applied programming or READ voltage on both its associated bit line and its associated word line). And unselected cells 422, 424, 425, and 427 become biased at half the voltage applied to WL1, generating a parasitic current 460 through those cells. As described above, with careful selection of programming voltages, currents, and design parameters of the resistive change elements themselves, these parasitic currents 460 remain insufficient to alter the resistive state of unselected cells 422, 424, 425, and 427 or to disturb the programming or READ operation on selected cell 410.

As discussed above, the array architecture 300 detailed in FIG. 3 provides a circuit structure that, as with the array architecture 200 of FIG. 2, requires each cell be responsive to only two separate control lines as compared with the three control lines required by the array architecture 100 of FIG. 1. Further array architecture 300 as detailed in FIG. 3 does not require a selection device in situ with each resistive change element, and array architecture 300 allows for bipolar operation (that is, programming or READ currents can flow from word line to bit line or bit line to word line, as befits the needs of a specific application or a specific resistive change element technology). U.S. Patent Application No. 2014 0166959 to Bertin et al. incorporated by reference herein in its entirety, teaches this type of architecture for a resistive change element array as describes some methods (as discussed above) for programming and reading cells within such an array. Within US 2014 0166959, Bertin terms this type of resistive change element cell—wherein the array cell consists only of a two terminal resistive change element—a 1-R cell.

This 1-R cell array architecture 300 detailed in FIG. 3 (and discussed within Ser. No. 13/716,453 to Bertin) represents a further significant improvement and simplification with respect to circuit architecture and layout (as compared with array architectures 100 and 200 of FIGS. 1 and 2) for certain applications. For example, scaling of cell size within array architecture 300 is limited only by the physical dimension requirements of the resistive change elements themselves. Further, as each array cell only includes one device (the resistive change element itself) and two interconnections (a bit line electrically coupled to the first terminal of the resistive change element a word line electrical coupled to the second terminal), the complexity of the resistive change element array is significantly reduced, providing—within certain applications—numerous benefits with respect to ease of fabrication, cost, increased ability for scaling, and circuit integration. As such, the simplified array architecture 300 as detailed in FIG. 3 (or a similar variation, such as, for example, the array structure shown in FIG. 5) is highly desirable as the state of the art continues to demand higher density resistive change element arrays.

However, while array architecture 300 (and similar variations) are highly desirable within certain applications, the traditional static DC programming and reading methods as described above and detailed with respect to FIGS. 3 and 4 (and those methods discussed in Ser. No. 13/716,453 to Bertin) can represent, within certain applications, limitations with respect to the layout and design of a resistive change element array. The parasitic currents 460 inherent within static DC programming and READ operations as described with respect to FIG. 4, for example, can, within certain applications, introduce certain design restrictions within a resistive change element array. For example, such a programming method can require, in certain applications, that the nominal SET and RESET resistance values used within a specific resistive change element be significantly far apart as compared with a resistive change element used within other architectures (100 and 200 in FIGS. 1 and 2, for example). Such a wide range in nominal resistance values could, for example, introduce physical dimension requirements within a nanotube fabric or a chalcogenide block used with the resistive change element making up the cells of the arrays.

Further, in another example, the length of the bit lines and the word lines used within the resistive change element array can be, in certain applications, limited due, in part, to the parasitic currents 460 detailed in FIG. 4. With respect to READ, for example, as the number of cells (or bits) per bit line increases, the READ signal to the sense amplifier is reduced, thereby limiting the number of cells (or bits) per bit line to ensure sufficient signal voltage to the sense amplifier. Also, the capacitance inherent in very long array lines can—again, in certain applications—allow these small currents to flow through unselected cells as the lines themselves charge up to their required voltages. While these parasitic current values might be small in magnitude as compared to a required programming current, for example, the prolonged current flow can, if not carefully considered within the array design, be enough to alter the resistance value stored in an unselected cell or inhibit or otherwise adversely affect a programming or READ operation. Such a limitation can, in certain applications, require bit lines and words lines to be limited to a certain length to reduce the number of cells and line capacitance.

In another example, the access and addressing method detailed in FIG. 4 can, in certain applications, require higher SET, RESET, and READ currents as compared to other resistive change element array architectures (100 and 200 in FIGS. 1 and 2, for example). Many of the parasitic currents 460 shown in FIG. 4, for example, are driven by the same driver circuit, i.e.: the external circuit driving the programming voltage on WL1. Within an array architecture such as is shown in FIG. 2, for example, only the selected cell would be biased and enabled, and the entire supplied current would flow through the selected resistive change element. However, as is shown in FIG. 4, using a traditional static DC programming or READ method within an array structure such as is shown in FIG. 3 (wherein the array cells contain no selection element) a supplied programming or READ current is driven through not only the selected cell, but also many of the unselected cells on the selected bit line and the selected word line. As such, the effective current through a selected cell can be, in these certain applications, significantly reduced as compared with other architectures. That is, for example, in order to provide a sufficient READ current as required by a certain application and resistive change element technology using the access and addressing method detailed in FIG. 4, a significantly higher READ current (or voltage) would need to be supplied on WL1 to account for the parasitic currents inherent in the access and addressing method. Such increased power requirements can be, in certain applications, undesirable.

As described in detail above, while the 1-R resistive change element array architecture 300 of FIG. 3 (and similar variations) provides numerous benefits with respect to ease of design and fabrication as well as cost and scaling considerations, the static, DC programming methods as developed for other types of array architectures (such as, but not limited to array architectures 100 and 200 in FIGS. 1 and 2, respectively) can introduce undesirable limitations which can limit the effectiveness of such an array structure in certain applications. To this end, the present disclosure provides a improved access and addressing methods that are well suited for use with a 1-R resistive change element array architecture wherein no selection devices (or other current limiting elements) are used within the array cells (as is detailed in FIG. 3, for example). This improved access and addressing methods can be used to perform SET, RESET, and READ operations within such architectures without incurring the limitations described above with respect to the method described in relation to FIG. 4. These access and addressing method will be described in detail within the discussion of the remaining FIGS below.

Figure 5:
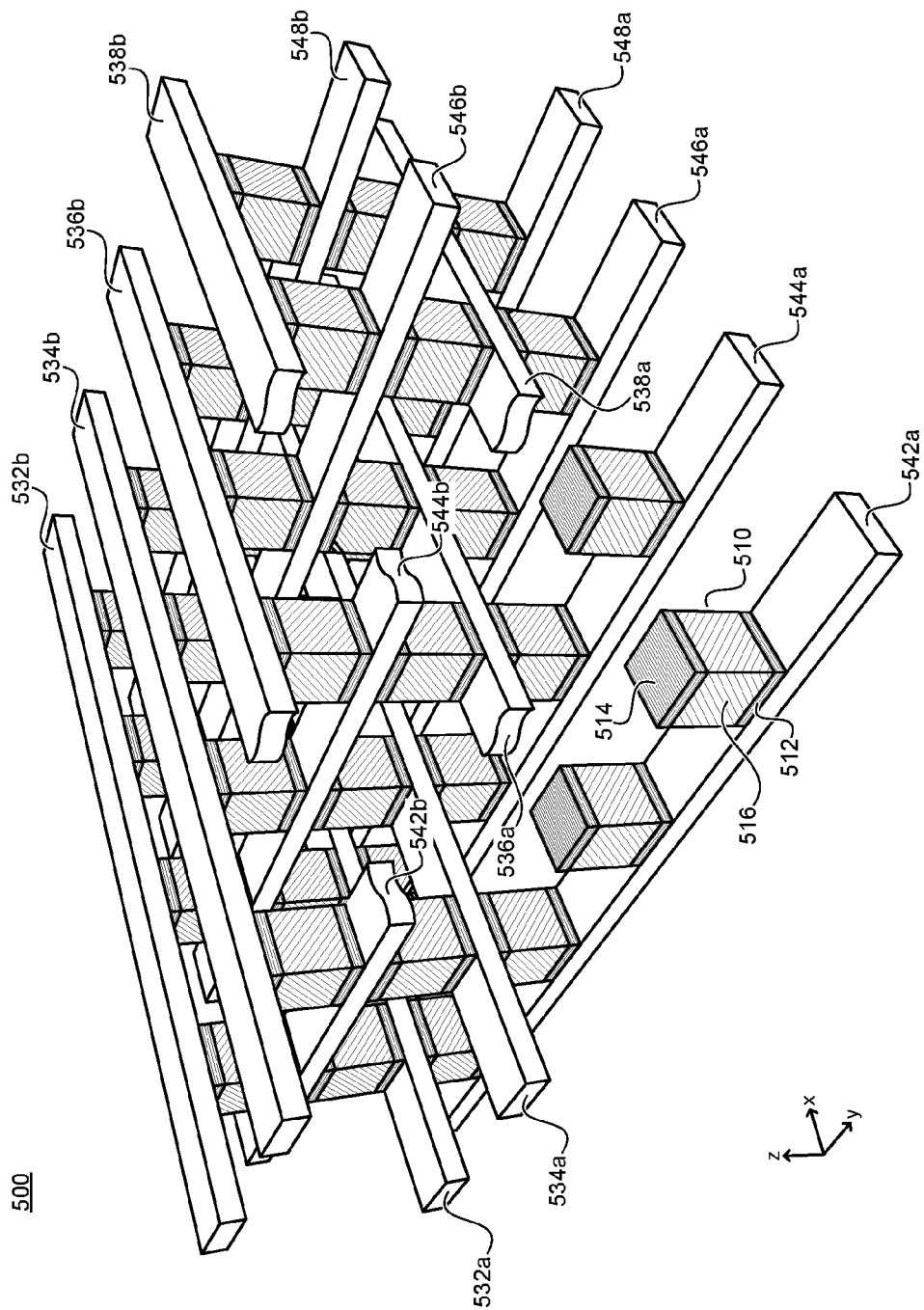
FIG. 5 is a perspective drawing illustrating the layout of a 3D array of 1-R resistive change element cells.

FIG. 5 is a perspective drawing of a 3D resistive change element array 500. Resistive change element array 500 is comprised of 1-R resistive change cells arranged in three dimensions (along the x-, y-, and z-axes). A first layer of bit lines (542a, 544a, 546a, and 548a) are disposed along the y-axis, and a first layer of word lines (532a, 534a, 536a, and 538a) are disposed along the x-axis and above this first layer of bit lines. Between these first two layers of bit lines (542a, 544a, 546a, and 548a) and words lines (532a, 534a, 536a, and 538a), a first layer of resistive change elements 510 is disposed, one resistive change element at each word line and bit line crossing. The resistive change elements are each comprised of a resistive change material 516 (such as, but not limited to, a nanotube fabric layer or a block of phase change material) disposed between a first conductive element 512 and a second conductive element 514. It is desirable, in certain applications, to use these first and second conductive elements (512 and 514, respectively) to provide a conductive path between an array line (a word or bit line) and the actual resistive change material 516. However, these conductive elements (512 and 514) are not required in every application. For example, depending on the material used for the array lines, the particular material selected for the resistive change element 516, and the layout and fabrication methods being used, in certain applications it could be more favorable for the resistive change material block to connect directly to the array lines themselves. As such, the inclusion of first and second conductive elements (512 and 514, respectively) should not be seen as limiting with respect to the architecture of 1-R resistive change element arrays.

A second layer of bit lines (542b, 544b, 546b, and 548b) is disposed along the y-axis above the first layer of word lines. Between this second layer of bit lines (542b, 544b, 546b, and 548b) and the first layer of words lines (532a, 534a, 536a, and 538a), a second layer of resistive change elements 510 is disposed, one resistive change element at each word line and bit line crossing. A second layer of word lines (532b, 534b, 536b, and 538b) is disposed along the x-axis above the second layer of bits lines (542b, 544b, 546b, and 548b), and a third layer of resistive change elements 510 is disposed, one resistive change element at each word line and bit line crossing. In this way, an array of forty-eight 1-R resistive change element cells is arranged within essentially the same cross sectional area that would be used for an array of only sixteen array cells within a traditional 2D array structure.

A 3D array structure, as detailed in FIG. 5, is highly desirable in terms of scaling and array cell density. And the relatively simplicity of the 1-R cell architecture (as described in detail with respect to FIGS. 3 and 4) is well suited for such a 3D structure, and provides numerous manufacturing and functional benefits. Further, the READ and programming methods of the present disclosure are especially well suited to such a complex array structure. As will be discussed in detail below, the improved access and addressing methods of the present disclosure eliminate many of the design restrictions inherent in the static DC methods (such as are described in relation to FIG. 4 above). As such, in certain applications, the methods of the present disclosure are well suited for use with complex array structure such as is depicted in FIG. 5.

Looking now to FIGS. 6A and 6B, two altered versions of the 1-R array architecture 300 detailed in FIG. 3 are illustrated in simplified schematic diagrams. These altered array architectures 601 and 602 are presented as variations on the array architecture 300 shown in FIG. 3 and are well suited for use with the improved READ methods of the present disclosure. Both array architecture 601 and array architecture 602 are nearly identical in structure to array architecture 300 in FIG. 3. Each of the 1-R array cells (CELL00-CELLxy) is made up of only a single resistive change element (SW00-SWxy), and no in situ selection devices or other current limiting devices are used within the array cells. Each of the cells (CELL00-CELLxy) is addressed and accessed responsive to only two lines: a word line (WL[0]-WL[y]) and a bit line (BL[0]-BL[x]).

Looking to both FIGS. 6A and 6B, a first variation is the addition of measurement and storage elements responsive to each bit line within the arrays (601 and 602, respectively). These measurement and storage elements are well suited for use within the READ method of the present disclosure as discussed in detail below with respect to FIGS. 7A-7B, 8A-8B, 9A-9D, 10A-10B, and 11A-11B. Within the exemplary array architecture 601 of FIG. 6A, each of these measurement and storage elements comprises a "data" FET ($Q_{D0}$-$Q_{Dx}$), which, when enabled by a control line (RD_DATA0-RD_DATAx) connects each associated bit line to the first input of a comparator element (U1-Ux). Within the exemplary array architecture of FIG. 6A, a fixed reference voltage is provided by reference voltage generator U100 and supplied to the second input of the comparator elements (U0-Ux) within the measurement and storage elements. Such a fixed reference voltage can be provided by circuit elements within the array circuit itself or provided by circuitry outside of the array as befits the needs of a particular application. Each of the comparator elements (U0-Ux), selectively responsive to an associated bit line and the fixed reference voltage, provides a data output (D0-Dx), which, as will be shown in detail below, within the methods of the present disclosure can be used to indicate the data value stored within a selected resistive change element on the bit line associated with the measurement and storage element.

Looking to FIG. 6B, a second array architecture variation (as compared with array architecture 300 of FIG. 3) is the addition of reference resistive elements ($R_{REF0}$-$R_{REFx}$) and the reference word line (WL_REF). Each of these reference resistive elements ($R_{REF0}$-$R_{REFx}$) has a first terminal in electrical communication with the reference word line (WL_REF) and a second terminal in electrical communication with one of the bit lines (BL[0]-BL[x]). In this way, each bit line within the array 602 is associated with a reference resistive element. Within the exemplary array architecture 602 of FIG. 6B, each of the measurement and storage elements further comprises a "reference" FET ($Q_{REF0}$-$Q_{REFx}$), which, when enabled by a control line (RD_REF0-RD_REFx), provides a discharge path from the bit line associated with a measurement and storage element to a "reference" storage capacitor ($C_{REF0}$-$C_{REFx}$). Further, each measurement and storage element also includes a "data" storage capacitor ($C_{DATA0}$-$C_{DATAx}$), which is used to retain the bit line voltage seen during the data phase of a READ operation (as will be explained in detail within the discussion of FIG. 7B). In this way, each of the comparator elements (U0-Ux) of FIG. 6B is responsive to both a "data" storage capacitor ($C_{DATA0}$-$C_{DATAx}$) and a "reference" storage capacitor ($C_{REF0}$-$C_{REFx}$) and provides a data output (D0-Dx), which, as will be shown in detail below, within the methods of the present disclosure can be used to indicate the data value stored within a selected resistive change element on the bit line associated with the measurement and storage element. These reference resistive elements are used within at least one aspect of the READ methods of the present disclosure, and their function will be explained in detail within the discussion of FIGS. 7B, 9A-9D, and 11A-11B below.

As will be described in more detail within the discussion of FIGS. 7A and 7B below, the exemplary measurement and storage elements can be used to measure and store the resulting voltage from a discharge current driven through a selected cell in a first operation. In certain operations this stored voltage can be then compared to a fixed reference voltage (as shown in FIG. 6A and described within the READ method of FIG. 7A) to determine the resistive state of a selected cell or cells. Or, in other operations a second process step can be used to measure and store the resulting voltage from a discharge current driven through a resistive reference element. The two stored voltages can than be compared to determine the resistive state of the selected cell or cells (as shown in FIG. 6B and described within the method of FIG. 7B). Further, with a separate measurement and storage element responsive to each bit line, the exemplary array architectures 601 and 602 can be used to read every array cell on a selected word line simultaneously. Such a functionality can be highly desirable in certain applications where rapid data READ operations or page mode READ operations are required.

It should be noted that while the exemplary array architectures 601 and 602 depict exemplary measurement and storage elements comprised of certain circuit elements and with every bit line responsive to a dedicated measurement and storage element, the methods of the present disclosure are not limited in this regard. Indeed, as will be described in more detail below, the methods of the present disclosure require only that the discharge current or voltage resulting from an applied read voltage be observed and the value or levels temporally stored or recorded during a READ operation. The exemplary measurement and storage elements depicted in FIGS. 6A and 6B are intended to serve as non-limiting examples of an electrical circuit capable of this functionality. The observation, measurement, and storage of discharge voltages and/or currents (or simply the values of those voltages and currents) could be achieved by a great number of similar circuit elements and architectures. Further, in certain applications such measurements could be performed outside of the array itself (via, for example, external measurement elements or within the power supply element driving the READ voltages itself). Further still, a measurement and storage element according to the methods of the present disclosure could be multiplexed to be responsive to one or more bit lines within the array, such as to reduce the number of measurement and storage elements required.

Figure 7A:
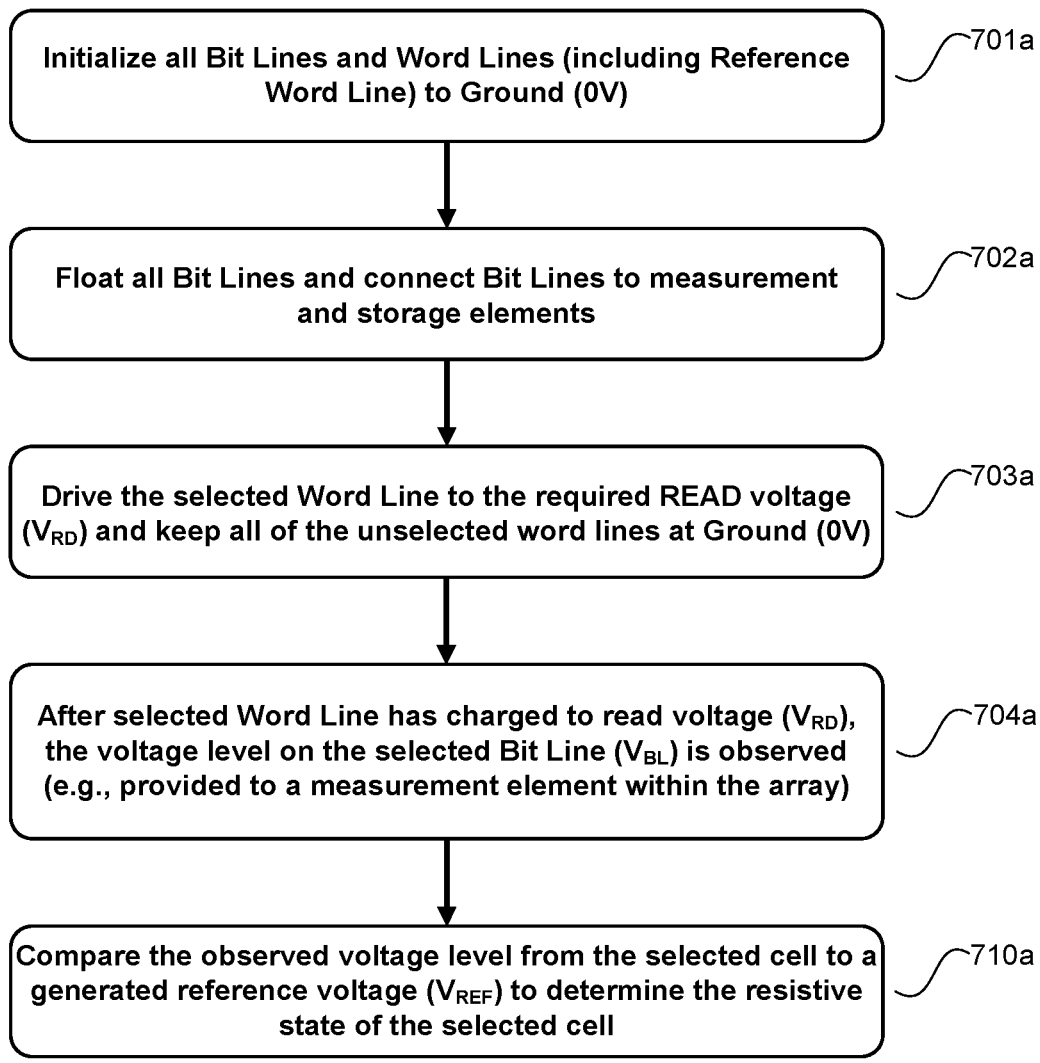
FIG. 7A is a flow chart detailing a method according to the present disclosure for performing a READ operation on all of the bits associated with a selected bit line within a resistive change element array using a fixed voltage reference.
Figure 7B:
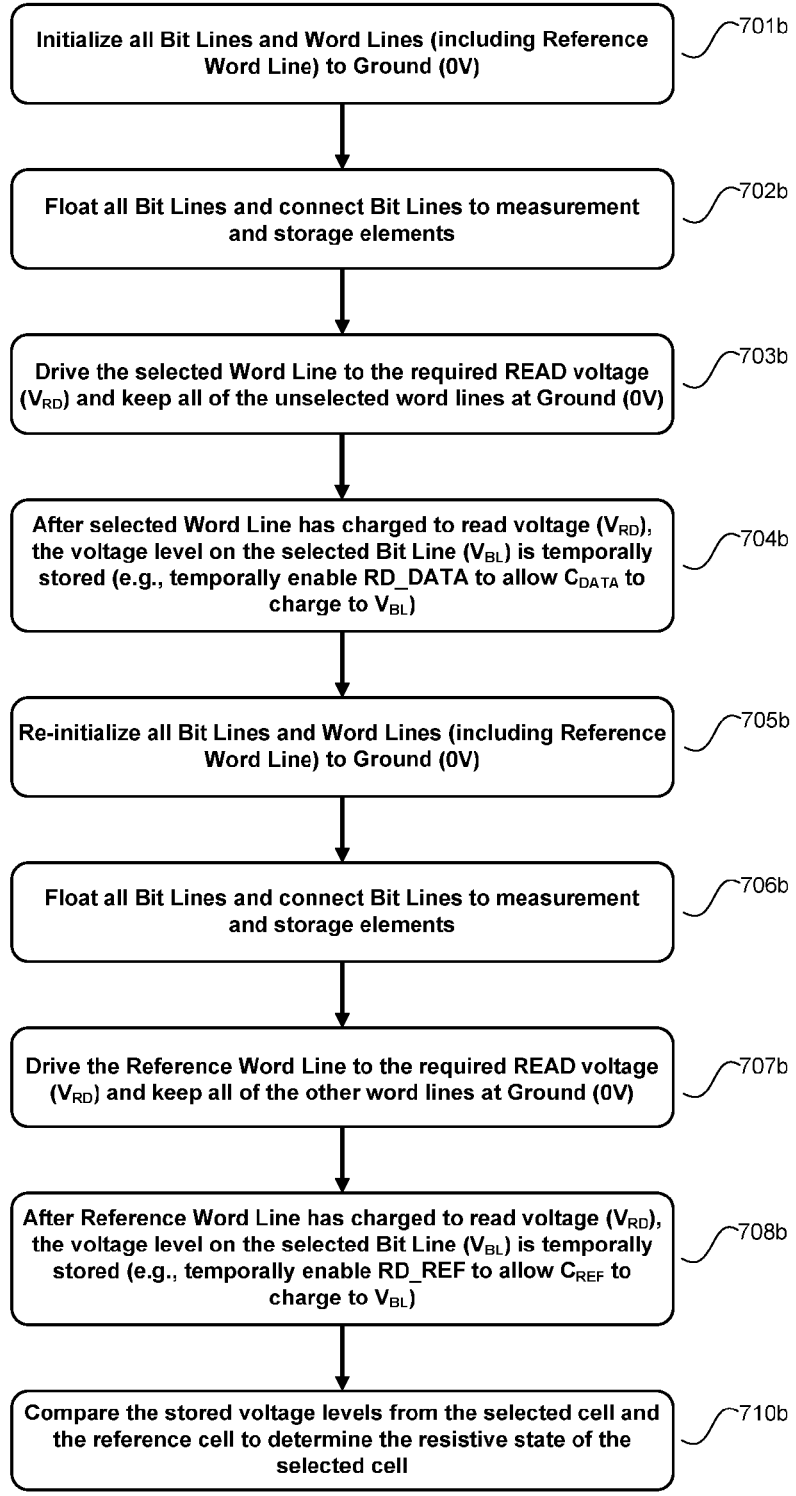
FIG. 7B is a flow chart detailing a method according to the present disclosure for performing a READ operation on all of the bits associated with a selected bit line within a resistive change element array using reference resistive elements within the array.

FIGS. 7A and 7B are flow charts detailing methods according to the present disclosure for performing a READ operation on one or more cells within a resistive change element array. In particular, FIG. 7A details a READ method wherein a READ voltage ($V_{RD}$) is applied to one or more selected cells in order to provide a READ current through those selected cells. This current/voltage appears on one terminal of the comparator element and is compared to a fixed voltage reference applied to the other terminal to determine the resistive state stored in the selected cell or cells in a one-step READ operation. FIG. 7B details a READ method wherein a READ voltage ($V_{RD}$) is applied to one or more selected cells in order to provide a READ current through those cells in a first operation (a "data" READ phase), and then an identical READ voltage ($V_{RD}$) is applied to one or more reference resistive elements in order to provide a current through those elements in a second operation (a "reference" READ phase). The current/voltage resulting from both of these phases (obtained in a two-step READ operation) is temporally stored and then compared to determine the resistive state of the selected cell or cells.

Figure 8A:
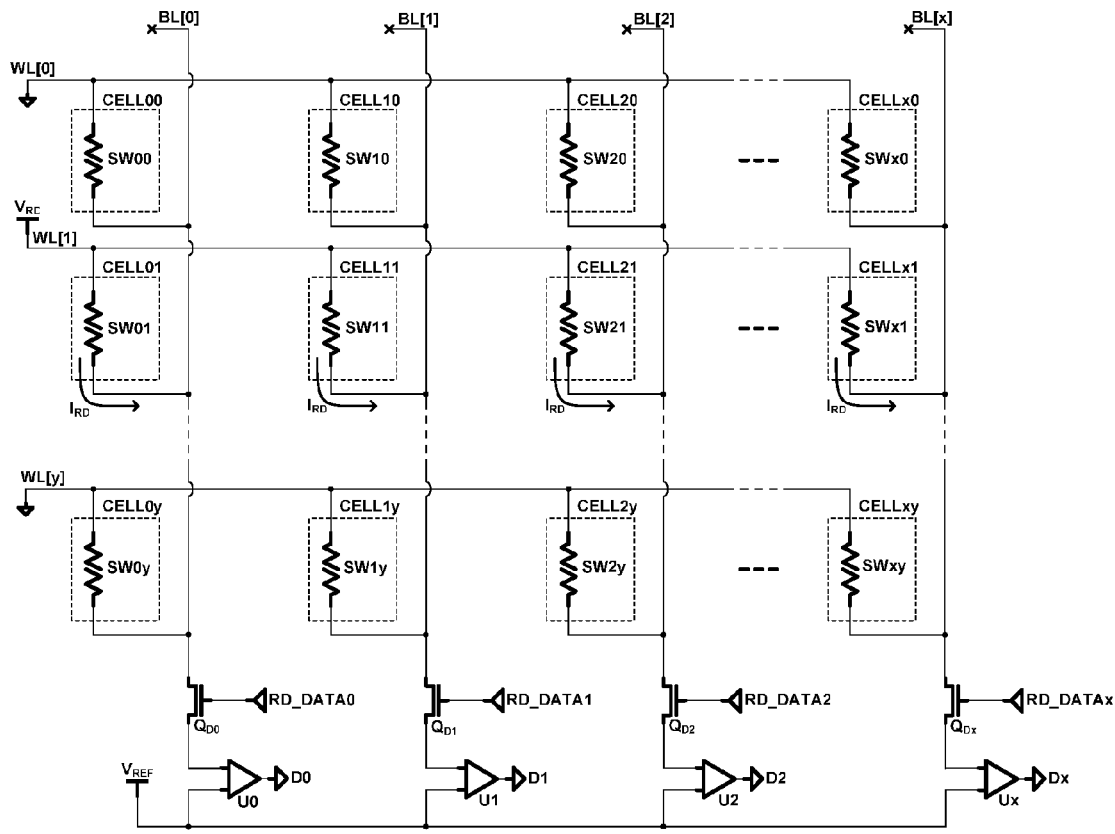
FIG. 8A is a simplified schematic diagram detailing the electrical stimuli provided to an exemplary resistive change element array (as is shown, for example, in of FIG. 6A) during an exemplary READ operation performed according to the methods of the present disclosure as detailed in FIG. 7A.
Figure 8B:
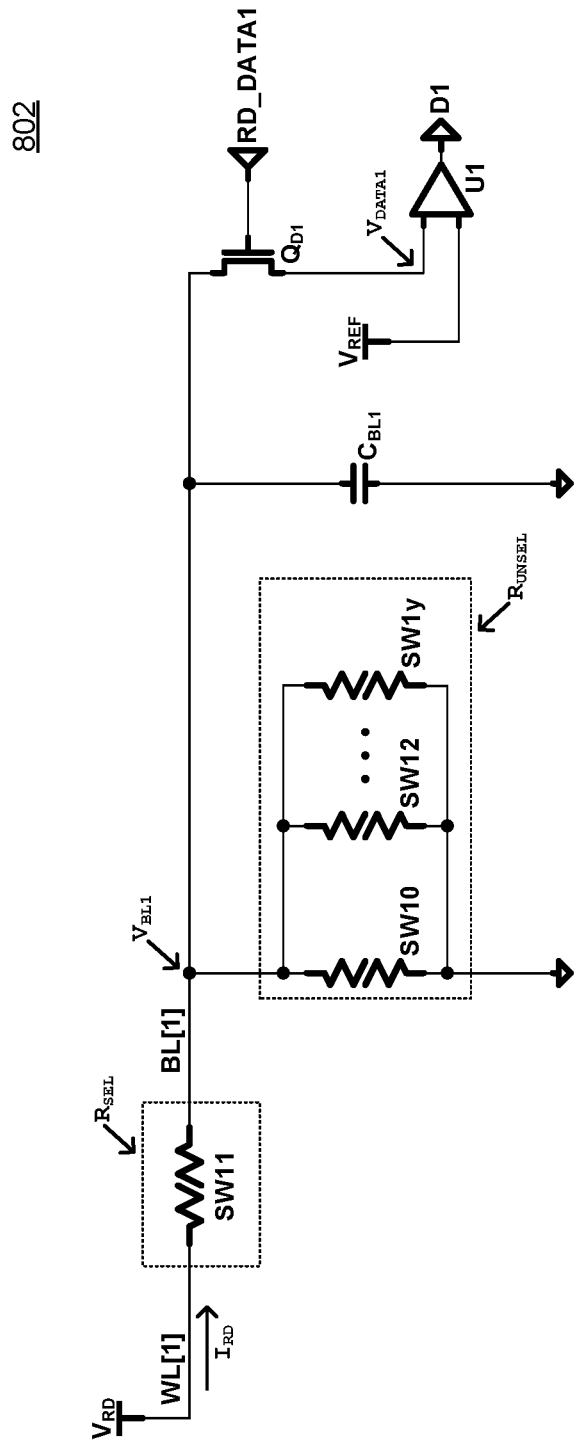
FIG. 8B is a reduced schematic diagram detailing the electrical stimuli provided to the selected bit line and the selected word line within the exemplary read operation shown in FIG. 8A.
Figure 10B:
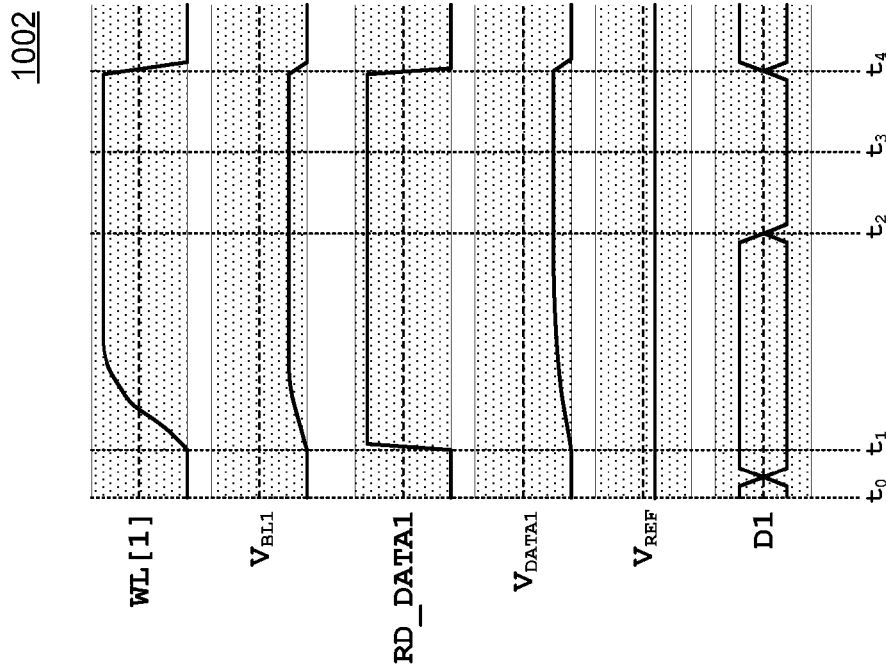
FIG. 10B is a series of waveform diagrams detailing the electrical stimuli provided to an exemplary resistive change element array (as is shown, for example, in FIG. 6A) during an exemplary READ operation performed according to the methods of the present disclosure as detailed in FIG. 7A wherein the selected cell reads a logic 0.
Figure 10A:
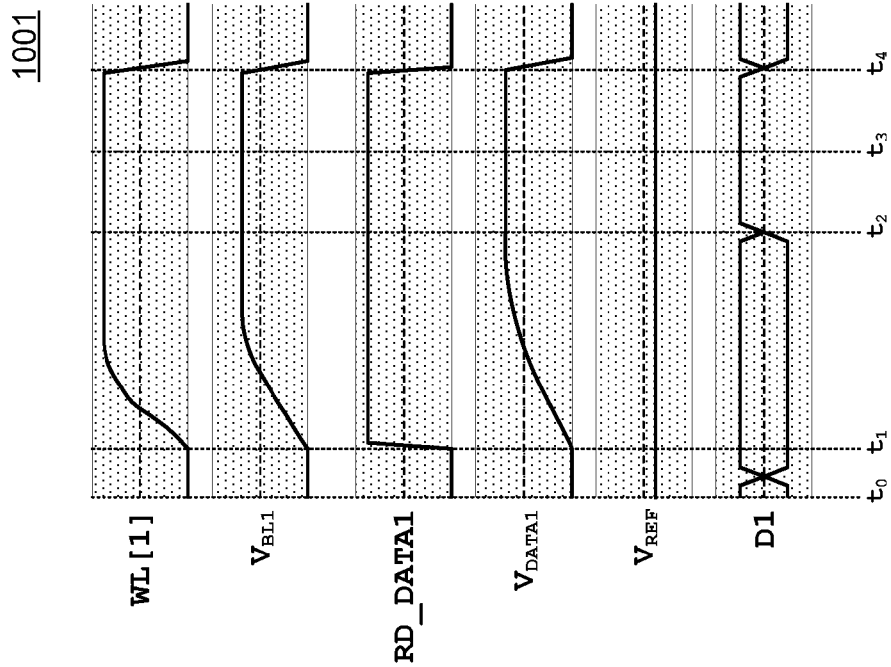
FIG. 10A is a series of waveform diagrams detailing the electrical stimuli provided to an exemplary resistive change element array (as is shown, for example, in FIG. 6A) during an exemplary READ operation performed according to the methods of the present disclosure as detailed in FIG. 7A wherein the selected cell reads a logic 1.

In order to illustrate the READ methods of the present disclosure as described within FIG. 7A, FIG. 8A provides a simplified schematic drawing depicting voltages applied to the resistive change element array architecture 601 shown in FIG. 6A during an exemplary READ operation method performed as described in FIG. 7A. And FIG. 8B is a reduced schematic detailing the array elements along BL[1] during the READ operation depicted in FIG. 8A. Further, FIGS. 10A and 10B provide a series of waveform diagrams illustrating two exemplary READ operations according to the present disclosure as detailed in FIG. 7A. Specially, FIG. 10A depicts a READ operation on CELL11 (as shown in FIGS. 6A and 8A) wherein the cell reads as a logic "1," and FIG. 10B depicts a READ operation on the same cell wherein the cell reads as a logic "0."

Figure 9A:
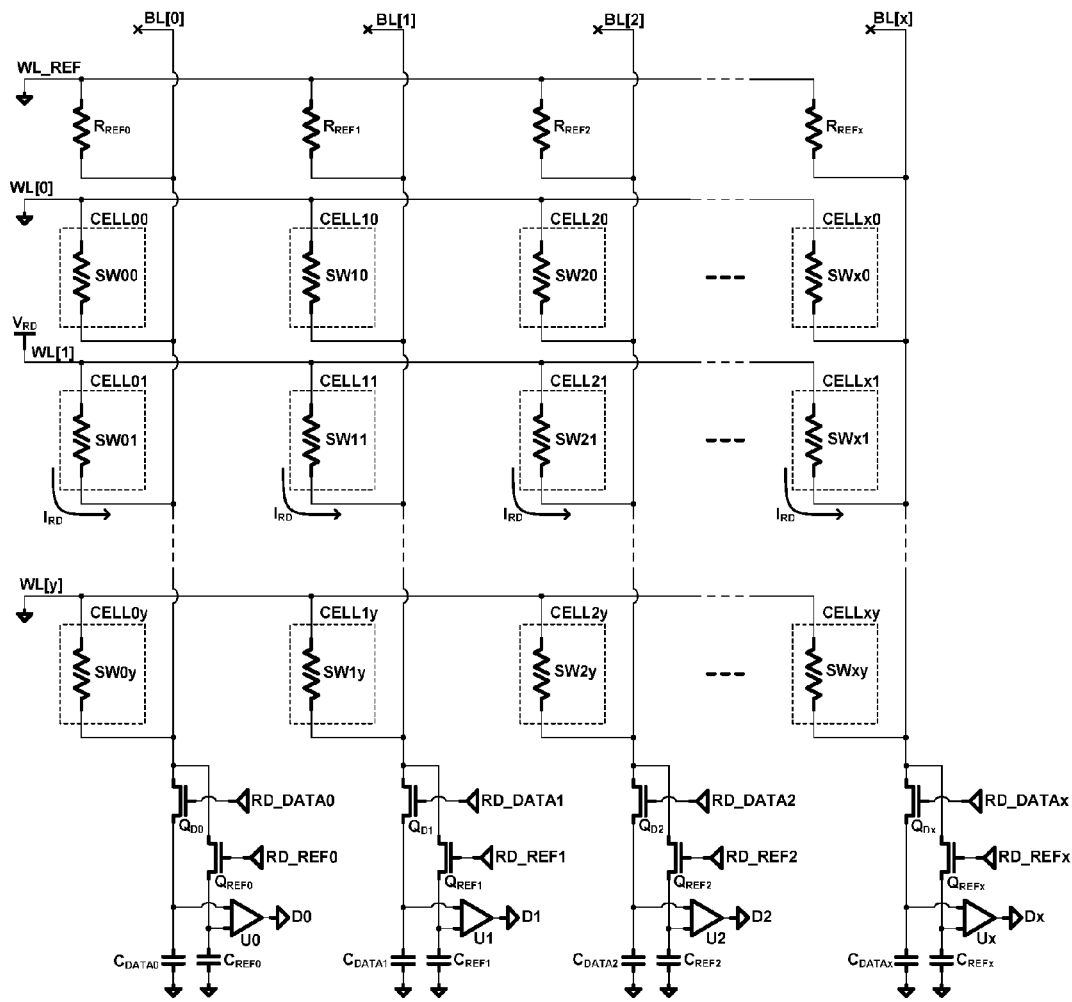
FIG. 9A is a simplified schematic diagram detailing the electrical stimuli provided to an exemplary resistive change element array (as is shown, for example, in of FIG. 6B) during the first half of an exemplary READ operation performed according to the methods of the present disclosure as detailed in FIG. 7B (process step 703).
Figure 9B:
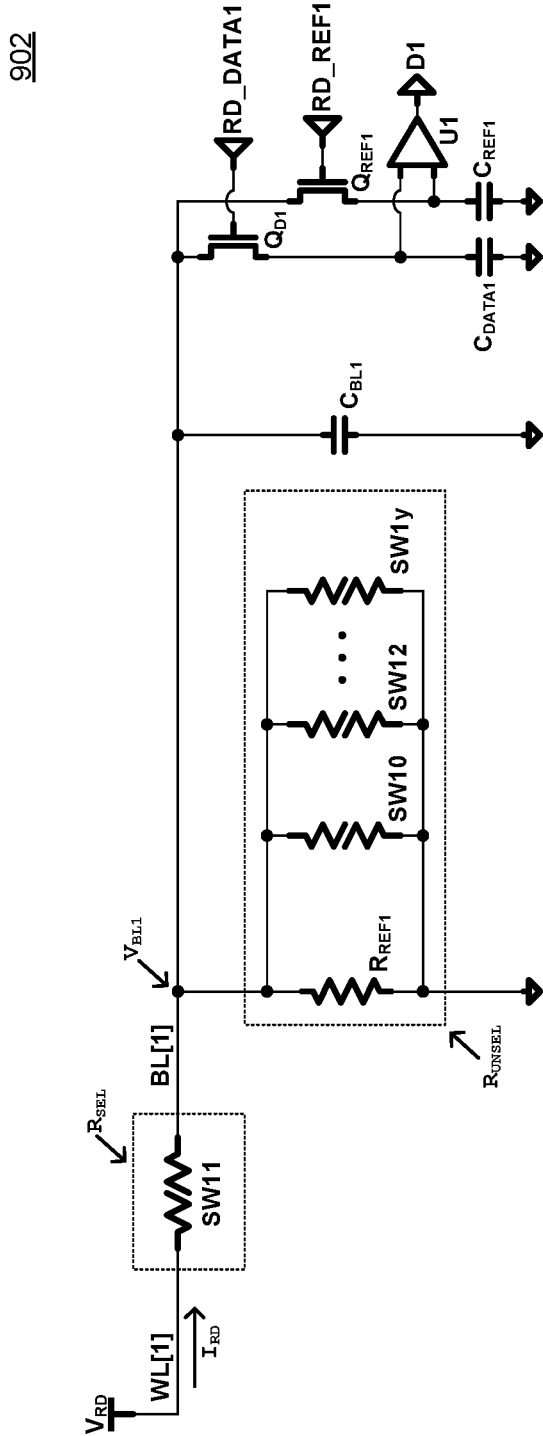
FIG. 9B is a reduced schematic diagram detailing the electrical stimuli provided to the selected bit line and the selected word line within the exemplary read operation shown in FIG. 9A.
Figure 9C:
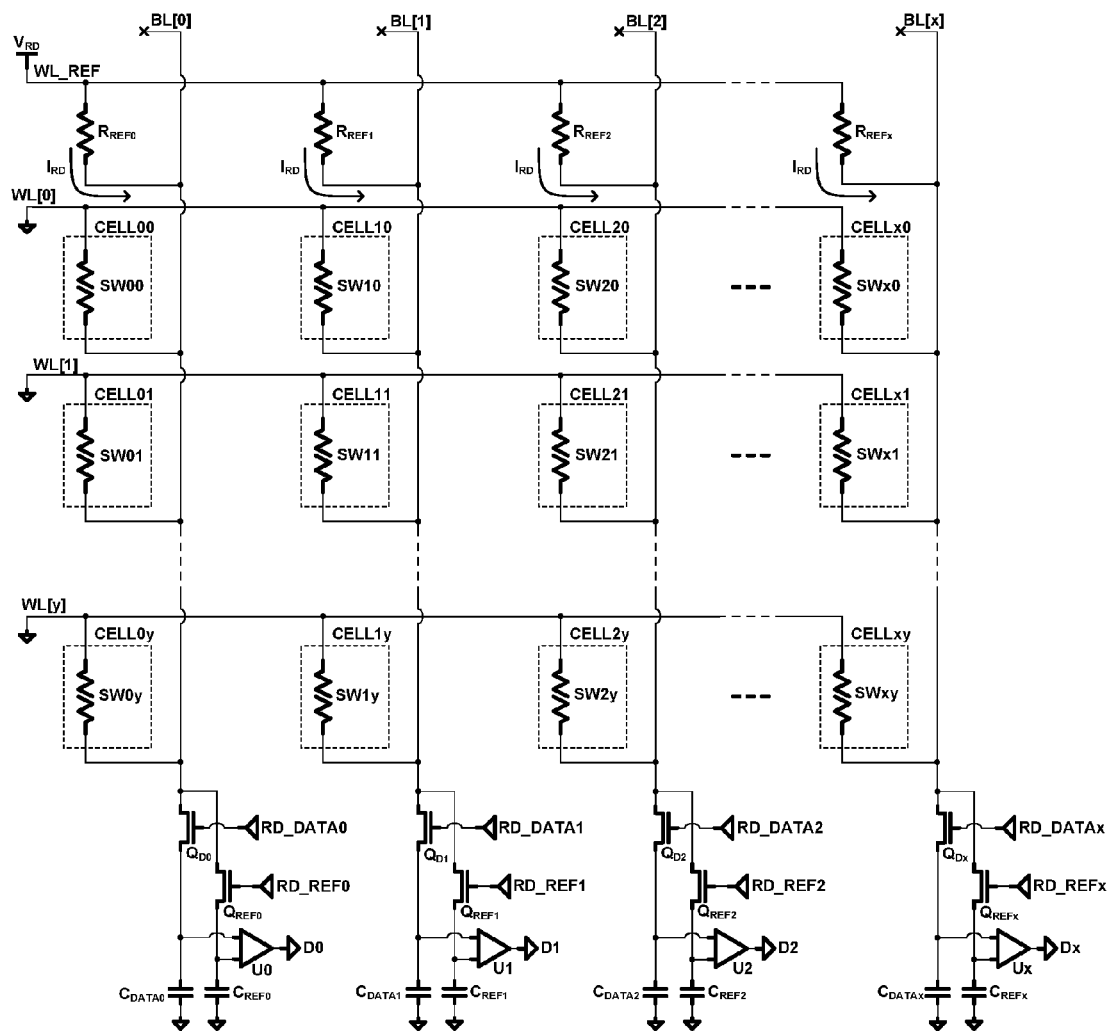
FIG. 9C is a simplified schematic diagram detailing the electrical stimuli provided to an exemplary resistive change element array (as is shown, for example, in of FIG. 6B) during the second half of an exemplary READ operation performed according to the methods of the present disclosure as detailed in FIG. 7B (process step 705).
Figure 9D:
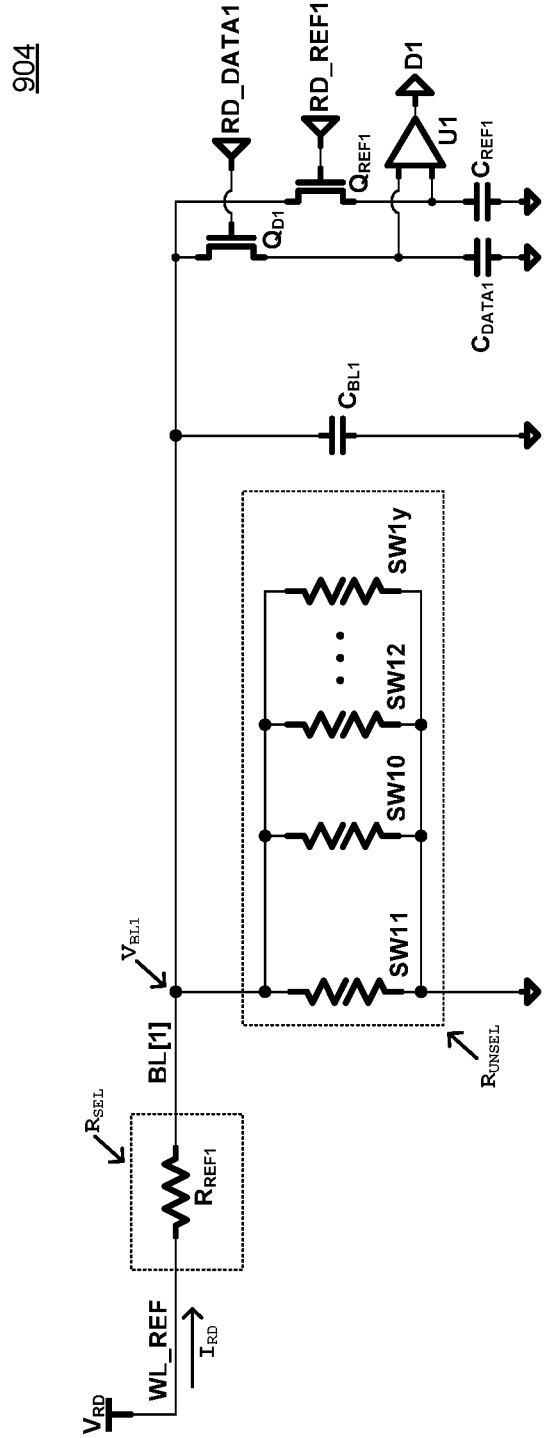
FIG. 9D is a reduced schematic diagram detailing the electrical stimuli provided to the selected bit line and the reference word line within the exemplary read operation shown in FIG. 9C.
Figure 11A:
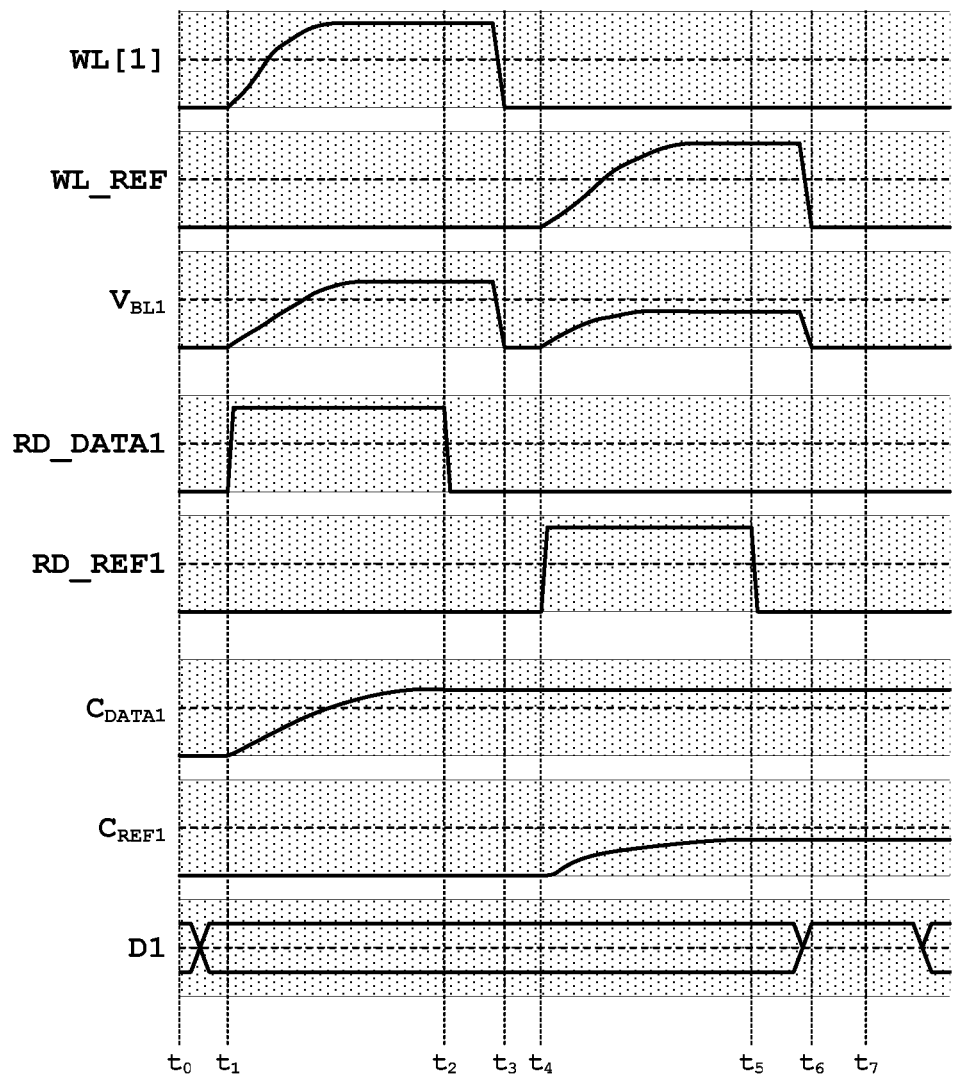
FIG. 11A is a series of waveform diagrams detailing the electrical stimuli provided to an exemplary resistive change element array (as is shown, for example, in FIG. 6B) during an exemplary READ operation performed according to the methods of the present disclosure as detailed in FIG. 7B wherein the selected cell reads a logic 1.
Figure 11B:
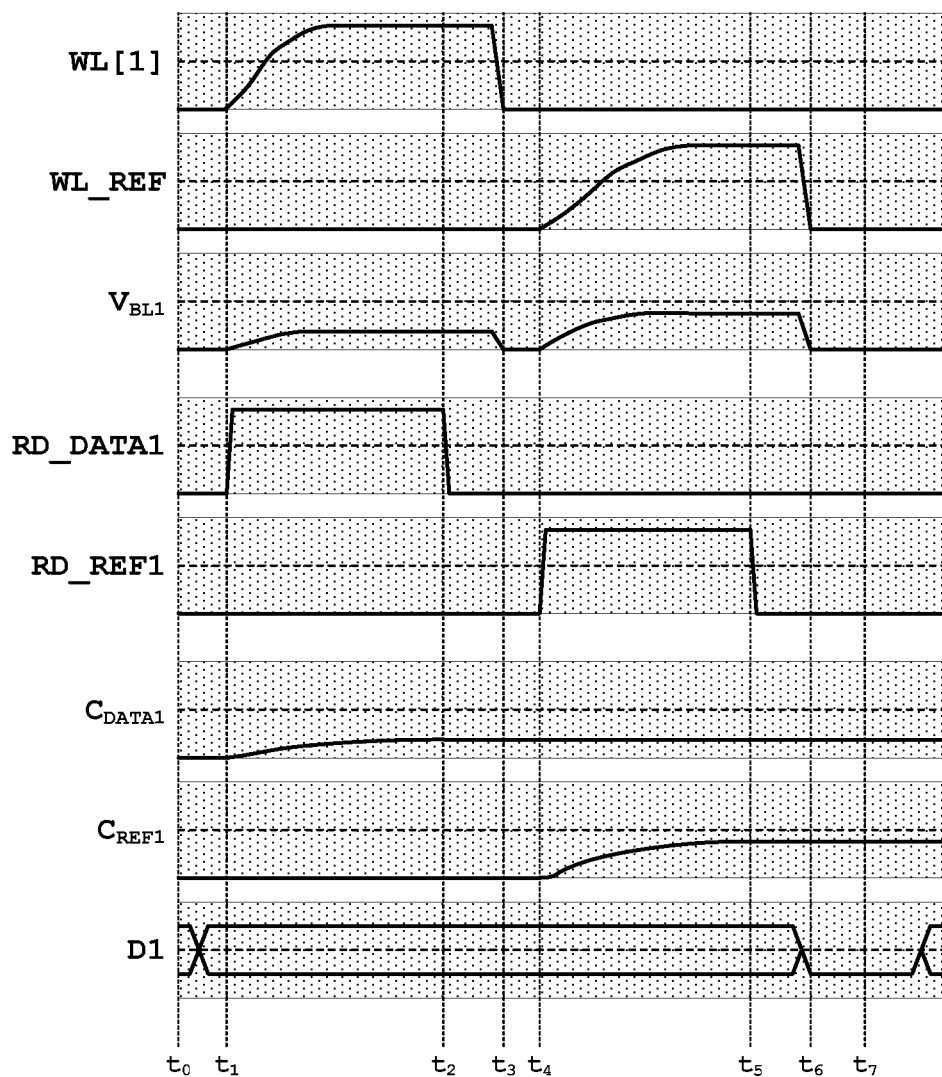
FIG. 11B is a series of waveform diagrams detailing the electrical stimuli provided to an exemplary resistive change element array (as is shown, for example, in FIG. 6B) during an exemplary READ operation performed according to the methods of the present disclosure as detailed in FIG. 7B wherein the selected cell reads a logic 0.

Further, in order to illustrate the READ methods of the present disclosure as described within FIG. 7B, FIG. 9A provides a simplified schematic drawing depicting voltages applied to the resistive change element array architecture shown in FIG. 6B during the first phase (the "data" READ phase) of the READ operation method described in FIG. 7B (up to process step 704b). And FIG. 9B is a reduced schematic detailing the array elements along BL[1] during the process step depicted in FIG. 9A. Similarly, FIG. 9C is a simplified schematic drawing depicting voltages applied to the resistive change element array architecture shown in FIG. 6B during the second phase (the "reference" READ phase) of the READ operation described in FIG. 7B (up to process step 707b). And FIG. 9D is a reduced schematic detailing the array elements along BL[1] during the process step depicted in FIG. 9C. FIGS. 9B and 9D are arranged to illustrate the bit line voltage ($V_{BL1}$) realized during each phase of a READ operation preformed according to the method described in FIG. 7B. These bit line voltages ($V_{BL1}$) are temporarily stored (within $C_{DATA1}$ and $C_{REF1}$, respectively) and, within the exemplary READ operation, provided to the comparator element U1 to determine the state of the cell being READ. These bit line voltages ($V_{BL1}$) are also shown and calculated as the Thevenin voltage ($V_{TH}$) within FIG. 12B. Further, FIGS. 11A and 11B provide a series of waveform diagrams illustrating two exemplary READ operations according to the present disclosure as detailed in FIG. 7B. Specially, FIG. 11A depicts a READ operation on CELL11 (as shown in FIGS. 6B and 9A) wherein the cell reads as a logic "1," and FIG. 11B depicts a READ operation on the same cell wherein the cell reads as a logic "0."

Referring now to both FIGS. 7A and 7B, in a first process step 701a/701b, all bit lines and word lines (including the reference word line) within a resistive change element array are initialized to ground (0V). In a next process step 702a/702b, all of the bit lines within the array are floated, and those bit lines in the array associated with cells to be READ are each connected to a measurement and storage element. In a next process step 703a/703b, the selected word line—that is, the word line associated with the cell or cells to be READ—is driven to the required READ voltage ($V_{RD}$) while all of the unselected word lines are kept at ground (0V). In this way, one or more READ currents ($I_{RD}$) are permitted to flow through the one or more selected cells within the resistive change element array from the selected word line to the bit line or bit lines associated with the one or more selected cells and through a parallel combination of the unselected cells on the associated bit line or bit lines to ground. This current path is more explicitly shown in FIGS. 8B and 9B and described in more detail within the discussion of those figures.

In a next process step 704a/704b, the one or more measurement and storage elements connected to the one or more selected bit lines is used to observe and, in the case of FIG. 7B, temporally store the value of the resulting READ current ($I_{RD}$) (or a voltage level resulting from that current) through each of the one or more selected array cells. For example, within the exemplary array structure detailed in FIG. 6B, storage capacitors within the measurement and storage elements are used to temporarily store the voltage resulting from the READ current ($I_{RD}$) flowing through the resistive divide between the resistive value stored within a selected array element on a bit line and the combined parallel resistance of the unselected array cells on that same bit line. This resulting voltage value is indicative of the value of the READ current ($I_{RD}$) and, in turn, the resistive value stored within the resistive change element within the selected array cell.

Looking specifically to FIG. 7A, in process step 710a, this observed voltage is compared to the fixed voltage reference to determine the resistive state stored within the one or more selected array cells. As previously described, this fixed voltage reference can be provided through circuitry within the array (a band gap voltage generator circuit located on the same die as the array cells, for example) or from an external circuit (a calibrated voltage supply, for example) as best befits the needs of a particular application.

Looking specifically to FIG. 7B, in process step 705b all bit lines and word lines (including the reference word line) are re-initialized back to ground (0V). This completes the first phase (the "data" READ phase) of the READ operation and beings the second phase (the "reference" READ phase). In a next process step 706b, all of the bit lines within the array are again floated, and those bit lines in the array associated with cells to be READ are again each connected to a measurement and storage element. In a next process step 707b, the reference word line—that is, the word line associated with the reference resistance elements within the array—is driven to the required READ voltage ($V_{RD}$) while all of the other word lines are kept at ground (0V). In this way, one or more READ currents ($I_{RD}$) are permitted to flow through one or more resistive reference elements within the resistive change element array from the reference word line to the bit line or bit lines associated with the one or more selected cells and through a parallel combination of the array cells on the associated bit line or bit lines to ground.

In a next process step 708b, the one or more measurement and storage elements connected to the one or more selected bit lines is used to observe and store the value of the resulting READ current ($I_{RD}$) through each of the one or more reference resistive elements. In a next process step 710b, the READ current measured and stored through the one or more selected array cells (within process step 704b) is compared to the READ current measured and stored through one or more reference resistance elements (within process step 708b) to determine the resistive state stored within the one or more selected array cells.

Within the methods of the present disclosure, the reference resistance elements within the array are selected to have a resistance value between the nominal resistance value of a SET condition and the nominal resistance value of a RESET condition. As such, a READ current (or resulting voltage from an applied READ current) through a selected array cell that measures higher than a READ current (or resulting voltage from an applied READ current) through a reference resistance element on the same bit line would indicate the selected array cell is programed with a first logic value (a logic "1" or a SET condition, for example). And a READ current (or resulting voltage from an applied READ current) through a selected array cell that measures lower than a READ current (or resulting voltage from an applied READ current) through a reference resistance element on the same bit line would indicate the selected array cell is programmed with a second logic value (a logic "0" or a RESET condition, for example). These READ currents (through both selected array cells and reference resistive elements) realize bit line voltages ($V_{BL}$, as discussed in detail with respect to FIGS. 9B and 9D) indicative of the different READ current levels realized during the two phases of the READ operation, and, in turn, indicative of the different resistive values of the selected cell an reference resistive element. These resulting bit line voltages can then be compared to determine the state of the selected cell. It should be noted, however, that in certain applications a current sensing comparator (or other type of measurement element) could be used. In such a case, the READ currents could be compared directly instead of the resulting bit line voltages.

As described above, according to certain aspects of the present disclosure the resistive state of a selected cell is determined by comparing the electrical response of a selected array cell to that of a reference resistive elements that on the same bit line as the selected cell. As such, both the resistive change element within the selected cell and the reference resistive element are subject to essentially the same circuit conditions (array line capacitance and impedance, electrical resistance of unselected cells, leakage paths within the array, etc.) and the difference in electrical response will be largely due to the difference in electrical resistance between the resistive change element being READ and the reference resistance element. In this way, very small differences in current or voltage can be reliability and rapidly sensed without the need for additional circuit elements in situ with the array cells. Within certain applications, this precision can permit the use of significantly lower READ voltages and currents and significantly faster READ timing (as compared with conventional static DC access and addressing methods, such as are discussed, for example, with respect to FIGS. 1 and 2).

It should be noted that, as discussed previously within the discussion of FIGS. 6A and 6B, while the exemplary measurement and storage elements depicted within the exemplary array architectures 601 and 602 are well suited to this aspect of the present disclosure, the methods of the present disclosure are not limited in this regard. Indeed, the READ method of the present disclosure only requires that the resulting READ current ($I_{RD}$) or voltage divide value be measured and stored during the application of the READ voltage (VRD) to the selected word line. It should be noted that while FIGS. 6A and 6B depict a specific implementation of measurement and storage elements comprising storage capacitors and comparator elements, the methods of the present disclosure are not limited in this regard. As described previously, the observation, measurement, and storage of READ voltages and/or currents (or simply the values of those voltages and currents)—as required by the READ methods detailed in FIGS. 7A and 7B—could be achieved by a number of similar circuit elements and architectures. Further, in certain applications such measurements could be performed outside of the array itself (via, for example, external measurement elements or within the power supply element driving the READ voltages itself). As such, the use of specific measurement and storage elements described above with respect to the READ methods of FIGS. 7A and 7B is intended as a non-limiting example only to illustrate the methods of the present disclosure.

It should also be noted that, as described above, the READ methods detailed in the flowcharts of FIGS. 7A and 7B can be used to access and determine the resistive state of a single cell within an array or used to determine the resistive state of multiple cells within an array simultaneously. Further, while this READ methods as detailed in FIGS. 7A and 7B describe driving a selected word line to a required READ voltage, grounding unselected word lines, and floating bit lines (such that one or more array cells on the selected word line can be read), the methods of the present disclosure are not limited in this regard. Indeed, the READ methods of the present disclosure could be employed by floating all of the word lines in an array, driving a selected bit line to a required READ voltage, and grounding the unselected bit lines. Within such an operation, the measurement and storage elements would be responsive to word lines instead of bit lines, and one or more cells on a selected bit line would be READ).

Looking now to FIG. 8A, the simplified schematic diagram 601 of FIG. 6A has been modified to realize schematic diagram 801, which illustrates the electrical stimuli applied to an exemplary resistive change element array during an exemplary READ operation performed according to FIG. 7A. That is, during the biasing of the selected word line to induce a READ current ($I_{RD}$) through one or more cells on the selected word line. Specifically, within FIG. 8A, WL[1] has been selected and driven to a required READ voltage ($V_{RD}$) while the remaining word lines (WL[0] and WL[2]-WL[y]) are held at ground (0V). All of the bit lines (BL[0]-BL[x]) in the array are floated. In this way, a read current ($I_{RD}$) is driven through each of the resistive change elements on WL[1] (that is, SW01-SWx1).

Looking to FIG. 8B, the schematic diagram 801 of FIG. 8A has been further reduced to realize schematic diagram 802, which better illustrates the electrical stimuli applied to the elements on BL[1] during this exemplary READ operation. As can be seen in FIG. 8B, the voltage on BL[1] ($V_{BL1}$) is determined by the voltage divide between the parallel combination of the resistive change elements within the unselected array cells on BL[1] (that is, SW10 and SW1y) with the resistance of the resistive change element within the selected cell on BL[1] (that is, SW11), $R_{SEL}$. $C_{BL1}$ is included in the schematic drawing of FIG. 8B to represent the capacitance inherent on BL[1], which limits the rate at which the bit line can charge and, in turn, how fast a READ operation on CELL11 (or any cell on BL[1]) can be performed. However, once $C_{BL1}$ has had sufficient time to charge, $V_{BL1}$ is determined essentially by:

$$V_{BL1}=V_{RD}*R_{UNSEL}/(R_{SEL}+R_{UNSEL}) \quad \text{[EQ 1]}$$

And, as $R_{SEL}$ is essentially the resistance stored within the selected array cell ($R_{SW11}$), this becomes:

$$V_{BL1}=V_{RD}*R_{UNSEL}/(R_{SW11}+R_{UNSEL}) \quad \text{[EQ 2]}$$

Further, $R_{UNSEL}$ is essentially the parallel combination of the resistance stored within the unselected array cells ($R_{SW10}$-$R_{SW1y}$). Essentially:

$$R_{UNSEL}=R_{EQ}/(n-1) \quad \text{[EQ 3]}$$

Where, $R_{EQ}$ is the effective resistance of the unselected cells on a selected bit line, and n is the number of cells on a selected bit line. This effective resistance value ($R_{EQ}$) is described in more detail within the discussion of FIGS. 14A-14C. Plugging EQ 3 into EQ 2:

$$V_{BL1}=V_{RD}*(R_{EQ}/n-1)/(R_{SW11}+(R_{EQ}/(n-1)) \quad \text{[EQ 4]}$$

As detailed in EQ 4 above, the voltage level on $V_{BL1}$ at this point in the READ operation is indicative of the resistive state stored in the selected resistive change element ($R_{SW11}$). By enabling RD_DATA1, bit line BL[1] is connected through $Q_{D1}$ to the first input of comparator element U1 (node $V_{DATA1}$ in FIG. 8B). Then, by comparing this voltage ($V_{DATA1}$) to a fixed voltage reference (represented in FIG. 8B by $V_{REF}$) connected to the second input of comparator element U1, the resistive state (and, thus, the logic value) stored within the selected cell (SW11, in this example) can be determined. That is, if the voltage level on node $V_{DATA1}$ (applied to the first input of the comparator element U1) is higher than $V_{REF}$ (applied to the second input of comparator element U1), then the resistive state stored within CELL11 is determined to be first logic value (for example, a logic "1" or a SET condition). Conversely, if the voltage level stored on node $V_{DATA1}$ is lower than $V_{REF}$, then the resistive stated stored within CELL11 is determined to be a second logic value (for example, a logic "0" or a RESET condition).

Looking now to FIG. 9A, the simplified schematic diagram 602 of FIG. 6B has been modified to realize schematic diagram 901, which illustrates the electrical stimuli applied to an exemplary resistive change element array during process step 704b of FIG. 7B. That is, during the biasing of the selected word line to induce a READ current ($I_{RD}$) through one or more cells on the selected word line. Specifically, within FIG. 9A, WL[1] has been selected and driven to a required READ voltage ($V_{RD}$) while the remaining word lines (WL[0] and WL[2]-WL[y]) are held at ground (0V). All of the bit lines (BL[0]-BL[x]) in the array are floated. In this way, a read current ($I_{RD}$) is driven through each of the resistive change elements on WL[1] (that is, SW01-SWx1).

Looking to FIG. 9B, the schematic diagram 901 of FIG. 9A has been further reduced to realize schematic diagram 902, which better illustrates the electrical stimuli applied to the elements on BL[1] during this phase of the READ operation. As can be seen in FIG. 9B, the voltage on BL[1] ($V_{BL1}$) is determined by the voltage divide between the parallel combination of the resistive change elements $R_{UNSEL}$ within the unselected array cells on BL[1] (that is, SW10 and SW12-SW1y) and the reference resistive element on BL[1] ($R_{REF1}$), with the resistance of the resistive change element within the selected cell on BL[1] (that is, SW11), $R_{SEL}$. $C_{BL1}$ is included in the schematic drawing of FIG. 9B to represent the capacitance inherent on BL[1], which limits the rate at which the bit line can charge and, in turn, how fast a READ operation on CELL11 (or any cell on BL[1]) can be performed. However, once $C_{BL1}$ has had sufficient time to charge, $V_{BL1}$ is determined essentially by:

$$V_{BL1}=V_{RD}*R_{UNSEL}/(R_{SEL}+R_{UNSEL}) \quad \text{[EQ 5]}$$

And, as $R_{SEL}$ is essentially the resistance stored within the selected array cell ($R_{SW11}$), this becomes:

$$V_{BL1}=V_{RD}*R_{UNSEL}/(R_{SW11}+R_{UNSEL}) \quad [EQ\ 6]$$

As detailed in EQ 6 above, the voltage level on $V_{BL1}$ at this point in the READ operation is indicative of the resistive state stored in the selected resistive change element ($R_{SW11}$). By enabling RD_DATA1, the storage capacitor $C_{DATA1}$ is connected to BL1 through $Q_{D1}$ and this voltage ($V_{BL1}$) is stored on $C_{DATA1}$ during the remainder of the READ operation.

Looking now to FIG. 9C, the simplified schematic diagram 602 of FIG. 6B has again been modified to realize schematic diagram 903, which illustrates the electrical stimuli applied to an exemplary resistive change element array during process step 707b of FIG. 7B. That is, during the biasing of the reference word line to induce a READ current ($I_{RD}$) through reference resistance elements within the array. Specifically, within FIG. 9C, WL_REF is driven to a required READ voltage ($V_{RD}$) while the remaining word lines (WL[0]-WL[y]) are held at ground (0V). All of the bit lines (BL[0]-BL[x]) in the array are floated. In this way, a read current ($I_{RD}$) is driven through each of the reference resistive elements within the array (that is, $R_{REF0}$-$R_{REFx}$).

Looking to FIG. 9D, the schematic diagram 903 of FIG. 9C has been further reduced to realize schematic diagram 904, which (as with FIG. 9B) betters illustrates the electrical stimuli applied to the elements on BL[1] during this phase of the READ operation. As can be seen in FIG. 9D, the voltage on BL[1] ($V_{BL1}$) is determined by the voltage divide between the parallel combination of the resistive change elements $R_{UNSEL}$ within all the array cells (which includes the selected cell) on BL[1] (that is, SW10-SW1y), with the reference resistive element on BL[1] ($R_{REF1}$), $R_{SEL}$. Again, as in FIG. 9B, $C_{BL1}$ is included in the schematic drawing of FIG. 9D to represent the capacitance inherent on BL[1], which limits the rate at which the bit line can charge and, in turn, how fast a READ operation on CELL11 (or any cell on BL[1]) can be performed. However, once $C_{BL1}$ has had sufficient time to charge, $V_{BL1}$ is again determined essentially by:

$$V_{BL1}=V_{RD}*R_{UNSEL}/(R_{SEL}+R_{UNSEL}) \quad [EQ\ 7]$$

And, as $R_{SEL}$ is essentially the resistance of the reference resistive element on BL[1] ($R_{REF1}$) within this phase of the READ operation, this becomes:

$$V_{BL1}=V_{RD}*R_{UNSEL}/(R_{REF1}+R_{UNSEL}) \quad [EQ\ 8]$$

As detailed in EQ 8 above, the voltage level on $V_{BL1}$ at this point in the READ operation is indicative of the resistance value of $R_{REF1}$, which (as described earlier within the present disclosure) has been selected to fall between a nominal SET resistance value and a nominal RESET resistance value. By enabling RD_REF1, the storage capacitor $C_{REF1}$ is connected to BL1 through $Q_{REF1}$ and this voltage ($V_{BL1}$) is stored on $C_{REF1}$ during the remainder of the READ operation.

Within both phases of the READ operation discussed above (that is, the "data" phase detailed in FIGS. 9A and 9B and the "reference" phase detailed in FIGS. 9C and 9D), $R_{UNSEL}$ remains essentially constant. The resistance of the resistive change elements within the unselected cells on BL[1] remains unchanged through both these phases, and, in turn, the parallel combination of these resistive elements remains the unchanged. While in the first phase of the READ operation (FIGS. 9A and 9B) the parallel resistance combination $R_{UNSEL}$ includes $R_{REF1}$ and in the second phase (FIGS. 9C and 9D) $R_{UNSEL}$ includes $R_{SW11}$, within practical applications with large arrays of bit lines (e.g., 32, 64, 128, 256, 512, 1024, or even greater numbers of bit lines) this difference is acceptable. As such, the value of $R_{UNSEL}$ can be taken as constant for both EQ 6 and EQ 8. And the difference between the BL[1] voltage ($V_{BL1}$) measured and stored in each phase of the READ operation can be used to determine the resistive state (and, in turn, the logic value) stored within the selected array cell (CELL11). That is, if the voltage level stored on $C_{DATA1}$ is higher than the voltage level stored on $C_{REF1}$, then the resistive state stored within CELL11 is determined to be first logic value (for example, a logic "1" or a SET condition). Conversely, if the voltage level stored on $C_{DATA1}$ is lover than the voltage level stored on $C_{REF1}$, then the resistive stated sored within CELL11 is determined to be a second logic value (for example, a logic "0" or a RESET condition).

By comparing the electrical response of a selected array cell to either a fixed voltage reference or to that of a reference element located within the same array (or circuit) and under the same conditions, the value stored within the selected cell can be, in certain applications, determined (that is, READ) faster and more accurately using lower voltage and current READ stimuli as compared with a READ method that would require comparing an electrical response within a selected array cell to some preselected or expected value. This reference comparison step (process step 710a/710b in FIGS. 7A and 7B) is illustrated further within the waveform diagrams of FIGS. 10A-10B and 11A-11B and described in greater detail below.

Referring now to FIG. 10A, a series of waveform diagrams detail an exemplary READ operation 1001 on CELL11 of FIG. 6A according to the methods of the present disclosure as described in FIG. 7A. Within the exemplary READ operation 1001 of FIG. 10A, SW11 is assumed to have been previously programmed into a relatively low resistive state, corresponding to a logic "1" or a SET condition.

At time index $t_0$, the array lines (that is, all bit line and words line) are initialized to ground (0V), which corresponds to process step 701a in FIG. 7A. Accordingly, the waveforms for WL[1] and $V_{BL1}$ are both shown to be at 0V. RD_DATA1 is also held low at $t_0$, disabling $Q_{D1}$ (shown in FIGS. 6A, 8A, and 8B). The waveform for $V_{DATA1}$ is also at ground (0V). The waveform for $V_{REF}$ is shown at a fixed voltage and remains so for the entirety of the READ operation. As previously discussed, the voltage level for $V_{REF}$ is selected to be between the $V_{BL}$ voltage expected for a nominal SET condition and a nominal RESET condition. Finally, the D1 waveform shows a high impedance state, indicative of the comparator element (U1 in FIGS. 6A, 8A and 8B) being disabled. This is done within the exemplary READ operation of FIG. 10A to reinforce that the READ operation will not produce a valid data result until time index $t_3$, which corresponds to process step 710a in FIG. 7A.

At time index $t_1$ (which corresponds to process steps 702a and 703a in FIG. 7A), the bit lines in the array are driven to high impedance and connected to the measurement and storage elements. Also at time index $t_1$, WL[1], the selected word line for this exemplary READ operation, is driven to the required READ voltage ($V_{RD}$ in FIGS. 8A and 8B). The unselected word lines within the array, not displayed in FIG. 10A for the sake of clarity, remain held at ground (0V). Corresponding to this, within the waveform diagrams of FIG. 10A, at time index $t_1$ WL[1] begins to charge up to the driven READ voltage, and $V_{BL1}$ also charges (tracking WL[1]) to a voltage indicative of the resistance value stored within SW11 (as discussed in detail with respect to FIG. 8B above). Also at time index $t_1$, RD_DATA1 is driven high, enabling $Q_{D1}$ (as shown in FIGS. 6A, 8A, and 8B) and allowing node $V_{DATA1}$ to track along with the $V_{BL1}$ voltage. And D1 remains in a high impedance state, with U1 (as shown in FIGS. 6A, 8A, and 8B) still disabled.

By time index $t_2$ (which corresponds to process step 704a in FIG. 7A), $V_{BL1}$ has had sufficient time to fully charge up to a voltage level indicative of the resistance value stored in SW11, and this voltage is provided through node $V_{DATA1}$ (electrically connected to BL[1] through $Q_{D1}$, as shown in FIG. 8B) to the first input of comparator element U1 (again, as shown in FIG. 8B). The comparator element U1 (as shown in FIG. 8B) is imagined to be enabled at time index $t_2$, and, as such, D1 transitions to indicate a high voltage level (a logic "1"), with $V_{DATA1}$ (the voltage applied to the first input of comparator element U1) being higher than $V_{REF}$ (the voltage applied to the second input of comparator element U1). By time index $t_3$ (which corresponds to process step 710a in FIG. 7A) this result is ready to be outputted from the array to an external control circuit (such as, but not limited to, a microprocessor, microcontroller, or FGPA). By time index $t_4$, the word lines and bit lines are returned to ground (0V), RD_DATA1 is driven low again, comparator element U1 is disabled, and the READ operation is complete. It should be noted that in certain applications of this READ method of the present disclosure (as described in FIG. 7A), $Q_{D1}$ and the corresponding RD_DATA1 signal may not be needed. Indeed, in such an application the first input of comparator element U1 could be connected directly to BL[1], and the reference voltage transitioned to $V_{REF}$ at approximately the same time as bit line BL[1] charges to the resulting $V_{BL}$ voltage.

The As discussed previously, the line capacitance of the BL[1] (represented in FIG. 8B by $C_{BL1}$) may, in certain applications, limit how quickly $V_{BL1}$ can charge to its full voltage. It should also be noted that, in certain applications, the line capacitance on WL[1] can also be a factor in this charging time. Also, depending on the type and implementation of the measurement and storage element used, additional time may be required for the voltage on $V_{BL1}$ to be measured and/or stored once $V_{BL1}$ has reached its full voltage. The waveforms of FIG. 10A have been rendered to illustrate these possible timing requirements (as indicated by the ramp up curves on WL[1], $V_{BL1}$, and $V_{DATA1}$ between time indexes $t_1$ and $t_2$) to better illustrate the methods of the present disclosure. However, these exemplary RC timing delays and transient AC characteristics should not be seen as limiting to the methods of the present disclosure. Further, the design and architecture of a resistive change element array may be selected, in certain applications, to limit or otherwise control the electrical characteristics responsible for these timing requirements in order to better execute the methods of the present disclosure.

Referring now to FIG. 10B, a series of waveform diagrams detail another exemplary READ operation 1002 on CELL11 of FIG. 6A according to the methods of the present disclosure as described in FIG. 7A. Within the exemplary READ operation 1002 of FIG. 10B, SW11 is assumed to have been previously programmed into a relatively high resistive state, corresponding to a logic "0" or a RESET condition. This second exemplary READ operation 1002 is essentially identical to the first READ operation 1001 detailed in FIG. 10A with the exception that it will READ out a logic "0" instead of a logic "1."

As explained in more detail within the discussion of FIG. 10A above, within the second exemplary READ operation 1002 detailed in FIG. 10B at time index to (which corresponds to process step 701a in FIG. 7A) all of the array lines are initialized to ground (0V). At time index $t_1$ (which corresponds to process steps 702a and 703a in FIG. 7A), all of the bit lines within the array are floated and connected to measurement and storage elements, the selected word line (WL[1]) is driven to the READ voltage, and RD_DATA1 is enabled (enabling $Q_{D1}$, and connected node $V_{DATA1}$ to BL[1], as shown in FIG. 8B). By time index $t_2$ (which corresponds to process step 704a in FIG. 7A), the voltage level on $V_{BL1}$ (which is indicative of the resistive state stored in SW11) has had time to sufficiently charge and the comparator element U1 can be enabled. As described in more detail with respect to FIG. 10A, as the voltage on $V_{DATA1}$ is lower than $V_{REF}$, D1 drives low, indicating that SW11 is in a RESET condition (or is programmed with logic "0").

At time index $t_3$ (which corresponds to process step 710a in FIG. 7A) this data output (the logic "0" value shown on the waveform for D1) is ready to be outputted from the array to an external control circuit (such as, but not limited to, a microprocessor, microcontroller, or FGPA). By time index $t_4$, the word lines and bit lines are returned to ground (0V), RD_DATA1 is driven low again, comparator element U1 is disabled, and the READ operation is complete.

Referring now to FIG. 11A, a series of waveform diagrams detail an exemplary READ operation 1101 on CELL11 of FIG. 6B according to the methods of the present disclosure as described in FIG. 7B. Within the exemplary READ operation 1101 of FIG. 11A, SW11 is assumed to have been previously programmed into a relatively low resistive state, corresponding to a logic "1" or a SET condition.

At time index $t_0$, the array lines (that is all bit line and words line, including the reference word line) are initialized to ground (0V), which corresponds to process step 701b in FIG. 7B. Accordingly, the waveforms for WL[1], WL_REF, and $V_{BL1}$ are all shown to be at 0V. RD_DATA1 and RD_REF1 are also held low at $t_0$, disabling $Q_{D1}$ and $Q_{REF1}$ (shown in FIGS. 6B and 9A-9D). The waveforms for $C_{DATA1}$ and $C_{REF1}$ are also at ground (0V), indicating that those storage capacitors are discharged prior to the start of the READ operation. Finally, the D1 waveform shows a high impedance state, indicative of the comparator element (U1 in FIGS. 6B and 9A-9D) being disabled. This is done within the exemplary READ operation of FIG. 11A to reinforce that the READ operation will not produce a valid data result until time index $t_6$, which corresponds to process step 710b in FIG. 7.

At time index $t_1$ (which corresponds to process steps 702b and 703b in FIG. 7B), the bit lines in the array are driven to high impedance and connected to the measurement and storage elements. Also at time index $t_1$, WL[1], the selected word line for this exemplary READ operation, is driven to the required READ voltage ($V_{RD}$ in FIGS. 9A-9D). WL_REF (as well as the other unselected word lines within the array, not displayed in FIG. 11A for the sake of clarity) remain held at ground (0V). Corresponding to this, within the waveform diagrams of FIG. 11A, at time index $t_1$ WL[1] begins to charge up to the driven READ voltage, and $V_{BL1}$ also charges (tracking WL[1]) to a voltage indicative of the resistance value stored within SW11 (as discussed in detail with respect to FIG. 9B above). WL_REF remains at ground (0V). RD_DATA1 is driven high, enabling $Q_{D1}$ (as shown in FIGS. 6B, 9A-9D) and allowing $C_{DATA1}$ to charge up to the $V_{BL1}$ voltage. RD_REF1 remains held low, keeping $Q_{REF1}$ (as shown in FIGS. 6B and 9A-9D) disabled and $C_{REF1}$ electrically isolated from $V_{BL1}$. As such, the waveform for $C_{REF1}$ remains at 0V. And D1 remains in a high impedance state, with U1 (as shown in FIGS. 6 and 9A-9D) still disabled.

By time index $t_2$ (which corresponds to process step 704b in FIG. 7B), $V_{BL1}$ and $C_{DATA1}$ have had sufficient time to fully charge up to a voltage level indicative of the resistance value stored in SW11, and RD_DATA1 is driven back low, electrically isolating $C_{DATA1}$ from BL[1] (as shown in FIGS. 6B and 9A-9D). As indicated within the waveform diagrams of FIG. 11A, the voltage level of $V_{BL1}$ at this point in the READ operation (time index $t_2$) is retained on $C_{DATA1}$ for the remainder of the READ operation. As discussed previously, the line capacitance of the BL[1] (represented in FIGS. 9B and 9D by $C_{BL1}$) may, in certain applications, limit how quickly $V_{BL1}$ can charge to its full voltage. It should also be noted that, in certain applications, the line capacitance on WL[1] can also be a factor in this charging time. Also, depending on the type and implementation of the measurement and storage element used, additional time may be required for the voltage on $V_{BL1}$ to be measured and/or stored once $V_{BL1}$ has reached its full voltage.

For example, using the exemplary measurement and storage elements shown within the exemplary array structure of FIG. 6B (and subsequently shown in FIGS. 9A-9D), the storage capacitor $C_{DATA1}$ may take additional time to charge up to the full $V_{BL1}$ voltage. The waveforms of FIG. 11A have been rendered to illustrate these possible timing requirements (as indicated by the ramp up curves on WL1, $V_{BL1}$, and $C_{DATA1}$ between time indexes $t_1$ and $t_2$) to better illustrate the methods of the present disclosure. However, these exemplary RC timing delays and transient AC characteristics should not be seen as limiting to the methods of the present disclosure. Further, the design and architecture of a resistive change element array may be selected, in certain applications, to limit or otherwise control the electrical characteristics responsible for these timing requirements in order to better execute the methods of the present disclosure.

At time index $t_3$ (which corresponds to process step 705b in FIG. 7B), the bit lines and word lines in the array (including the reference word line) are reinitialized back to ground (0V). Accordingly, the waveforms for WL[1], WL_REF, and $V_{BL1}$ are all shown to return back to 0V. At time index $t_4$ (which corresponds to process steps 706b and 707b in FIG. 7B), the bit lines in the array are again driven to high impedance and connected to the measurement and storage elements. Also at time index $t_4$, WL_REF, the reference word line, is driven to the required READ voltage ($V_{RD}$ in FIGS. 6B and 9A-9D). WL[1] (as well as all the other word lines within the array, not displayed in FIG. 11A for the sake of clarity) remains held at ground (0V). Corresponding to this, within the waveform diagrams of FIG. 11A, at time index $t_4$ WL_REF begins to charge up to the driven READ voltage, and $V_{BL1}$ also charges (tracking WL_REF) to a voltage indicative of the resistance value of the reference resistive element $R_{REF1}$ (as discussed in detail with respect to FIG. 9D above). WL[1] remains at ground (0V). RD_REF1 is driven high, enabling $Q_{REF1}$ (as shown in FIGS. 6B and 9A-9D) and allowing $C_{REF1}$ to charge up to the $V_{BL1}$ voltage. RD_DATA1 remains held low, keeping $Q_{DATA1}$ (as shown in FIGS. 6B and 9A-9D) disabled and $C_{DATA1}$ electrically isolated from $V_{BL1}$. As such, $C_{DATA1}$ remains undisturbed and continues to retain the voltage measured at time index $t_2$ (which will be used at time index $t_6$ to determine the resistive state stored within the selected cell, CELL11). And D1 remains in a high impedance state, with U1 (as shown in FIGS. 6B, 9A-9D) still disabled.

By time index $t_5$ (which corresponds to process step 708b in FIG. 7B), $V_{BL1}$ and $C_{REF1}$ have had sufficient time to fully charge up to a voltage level indicative of the resistance value of $R_{REF1}$, and RD_REF1 is driven back low, electrically isolating $C_{REF1}$ from BL[1] (as shown in FIGS. 6B and 9A-9D). As indicated within the waveform diagrams of FIG. 11A, the voltage level of $V_{BL1}$ at this point in the READ operation (time index $t_5$) is retained on $C_{REF1}$ for the remainder of the READ operation. Again, as discussed with respect to time index $t_2$, array line capacitance, transient AC characteristics of the array, and features of the measurement and storage elements used within the READ operation may affect the time required to fully charge BL[1] and $C_{REF1}$. As such, the waveforms of FIG. 11A have again been rendered to illustrate these possible timing requirements within the array (as indicated by the ramp up curves on WL_REF, $V_{BL1}$, and $C_{REF1}$ between time indexes $t_4$ and $t_5$) to better illustrate the methods of the present disclosure. As before, these exemplary RC timing delays and transient AC characteristics should not be seen as limiting to the methods of the present disclosure.

At time index $t_6$ (which corresponds to process step 710b in FIG. 7B) the voltages stored on $C_{DATA1}$ and $C_{REF1}$ are compared to determine the resistive state stored within SW11 and complete the READ operation. Within the exemplary operation detailed by the waveforms of FIG. 11A, the comparator element (U1 in FIGS. 6B and 9A-9D) is enabled. As the voltage on $C_{DATA1}$ is higher than the voltage stored on $C_{REF1}$, D1 drives high, indicating that SW11 is in a SET condition (or a programmed with logic "1"). At time index $t_7$, this data output is ready to be outputted from the array to an external control circuit (such as, but not limited to, a microprocessor, microcontroller, or FGPA), and the READ operation is complete.

Referring now to FIG. 11B, a series of waveform diagrams detail another exemplary READ operation 1102 on CELL11 of FIG. 6B according to the methods of the present disclosure as described in FIG. 7B. Within the exemplary READ operation 1102 of FIG. 11B, SW11 is assumed to have been previously programmed into a relatively high resistive state, corresponding to a logic "0" or a RESET condition. This exemplary READ operation 1102 is essentially identical to the READ operation 1101 detailed in FIG. 11A with the exception that it will READ out a logic "0" instead of a logic "1."

As explained in more detail within the discussion of FIG. 11A above, within the second exemplary READ operation 1102 detailed in FIG. 10B at time index to (which corresponds to process step 701b in FIG. 7B) all of the array lines are initialized to ground (0V). At time index $t_1$ (which corresponds to process steps 702b and 703b in FIG. 7B), all of the bit lines within the array are floated and connected to measurement and storage elements, and the selected word line (WL[1]) is driven to the READ voltage. At time index $t_2$ (which corresponds to process step 704b in FIG. 7B), RD_DATA1 is enabled, and the voltage level on $V_{BL1}$ (which is indicative of the resistive state stored in SW11) is stored on $C_{DATA1}$. At time index $t_3$ (which corresponds to process step 705b in FIG. 7B) all the array lines are reinitialized to ground (0V). At time index $t_4$ (which corresponds to process steps 706b and 707b in FIG. 7B), all of the bit lines within the array are again floated, all of the word lines within the array are pulled to ground (0V), and the reference word line (WL_REF) is driven to the READ voltage. At time index $t_5$ (which corresponds to process step 708b in FIG. 7B), RD_REF1 is enabled and the voltage level on $V_{BL1}$ (which is indicative of the resistive value of $R_{REF1}$) is stored on $C_{REF1}$.

At time index $t_6$ (which corresponds to process step 710 in FIG. 7B) the voltages stored on $C_{DATA1}$ and $C_{REF1}$ are compared to determine the resistive state stored within SW11 and complete the READ operation. Within the exemplary READ operation detailed by the waveforms of FIG. 11B, the comparator element (U1 in FIGS. 6, 8A, 8B, 9A, and 9B) is enabled. As the voltage on $C_{DATA1}$ is lower than the voltage stored on $C_{REF1}$, D1 drives low, indicating that SW11 is in a RESET condition (or is programmed with logic "0"). At time index $t_7$, this data output is ready to be outputted from the array to an external control circuit (such as, but not limited to, a microprocessor, microcontroller, or FGPA), and the READ operation is complete.

It should be noted that while FIGS. 10A-10B and 11A-10B depict series of waveforms performing exemplary READ operations on a single array cell on a single bit line within a resistive change element array, the methods of the present disclosure are not limited in this regard. Indeed, the waveforms of FIGS. 10A-10B and 11A-11B are intended to be illustrative of the electrical response on an exemplary single bit line during a multi-cell READ operation. Within certain applications, every bit line within an array could be READ simultaneously, each bit line responsive to a series of waveforms analogous to those shown in FIGS. 10A-10B and 11A-11B. In this way, the READ method of the present disclosure can be used to rapidly and efficiently output large amounts of data from a resistive change element array. The READ methods of the present disclosure, as detailed in FIGS. 7A and 7B and discussed and demonstrated with respect to FIGS. 8A-8B, 9A-9D, 10A-10B, and 11A-11B, are well suited for performing a READ operation on a single cell within an array, on a subset of cells within an array simultaneously, or on every cell on a selected word line simultaneously as befits the requirements of a specific application.

Figure 12A:
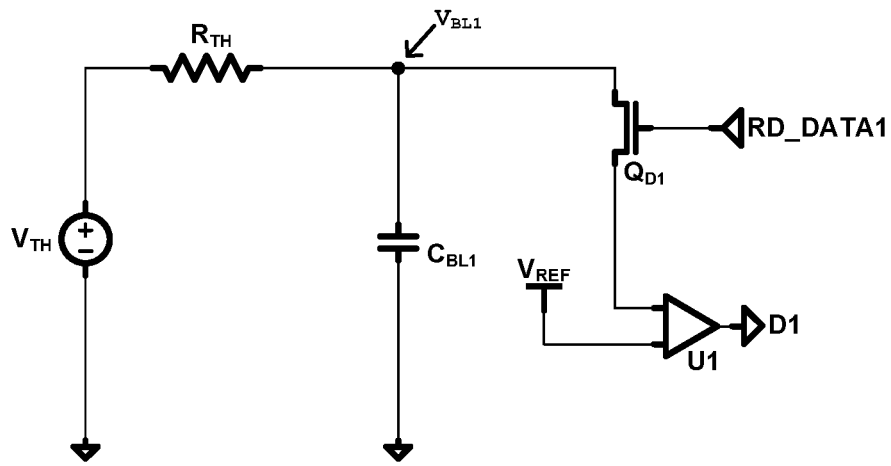
FIG. 12A is a Thevenin equivalent circuit model for the reduced schematic diagram shown in FIG. 8B and is used with the discussions of the exemplary READ operations detailed in FIGS. 14A-14C and 15A-15D.
Figure 12B:
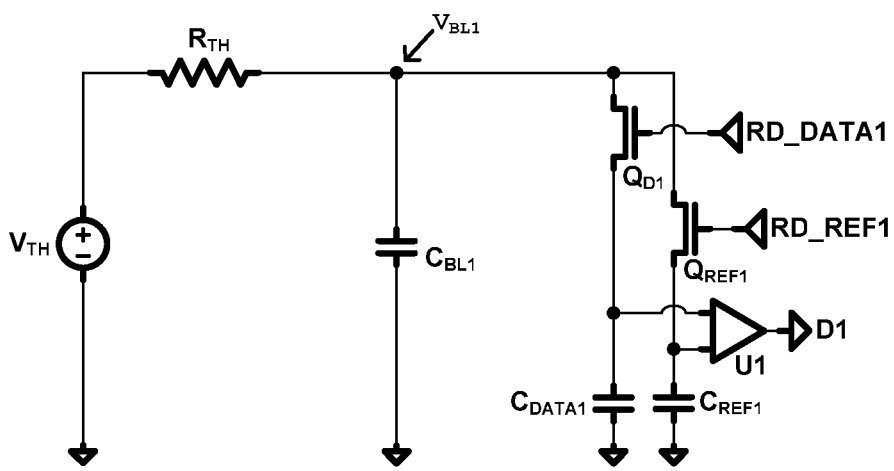
FIG. 12B is a Thevenin equivalent circuit model for the reduced schematic diagrams shown in FIGS. 9B and 9D and is used with the discussions of the exemplary READ operations detailed in FIGS. 14A-14C and 15A-15D.

FIGS. 12A and 12B are Thevenin equivalent circuits (1201 and 1202, respectively) for the reduced schematics of FIG. 8B (FIG. 12A) and FIGS. 9B and 9D (FIG. 12B). These Thevenin equivalent circuits will be referenced within the discussion of the exemplary 1-R resistive change element array configurations and READ operation examples detailed in FIGS. 14 and 15A-15C. These array configurations and READ operation examples are presented in order to illustrate voltage and timing requirements for READ operation performed according to the methods of the present disclosure as detailed in FIGS. 7A and 7B. As previously discussed with respect to FIGS. 8B, 9B, and 9D, within both FIGS. 12A and 12B, $V_{TH}$ is given by:

$$V_{TH} = V_{BL1} = V_{RD} * (R_{UNSEL})/(R_{SEL} + R_{UNSEL}) \quad [EQ\ 9]$$

And $R_{TH}$ is given by:

$$1/R_{TH} = 1/R_{SEL} + 1/R_{UNSEL}$$

$$R_{TH} = (R_{SEL} * R_{UNSEL})/(R_{SEL} + R_{UNSEL}) \quad [EQ\ 10]$$

Specifically looking to FIG. 12A and referring back to schematic 802 of FIG. 8B, $R_{UNSEL}$ is the parallel combination of the effective resistance of the unselected cells on the selected bit line (essentially, $R_{EQ}/(n-1)$, as described previously), and $R_{SEL}$ is the resistance of the selected cell. With respect to FIG. 12B, when used to represent the schematic of FIG. 9B, $R_{UNSEL}$ is the parallel combination of the effective resistance of the unselected cells on the selected bit line (again, essentially, $R_{EQ}/(n-1)$ as discussed above) in further combination the reference resistance element on the selected bit line, and $R_{SEL}$ is the resistance of the selected cell. And when used to represent the schematic of FIG. 9D, $R_{UNSEL}$ is the parallel combination of the effective resistance of all the cells on the selected bit line (both the unselected cells and the selected cell), and $R_{SEL}$ is the resistance of the reference resistive element. These equations and calculations will be used and described in more detail within the discussions of FIGS. 14 and 15A-15C below.

FIGS. 14 and 15A-15C are tables detailing resulting minimum READ voltages from several exemplary READ operations performed on specific exemplary resistive change element array configurations. Specially, the resistive change element arrays used to produce the $V_{BL}$ voltages for FIGS. 14 and 15A-15C use two-terminal nanotube switching devices as described in U.S. Pat. No. 7,781,862 to Bertin et al. (incorporated herein by reference in its entirety). Two terminal nanotube switching devices in a cross point array configuration are illustrated in U.S. Pat. No. 7,835,170 to Bertin et al. (incorporated herein by reference in its entirety). These two terminal nanotube switching devices have a vertical orientation. Two-terminal nanotube switching devices as well as 1-R arrays of such devices are further described in U.S. Patent Publication No. 2014 0166959 to Bertin et al. (incorporated herein by reference in its entirety). US 2014 0166959 also describes examples of two-terminal nanotube switching elements that exhibit a non-linear resistive response. Within certain applications, the selective use of non-linear and linear resistive change elements within a 1-R array of resistive change elements can be a key design parameter with respect to the application of the READ methods of the present disclosure (as described in FIGS. 6A and 6B). To illustrate this, the exemplary resistive change element configurations detailed in FIGS. 14 and 15A-15C include linear resistive change elements, non-linear change elements, and "2×" non-linear change elements (that is, resistive change elements with twice the "non-linearity" of previously discussed devices). The non-linearity of a resistive change element is explained further with respect to FIG. 13.

Figure 13:
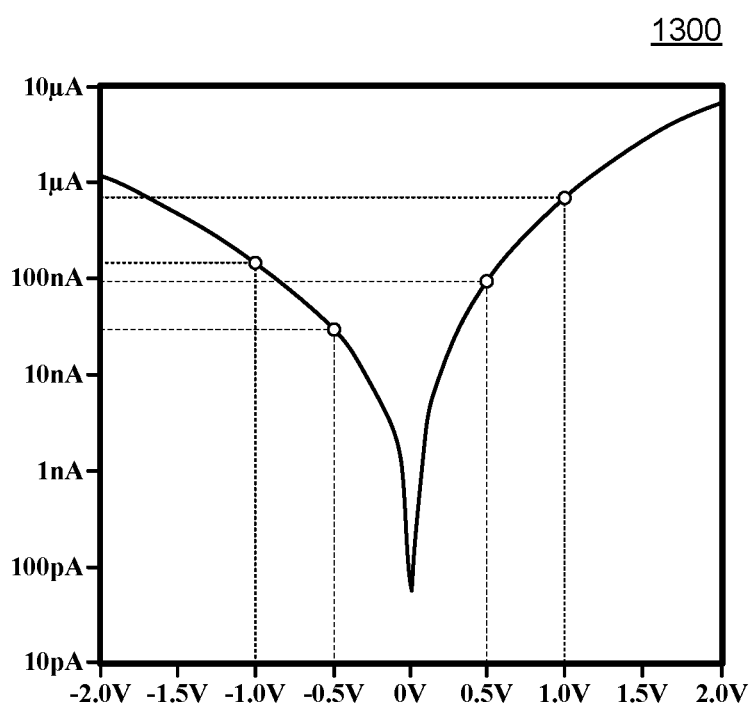
FIG. 13 is a current/voltage plot illustrating an IV curve for a non-linear resistive change element that will be used within the exemplary read operations detailed in FIGS. 14A-14C and 15A-15D.

FIG. 13 is a semi-log plot 1300 of an I-V sweep of an exemplary non-linear resistive change element. As shown in the plot 1300, in response to an applied voltage of 0.5V, the exemplary non-linear resistive change element permits a current on the order of 100 nA, corresponding to an effective resistance on the order of 5 MΩ. However, at a voltage of 1.0V, the exemplary non-linear resistive change element permits a current on the order of 1 μA, corresponding to an effective resistance on the order of 1 MΩ. Similarly, in response to an applied voltage of −0.5V, the exemplary non-linear resistive change element permits a current on the order of 30 nA, corresponding to an effective resistance on the order of 16 MΩ. And at a voltage of −1.0V, the exemplary non-linear resistive change element permits a current on the order of 200 nA, corresponding to an effective resistance on the order of 5 MΩ. That is, for a non-linear resistive change element (such as will be used in the exemplary READ operations detailed in FIGS. 14 and 15A-15C), as the voltage driven across the element is reduced, the effective resistance of that element is increased. For example, as seen in I-V plot 1300, reducing the voltage across a non-linear resistive change element from 1.0V to 0.5V increases the effective resistance of the element by a factor of five. And reducing the voltage across the same non-linear resistive change element from −1.0V to −0.5V increases the effective resistance of the element by a factor of three. For purposes of calculating the effects of CNT switch resistance non-linearity on cross point array READ performance, the measured CNT switch nonlinearity illustrated by plot 1300 shown in FIG. 13 is used as a first CNT switch example. A READ voltage ($V_{RD}$) of 1V and a CNT switch resistance nonlinearity of 3× are used based on plot 1300. The bit line voltage ($V_{BL}$) signal to a comparator element input is calculated as described further below. Also, as a second CNT switch resistance nonlinearity example, READ voltage with $V_{RD}$ of 1V and a nonlinearity of 6× is used, assuming a CNT switch resistance nonlinearity 2× greater than assumed in the first example, to calculate the bit line voltage $V_{BL}$ to a comparator element input as described further below. As will be shown within the discussions of FIGS. 14 and 15A-15C, such a non-linear resistive response within a resistive change element can be used effectively, within certain applications, with the READ methods of the present disclosure (as described in FIGS. 7A and 7B).

FIG. 14 is a table 1400 summarizing the smallest READ signals possible for a number of exemplary 1-R resistive change element array configurations when applying the READ methods of the present disclosure as described in FIGS. 7A and 7B. As will be explained in detail below, each of these smallest READ signal values correspond to the smallest signal (for both a SET or RESET condition) that would be seen by a measurement and storage element (as described with respect to FIGS. 6A and 6B) for a given array configuration (each row of the table) with a given number of cells per bit line (each column of the table). By examining these minimum READ voltage values as the number of cells per bit line is increased, the effectiveness of the READ methods of present disclosure (as shown in FIGS. 7A and 7B) for different exemplary array configurations can be examined.

The exemplary READ operations summarized in FIG. 14 are intended to illustrate both the fixed reference voltage READ method (as described in FIG. 7A) and the reference resistive element READ method (as described in FIG. 7B) performed on 1-R arrays of linear resistive change elements and non-linear resistive change elements. To this end, the first row 1401 details an array configuration with linear resistive change elements and using a fixed voltage reference (as shown in FIG. 6A), and the second row 1402 details an array configuration with linear resistive change elements and using an array reference line with resistive reference elements (as shown in FIG. 6B). The third row 1403 details an array configuration with non-linear resistive change elements and using a fixed voltage reference (as shown in FIG. 6A), and the fourth row 1404 details an array configuration with non-linear resistive change elements using an array an array reference line with resistive reference elements (as shown in FIG. 6B). And the fifth row 1405 details an array configuration with 2× non-linear resistive change elements using an array an array reference line with resistive reference elements (as shown in FIG. 6B).

As explained above with respect to FIG. 13, the nonlinearity of the resistive change elements within the exemplary array configurations of rows 1403 and 1404 is imagined to increase the effective resistance of a resistive change element by a factor of 3× under relatively small voltages. Similarly, the non-linearity of the resistive change elements with the configuration array configuration of row 1405 is imagined to increase the effective resistance of a resistive change element by a factor of 6× under relatively small voltages. The linear resistive change elements of the exemplary array configurations of rows 1401 and 1402 are imagined to exhibit the same effective resistance regardless of the voltage levels applied.

Within the exemplary array configurations of FIG. 14, the exemplary 1-R arrays are imagined to be comprised of resistive change elements that can be adjusted between two non-volatile resistive states: a RESET state with a nominal high resistance value $R_H$=20 MΩ, and a SET state with a nominal low resistance value $R_L$=1 MΩ. The applied READ voltage ($V_{RD}$ in FIGS. 7A, 7B, 8A, 8B, and 9A-9D) is imagined to be 1V. For the exemplary array configurations of rows 1402, 1404, and 1404 (which use an array reference line and reference resistive elements, as shown in FIGS. 6B and 9A-9D), the resistive reference elements are imagined to $R_{REF}$=2 MΩ. As will be discussed in more detail below with respect to FIG. 15A, for the exemplary array configuration of row 1403 (which uses a fixed array reference voltage, as shown in FIGS. 6A and 8A-8B), the value of the reference voltage ($V_{REF}$) is selected based on the needs of a specific configuration. Minimum possible READ signal values for each exemplary array configuration (1401-1405) are shown for several bit line configurations (16 cells per bit line through 1024 cells per bit line) in each of the columns of FIG. 14.

It should be noted that for the exemplary array configuration 1405 illustrated in FIG. 14, for a nominal RESET high resistance state $R_H$=2 MΩ, a nominal low resistance state of $R_L$=100 kΩ, and a reference resistance value $R_{REF}$=200 kΩ, essentially the same minimum READ signal values were calculated as shown in Table 1400, exemplary array configuration 1405. Thus is appears that maintaining the ratios $R_H/R_L$=20 and $R_{REF}/R_L$=2 at the same nonlinearity results in the same minimum READ voltages even though $R_H$, $R_L$, and $R_{REF}$ resistance values were reduced by a factor of 10. This result shows that array elements can be selected over a broad range of resistance values if nonlinearity and resistance ratios are maintained, resulting in flexibility in the design of 1-R arrays. For example, as described further below, when programming a low resistance SET state with a SET voltage of 2V, a low resistance state value of $R_L$=1 MΩ results in a maximum SET current of 2 uA. However, if the low resistance state value is $R_L$=100 kΩ instead, then the maximum SET current is 20 uA, a value ten times greater.

It should be noted that the specific 1-R array configurations and the resistive change elements used within those arrays are intended as non-limiting examples only. As previously discussed, the READ methods of the present disclosure are well suited for use with a plurality of 1-R array configurations and types and implementations of resistive change elements. As such, the READ methods of the present disclosure should not be limited to the examples detailed within FIGS. 14 and 15A-15C.

Within FIG. 14 (as well as FIGS. 15A-15C, discussed further below), the smallest READ signal values for each exemplary array configuration are calculated using the simplified schematic of FIG. 8B and EQ. 4 (for rows 1401 and 1403) and the simplified schematics of FIGS. 9B and 9D and EQ. 6 and EQ. 8 (for the exemplary arrays of rows 1402, 1404, and 1405) as described above.

Looking to row 1401 of FIG. 14, the smallest READ signals resulting from a READ operation according to the methods of the present disclosure performed on an array of linear resistive change elements using a fixed voltage reference (along with the parameters described above) are listed. As described above, these values are calculated using EQ. 4 as described with respect to FIG. 8B above. Within the exemplary array configurations of row 1401, the resistive change elements are imagined to be linear—that is, the effective resistance of the unselected resistive change elements is assumed to remain constant regardless of the voltage applied. As such, the highest possible value for $R_{EQ}$ (the effective resistance of the unselected cells on the selected bit line) is the nominal RESET resistance (essentially, as if all of the unselected cells on the selected bit line were in a RESET state $R_H$). And the lowest possible value for $R_{EQ}$ is the nominal SET resistance (essentially, as if all of the unselected cells on the selected bit line were in a RESET state $R_L$). As such, the actual value for $R_{EQ}$ for any READ operation will fall between these two limits. And, plugging into EQ 4 (as discussed above), the possible $V_{BL}$ range limits can be found as a function of "n," the number of cells on a bit line.

Thus, the maximum $V_{BL}$ value for the array configurations of row 1401 when the selected cell is in a RESET condition (that is, $R_{SEL}$=20 MΩ) is given by assuming $R_{EQ}$=20 MΩ (the nominal RESET value):

$$V_{BL}=(20\ \text{M}\Omega/(n-1))/(20\ \text{M}\Omega+(20\ \text{M}\Omega/(n-1))) \quad [\text{EQ 11}]$$

And the minimum $V_{BL}$ value for the array configurations of row 1401 when the selected cell is in a RESET condition (that is, $R_{SEL}$=20 MΩ) is given by assuming $R_{EQ}$=1 MΩ (the nominal SET value):

$$V_{BL}=(1\ \text{M}\Omega/(n-1))/(20\ \text{M}\Omega+(1\ \text{M}\Omega/(n-1))) \quad [\text{EQ 12}]$$

Similarly, the maximum $V_{BL}$ value for the array configurations of FIG. 14A when the selected cell is in a SET condition (that is, $R_{SEL}$=1 MΩ) is given by assuming $R_{EQ}$=20 MΩ (the nominal RESET value):

$$V_{BL}=(20\ \text{M}\Omega/(n-1))/(1\ \text{M}\Omega+(20\ \text{M}\Omega/(n-1))) \quad [\text{EQ 13}]$$

And the minimum $V_{BL}$ value for the array configurations of FIG. 14A when the selected cell is in a SET condition (that is, $R_{SEL}$=1 MΩ) is given by assuming $R_{EQ}$=1 MΩ (the nominal SET value):

$$V_{BL}=(1\ \text{M}\Omega/(n-1))/(1\ \text{M}\Omega+(1\ \text{M}\Omega/(n-1))) \quad [\text{EQ 14}]$$

By comparing EQ 14 and EQ 11, the margin between a SET and RESET read operation—that is, the difference between the lowest $V_{BL}$ value possible when reading a selected cell in a SET condition (EQ. 14) and the highest $V_{BL}$ value possible when reading a selected cell in a RESET condition (EQ. 11)—can be calculated. Since EQ. 11 and EQ 14 result in the same $V_{BL}$ value for any value of n, the margin for this configuration (linear array cells using a fixed voltage reference and the READ method as described by FIG. 7A) is 0V for all values of n. As such, the smallest READ signal for the configuration of row 1401 is ±0V. Essentially, this result shows that using fixed voltage reference READ method of the present disclosure (as described in FIG. 7A) on arrays of linear elements (within the exemplary parameters defined above) could result in the possible inability to differentiate between a cell in a SET state and a cell in a RESET state within the extreme cases outlined above (i.e., all unselected cells either RESET or SET). As will be shown within the discussion of the exemplary array configuration of row 1403, this limitation can be improved with the use of non-linear resistive elements. Further, as will be shown within the discussion of the exemplary array configuration of row 1402, it will be shown that the reference resistive element READ method of the present disclosure (as detailed in FIG. 7B) can be used within similar 1-R array configurations to perform a READ operation on linear resistive change elements.

Looking to row 1403 of FIG. 14, the smallest READ signals resulting from a READ operation according to the methods of the present disclosure performed on an array of non-linear resistive change elements using a fixed voltage reference (along with the parameters described above) are listed. As described above, these values are calculated using EQ. 4 as described with respect to FIG. 8B above. Within the exemplary array configurations of row 1403, the resistive change elements are imagined to be non-linear, and the effective resistance of the unselected resistive change elements is assumed to increase by a factor of 3× for relatively small voltages (as shown in FIG. 13). That is, as $V_{BL}$ is expected to be significantly less than $V_{RD}$ for all READ operations, the voltage drop across the unselected resistive elements can be assumed to be significantly less that the voltage drop across the selected resistive change element.

As such, the lowest possible value for $R_{EQ}$ (the effective resistance of the unselected cells on the selected bit line) can be assumed to be significantly higher as compared with the linear resistive change element array case described with respect to the exemplary configurations of row 1401 of FIG. 14. That is, the comparatively lower $V_{BL}$ voltages across the unselected cells result in a significantly higher effective resistance value for those cells (again, as discussed with respect to FIG. 13 above). Thus, within the exemplary 1-R array configurations row 1403, it is assumed that the lowest possible value for $R_{EQ}$ is 3 MΩ, three times the nominal SET resistance value. And the highest possible value for $R_{EQ}$ remains 20 MΩ, the nominal RESET resistance value. As described within the discussion of row 1401, the actual value for $R_{EQ}$ for any READ operation performed with the array configurations of row 1403 will fall between these two limits. And, again plugging into EQ 4 (as discussed above), the possible $V_{BL}$ range limits can be found as a function of "n," the number of cells on a bit line.

Thus, the minimum $V_{BL}$ value for the array configurations of row 1403 when the selected cell is in a RESET condition (that is, $R_{SEL}$=20 MΩ) is given by assuming $R_{EQ}$=3 MΩ (three times the nominal SET value):

$$V_{BL}=(3\ \text{M}\Omega/(n-1))/(20\ \text{M}\Omega+(3\ \text{M}\Omega/(n-1))) \quad [\text{EQ 15}]$$

And the minimum $V_{BL}$ value for the array configurations of FIG. 14B when the selected cell is in a SET condition (that is, $R_{SEL}$=1 MΩ) is given by assuming $R_{EQ}$=3 MΩ (again, three times the nominal SET value):

$$V_{BL}=(3\ \text{M}\Omega/(n-1))/(3\ \text{M}\Omega+(1\ \text{M}\Omega/(n-1))) \quad [\text{EQ 16}]$$

And the maximum $V_{BL}$ values for the array configurations of row 1403 when the selected cell is in a RESET or SET condition remains unchanged from the conditions of row 1401 (with $R_{EQ}$ still set at 20 MΩ for those cases), and those values are still given by EQ 11 and EQ 13, respectively. By comparing EQ 16 and EQ 11, the margin between a SET and RESET read operation—that is, the difference between the lowest $V_{BL}$ value possible when reading a selected cell in a SET condition (EQ. 16) and the highest $V_{BL}$ value possible when reading a selected cell in a RESET condition (EQ. 11)—can be calculated. In this way, the smallest margin (or smallest delta voltage) between a SET state and a RESET state can be determined and used, for example, to select a value for the fixed voltage reference ($V_{REF}$ in FIGS. 6A, 8A, and 8B) used within the READ operation as well as the resolution and sensitivity of a measurement and storage element (as shown in FIGS. 6A and 8A, for example).

Looking now to FIG. 15A, a table 1501 listing these values for the array configurations of row 1403 of FIG. 14 is shown. For example, for such an exemplary configuration using 32 cells per bit line, the smallest margin between a SET and RESET read operation is calculated to be 57 mV, with a lowest possible $V_{BL}$ on a SET condition at 88 mV and a highest possible $V_{BL}$ on a RESET condition at 31 mV.

Within such parameters, for example, a fixed reference voltage ($V_{REF}$) could be supplied at 60 mV (as shown in table 1501), resulting in a smallest READ signal for a RESET cell to be −29 mV and a smallest READ signal for a SET cell to be +28 mV. As such, a measurement and storage element with an effective resolution of at ±20 mV would be well suited for use with the fixed voltage reference READ method of the present disclosure for the exemplary array configuration defined for row 1403 of FIG. 14. Using a similar analysis, for the 64 cell per bit line case a fixed reference voltage ($V_{REF}$) could be supplied at 30 mV and used with a measurement and storage element with a resolution of ±15 mV. And so on, for the other cases within table 1501, which correspond to the minimum READ signal values listed in row 1403 of FIG. 14.

Looking to rows 1402, 1404, and 1405 of FIG. 14, the smallest READ signals resulting from a READ operation using the reference resistive element method of the present disclosure (as detailed in FIG. 7B) on exemplary are configurations (as described above) are listed. As described above, these values are calculated using EQ. 6 and EQ 8 as described with respect to FIGS. 9B and 9D above to determine the expected $V_{BL}$ values (for fixed values of $R_{EQ}$) during both the "data" phase and "reference" phase of the reference resistive element READ method of the present disclosure (as detailed in FIG. 7B). Applying those array parameters to EQ 6 (as discussed above with respect to FIG. 9B), the expected $V_{BL}$ value during the "data" phase of a READ operation on a selected cell in a RESET condition is given by:

$$V_{BL}=R_{UNSEL}/(20\ M\Omega+R_{UNSEL}) \quad [EQ\ 17]$$

And the expected $V_{BL}$ value during the "data" phase of a READ operation on a selected cell in a SET condition is given by:

$$V_{BL}=R_{UNSEL}/(1\ M\Omega+R_{UNSEL}) \quad [EQ\ 18]$$

As discussed above with respect to FIG. 9B, for both EQ 17 and EQ 18, $R_{UNSEL}$ is given by:

$$R_{UNSEL}=(1/(2\ M\Omega)+(n-1)/R_{EQ})^{-1} \quad [EQ\ 19]$$

Similarly, by applying the above discussed exemplary array parameters to EQ 8 (as discussed above with respect to FIG. 9D), the expected $V_{BL}$ value during the "reference" phase of a READ operation on a selected cell in both a RESET and SET condition is given by:

$$V_{BL}=R_{UNSEL}/(2\ M\Omega+R_{UNSEL}) \quad [EQ\ 20]$$

Further, as discussed above with respect to FIG. 9D, during a "reference" phase of a READ operation on selected cell in a RESET condition, $R_{UNSEL}$ is given by:

$$R_{UNSEL}=(1/(20\ M\Omega)+(n-1)/R_{EQ})^{-1} \quad [EQ\ 21]$$

As the resistance of the selected cell ($R_{SW-SEL}$) is now a factor in determining $R_{UNSEL}$, the possible non-linear resistive response of the selected cell (within the configurations of rows 1404 and 1405, for example) must be accounted for. As such, during a "reference" phase of a READ operation on selected cell in a SET condition, $R_{UNSEL}$ is given by:

$$R_{UNSEL}=(1/(R_{SW-SEL})+(n-1)/R_{EQ})^{-1} \quad [EQ\ 22]$$

Wherein $R_{SW-SEL}$ would be 1 MΩ for a linear device, 3 MΩ for a non-linear device, and 6 MΩ for a 2× non-linear device (as described with respect to FIG. 13).

Looking back now to row 1402 of table 1400, the exemplary array configurations within that row are comprised of linear resistive change elements. That is, the effective resistance of the resistive change elements is assumed to remain constant regardless of the voltage applied. As such, the highest possible value for $R_{EQ}$ (the effective resistance of the unselected cells on the selected bit line) is the nominal RESET resistance (essentially, as if all of the unselected cells on the selected bit line were in a RESET state). And the lowest possible value for $R_{EQ}$ is the nominal SET resistance (essentially, as if all of the unselected cells on the selected bit line were in a RESET state). As such, the actual value for $R_{EQ}$ for any READ operation will fall between these two limits.

Thus, for the exemplary array configurations of row 1402, the smallest READ signal for reading a RESET condition would be calculated by using EQ. 17 and EQ. 19 with $R_{EQ}=1$ MΩ to determine the $V_{BL}$ during the data phase and then using EQ. 20 and EQ. 21 with $R_{EQ}=1$ MΩ to determine $V_{BL}$ during the reference phase. Subtracting these two values gives the smallest READ voltage possible when performing a READ operation on a cell in a RESET state (within the parameters of the exemplary array configuration of row 1402 of FIG. 14). Plugging in these values with a bit line configuration of 16 cells per bit line, for example, results in a smallest READ signal of −29 mV when reading a cell in a RESET condition, as is shown in row 1402 of FIG. 14. Similarly, using these values for a 32 cell per bit line configuration, results in a smallest READ signal of −14 mV (again, for a RESET condition).

Similarly, for the exemplary array configurations of row 1402, the smallest READ signal for reading a SET condition would be calculated by using EQ. 18 and EQ. 19 with $R_{EQ}=1$ MΩ to determine the $V_{BL}$ during the data phase and then using EQ. 20 and EQ. 22 with $R_{EQ}=1$ MΩ and $R_{SW-SEL}=1$ MΩ to determine $V_{BL}$ during the reference phase. Subtracting these two values gives the smallest READ voltage possible when performing a READ operation on a cell in a SET state (within the parameters of the exemplary array configuration of row 1402 of FIG. 14). Plugging in these values with a bit line configuration of 16 cells per bit line, for example, results in a smallest READ signal of 30 mV when reading a cell in a SET condition, as is shown in row 1402 of FIG. 14. Similarly, using these values for a 32 cell per bit line configuration, results in a smallest READ signal of 15 mV (again, for a SET condition).

As can be seen from these calculations, the READ methods of the present disclosure (as detailed by FIG. 7B) are well suited for use with a 1-R array of linear cells. As shown in FIG. 14, such an array could be reliably read with a configuration of 16 cells per bit line and measurement and storage element resolution of ±20 mV and with a configuration of 32 cells per bit line and a measurement and storage element resolution of ±10 mV.

Looking now to FIG. 15B, table 1502 has been populated with $V_{BL}$ values (for both data and reference phases) used to calculate the smallest READ signal values of row 1404 of FIG. 14 (an array of non-linear cells using an array reference line configuration). Similarly to the calculations discussed with respect to row 1402 above, the smallest READ signal for reading a RESET condition with the exemplary array configurations of row 1404 would be calculated by using EQ. 17 and EQ. 19 with $R_{EQ}=3$ MΩ to determine the $V_{BL}$ during the data phase and then using EQ. 20 and EQ. 21 with $R_{EQ}=3$ MΩ to determine $V_{BL}$ during the reference phase. The non-linearity of the resistive change elements within this configuration results in the increased effective resistance (as described above with respect to FIG. 13). Subtracting these two values gives the smallest READ voltage possible when performing a READ operation on a cell in a RESET state (within the parameters of the exemplary array configuration of row 1404 of FIG. 14). Plugging in these values with a bit line configuration of 64 cells per bit line, for example, results in a smallest READ signal of −21 mV when reading a cell in a RESET condition, as is shown in row 1404 of FIG. 14. Similarly, using these values for a 128 cell per bit line configuration, results in a smallest READ signal of −10 mV (again, for a RESET condition). The largest (maximum) READ signal values (as listed in FIG. 15B) can be calculated for a RESET READ condition using the same equation sets as discussed above while using $R_{EQ}=20$ MΩ.

Similarly, for the exemplary array configurations of row 1404, the smallest READ signal for reading a SET condition would be calculated by using EQ. 18 and EQ. 19 with $R_{EQ}=3$ MΩ to determine the $V_{BL}$ during the data phase and then using EQ. 20 and EQ. 22 with $R_{EQ}=3$ MΩ and $R_{SW\text{-}SEL}=3$ MΩ to determine $V_{BL}$ during the reference phase. Again, the non-linearity of the resistive change elements within this configuration results in the increased effective resistance (as described above with respect to FIG. 13). Subtracting these two values gives the smallest READ voltage possible when performing a READ operation on a cell in a SET state (within the parameters of the exemplary array configuration of row 1404 of FIG. 14). Plugging in these values with a bit line configuration of 64 cells per bit line, for example, results in a smallest READ signal of 21 mV when reading a cell in a SET condition, as is shown in row 1404 of FIG. 14. Similarly, using these values for a 128 cell per bit line configuration, results in a smallest READ signal of 11 mV (again, for a SET condition). The largest (maximum) READ signal values (as listed in FIG. 15B) can be calculated for a SET READ condition using the same equation sets as discussed above while using $R_{EQ}=20$ MΩ and $R_{SW\text{-}SEL}=3$ MΩ.

As can be seen from these calculations, the READ methods of the present disclosure (as detailed by FIG. 7B) are also well suited for use with a 1-R array of non-linear cells. As shown in FIG. 14, such an array could be reliably read with a configuration of 64 cells per bit line and measurement and storage element resolution of ±20 mV and with a configuration of 128 cells per bit line and a measurement and storage element resolution of ±10 mV.

Looking now to FIG. 15C, table 1503 has been populated with $V_{BL}$ values (for both data and reference phases) used to calculate the smallest READ signal values of row 1405 of FIG. 14 (an array of 2× non-linear cells using an array reference line configuration). Similarly to the calculations discussed with respect to rows 1402 and 1404 above, the smallest READ signal for reading a RESET condition with the exemplary array configurations of row 1405 would be calculated by using EQ. 17 and EQ. 19 with $R_{EQ}=6$ MΩ to determine the $V_{BL}$ during the data phase and then using EQ. 20 and EQ. 21 with $R_{EQ}=6$ MΩ to determine $V_{BL}$ during the reference phase. The non-linearity of the resistive change elements within this configuration results in the increased effective resistance (as described above with respect to FIG. 13). Subtracting these two values gives the smallest READ voltage possible when performing a READ operation on a cell in a RESET state (within the parameters of the exemplary array configuration of row 1405 of FIG. 14). Plugging in these values with a bit line configuration of 128 cells per bit line, for example, results in a smallest READ signal of −21 mV when reading a cell in a RESET condition, as is shown in row 1405 of FIG. 14. Similarly, using these values for a 256 cell per bit line configuration, results in a smallest READ signal of −10 mV (again, for a RESET condition). The largest (maximum) READ signal values (as listed in FIG. 15C) can be calculated for a RESET READ condition using the same equation sets as discussed above while using $R_{EQ}=20$ MΩ.

Similarly, for the exemplary array configurations of row 1405, the smallest READ signal for reading a SET condition would be calculated by using EQ. 18 and EQ. 19 with $R_{EQ}=6$ MΩ to determine the $V_{BL}$ during the data phase and then using EQ. 20 and EQ. 22 with $R_{EQ}=6$ MΩ and $R_{SW\text{-}SEL}=6$ MΩ to determine $V_{BL}$ during the reference phase. Again, the non-linearity of the resistive change elements within this configuration results in the increased effective resistance (as described above with respect to FIG. 13). Subtracting these two values gives the smallest READ voltage possible when performing a READ operation on a cell in a SET state (within the parameters of the exemplary array configuration of row 1405 of FIG. 14). Plugging in these values with a bit line configuration of 128 cells per bit line, for example, results in a smallest READ signal of 21 mV when reading a cell in a SET condition, as is shown in row 1405 of FIG. 14. Similarly, using these values for a 256 cell per bit line configuration, results in a smallest READ signal of 11 mV (again, for a SET condition). The largest (maximum) READ signal values (as listed in FIG. 15C) can be calculated for a SET READ condition using the same equation sets as discussed above while using $R_{EQ}=20$ MΩ and $R_{SW\text{-}SEL}=6$ MΩ.

As can be seen from these calculations, the READ methods of the present disclosure (as detailed by FIG. 7B) are also well suited for use with a 1-R array of 2× non-linear cells. As shown in FIG. 14, such an array could be reliably read with a configuration of 128 cells per bit line and measurement and storage element resolution of ±20 mV and with a configuration of 256 cells per bit line and a measurement and storage element resolution of ±10 mV.

Figure 16A:
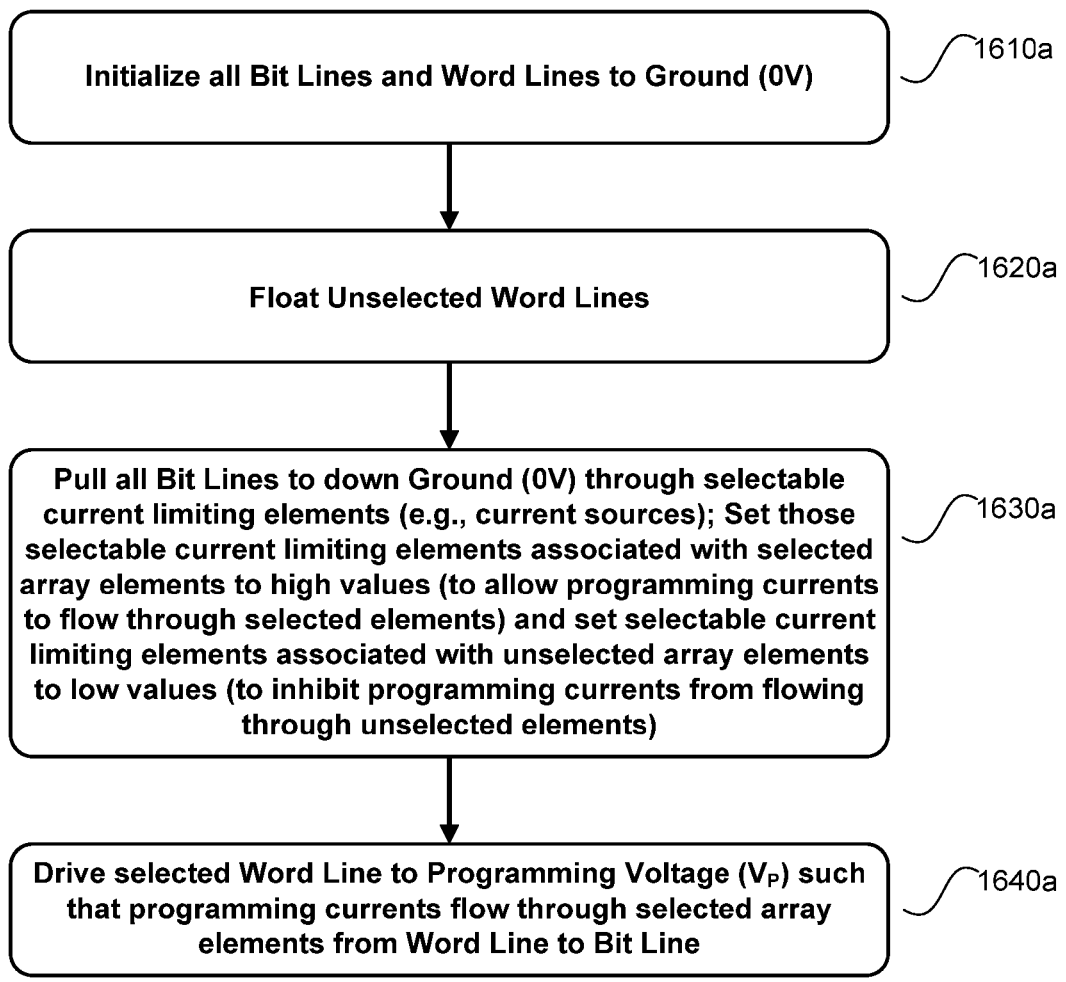
FIG. 16A is a flow chart detailing a method according to the present disclosure for performing a programming operation on one or more selected cells within a resistive change element array (such as is shown, for example, in FIGS. 3, 5, 6A, and 6) using a current limiting programming method according to the methods of the present disclosure wherein the programming current or currents are provided to the selected cell or cells flowing from word line to bit line.
Figure 16B:
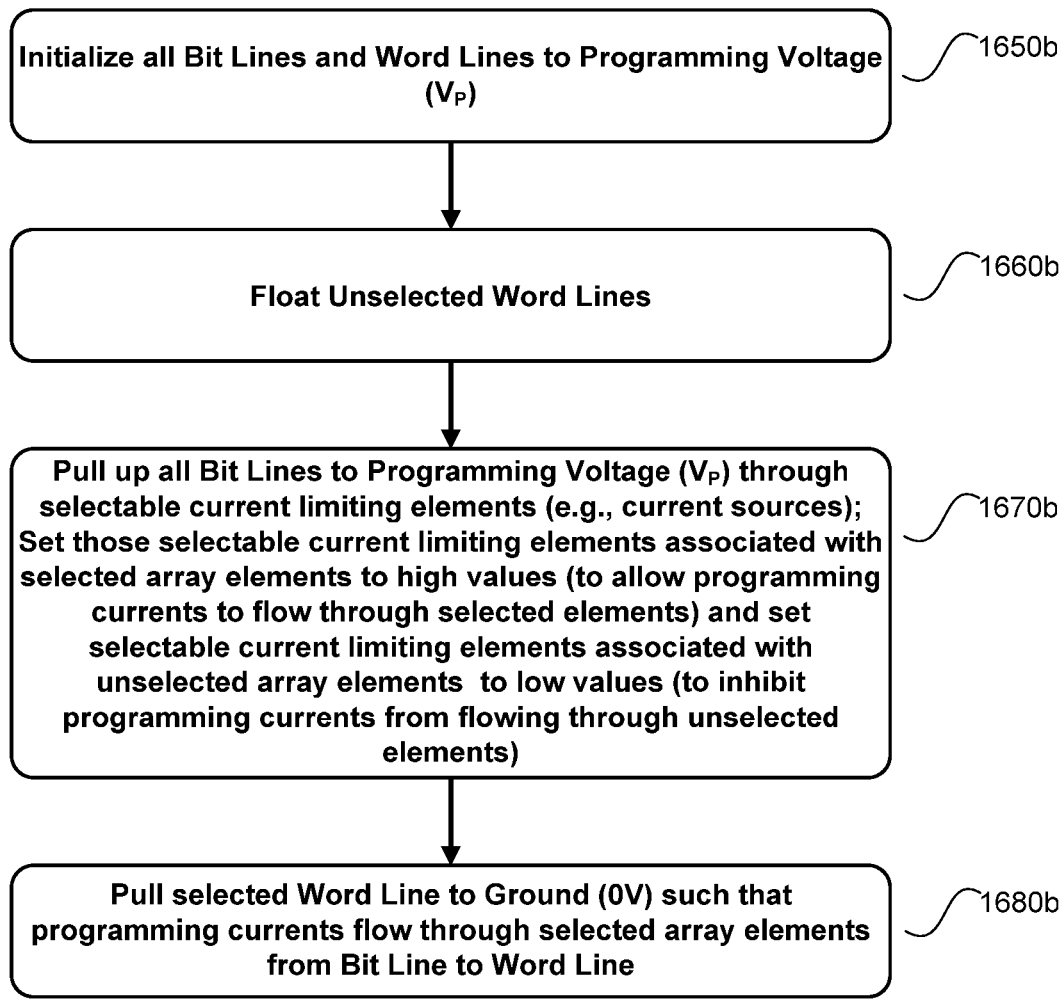
FIG. 16B is a flow chart detailing a method according to the present disclosure for performing a programming operation on one or more selected cells within a resistive change element array (such as is shown, for example, in FIGS. 3, 5, 6A, and 6B) using a current limiting programming method according to the methods of the present disclosure wherein the programming current or currents are provided to the selected cell or cells flowing from bit line to word line.

FIGS. 16A and 16B are flow charts (1601 and 1602, respectively) describing a first method for programming (that is, performing a SET or a RESET operation, as defined within the present disclosure) on one or more array cells within a resistive change element array. This first programming method uses selectable current limiting elements to selectively permit or inhibit programming currents from flowing through selected and unselected cells, respectively.

Figure 17A:
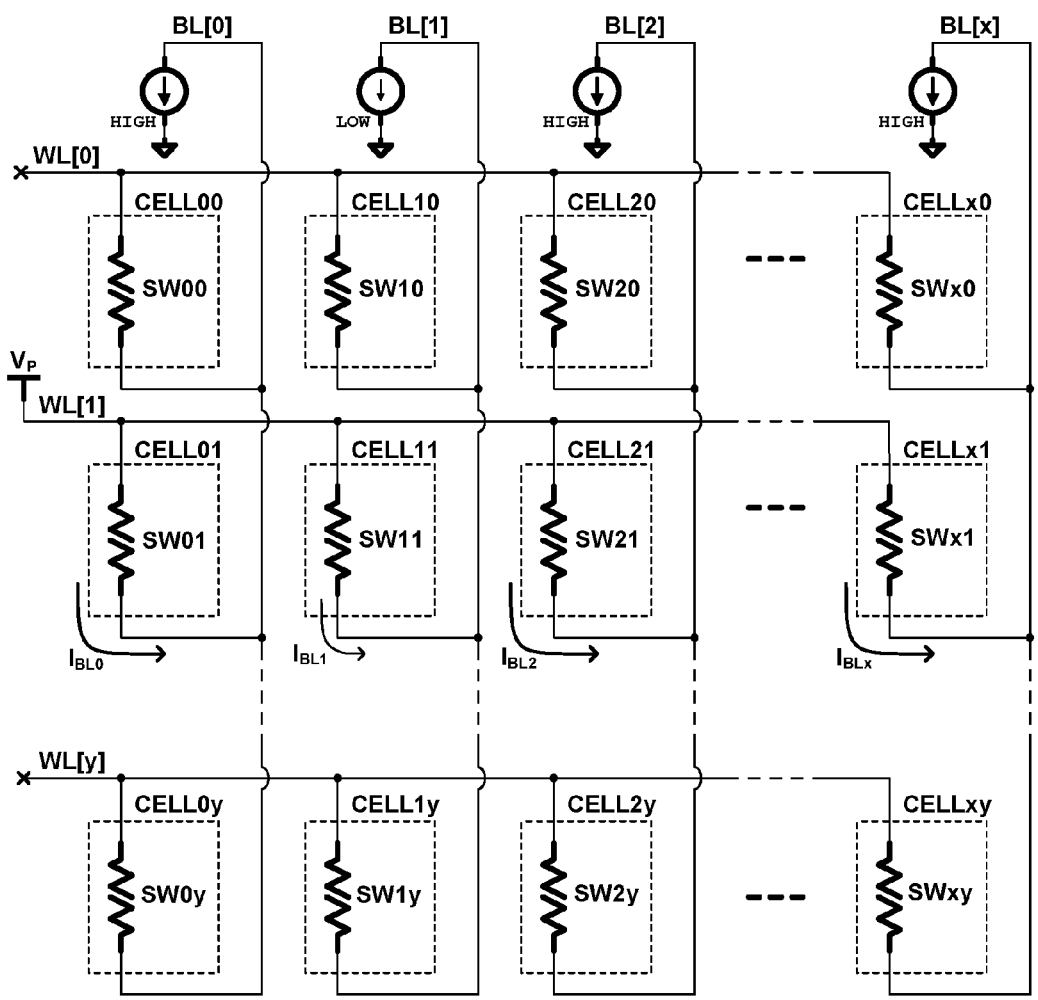
FIG. 17A is a simplified schematic diagram detailing the electrical stimuli provided to an exemplary resistive change element array (as is shown, for example, in of FIGS. 3, 5, 6A, and 6B) during an exemplary current limiting programming operation performed according to the methods of the present disclosure as detailed in FIG. 16A.
Figure 17B:
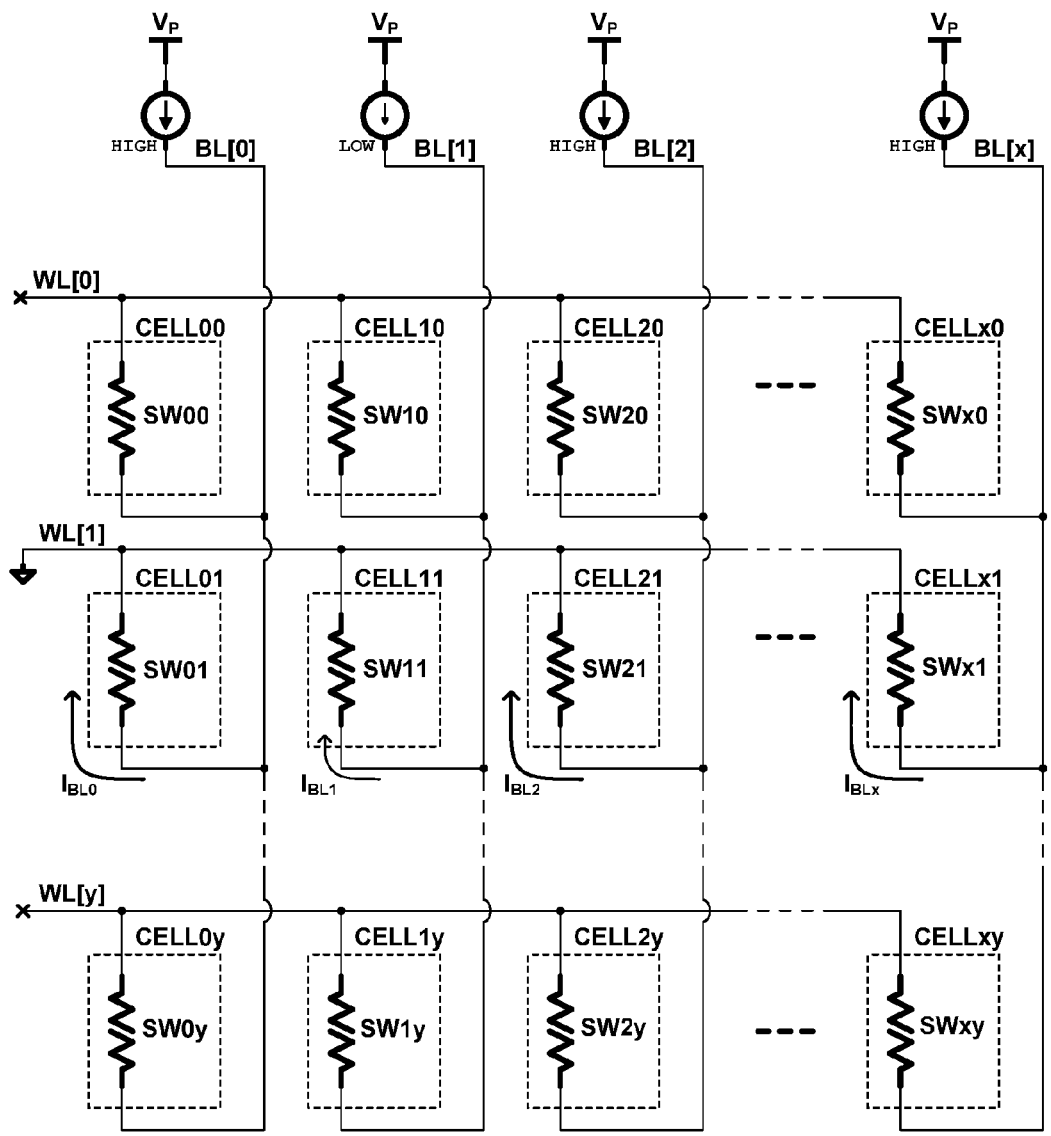
FIG. 17B is a simplified schematic diagram detailing the electrical stimuli provided to an exemplary resistive change element array (as is shown, for example, in of FIGS. 3, 4, 6A, and 6B) during an exemplary current limiting programming operation performed according to the methods of the present disclosure as detailed in FIG. 16B.
Figure 18A:
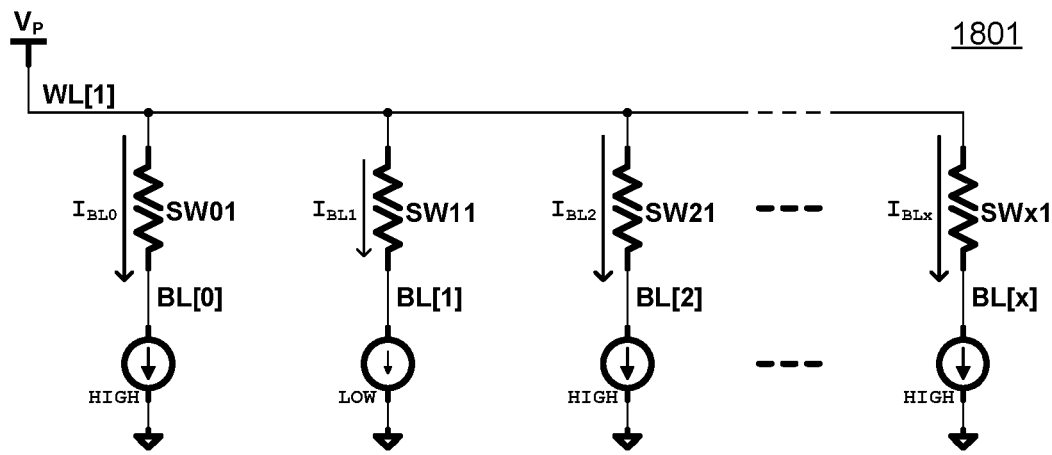
FIG. 18A is a reduced schematic diagram detailing the electrical stimuli provided to the selected word line and the bits lines within the exemplary current limiting programming operation shown in FIG. 17A.
Figure 18B:
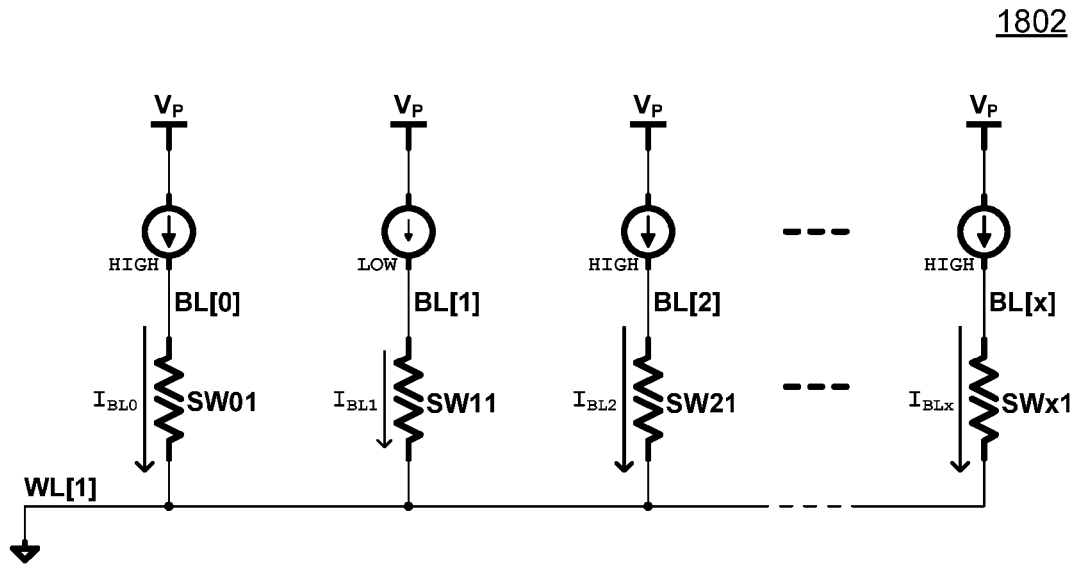
FIG. 18B is a reduced schematic diagram detailing the electrical stimuli provided to the selected word line and the bits lines within the exemplary current limiting programming operation shown in FIG. 18B.

FIG. 16A is a flow chart describing this first programming method wherein programming currents are induced to flow through selected array elements from word line to bit line. And FIG. 16B is a flow chart describing this programming method wherein programming currents are induced to flow bit line to word line. In this way (and as will be shown in the following detailed discussion of these figures) this first programming method of the present disclosure is well suited for bipolar programming operations on an array of 1-R resistive change element cells, such as is depicted in FIGS. 3, 5, 6A, and 6B as well as similar variations of those array structures. FIGS. 17A and 18A are simplified schematic diagrams illustrating the electrical stimuli applied to a resistive change element array (as is depicted in FIG. 3) during the programming operation as described in the flowchart of FIG. 16A. And FIGS. 17B and 18B are simplified diagrams illustrating the electrical stimuli applied to a resistive change element array (as is depicted in FIG. 3) during the programming operation as described in the flowchart of FIG. 16B. This current limiting programming method of the present disclosure will be described in detail within the discussion of these figures below.

Referring now to FIGS. 16A and 16B, in a first process step (1610a and 1610b, respectively) all of the word lines and bit lines in the array are initialized to ground (0V). In a next process step (1620*a* and 1620*b*, respectively), the unselected word lines within the resistive change element array are floated. In a next process step (1630*a* and 1630*b*, respectively), the bit lines within the array are pulled either down to ground (in the case of the word line to bit line programming current flow of FIG. 16A) or up to a programming voltage, $V_P$, (in the case of the bit line to word line programming current flow of FIG. 16B) through a selectable current limiting element. These selectable current limiting elements (for example, the current source elements depicted in FIGS. 17A, 17B, 18A, and 18B) can be used to either inhibit or permit a programming current to flow through a array cell on the selected word line.

By selectively limiting the current flow through the bit lines during a programming operation, current flow can be inhibited through unselected cells and permitted to flow through selected cells. That is, the current flow through unselected cells can be limited such as to not be large enough to adjust the resistive state of those unselected cells, while at the same time currents sufficiently high as to adjust the resistive stage of the selected cells can flow through the selected cells within the array. In this way, an applied programming current can be directed to program a single cell on a selected word line or multiple cells on a selected word line simultaneously. Limiting the current on these unselected bit lines can be performed, for example, through the use of current sources, programmable power supplies, and resistive elements.

In a next process step (1640*a* and 1640*b*, respectively), the selected word line within the resistive change element array is pulled either driven to a required programming voltage, $V_P$, (in the case of the word line to bit line programming current flow of FIG. 16A) or to a ground (in the case of the bit line to word line programming current flow of FIG. 16B). In this way, programming currents are permitted to flow through only the selected cells within the array.

Within the process described by FIG. 16A, the programming voltage $V_P$ on the selected word line provides a sufficient programming current only through those array cells on the selected word line pulled down to ground through selectable current limiting elements that are selected (or programmed or enabled, etc.) to allow relatively "high" currents. This programming current will adjust the resistive state of these selected cells from an initial resistive state into a desired second state (for example, into either a SET or RESET condition). Those cells pulled down to ground through selectable current limiting elements selected (or programmed, or enabled, etc.) to inhibit relatively "high" currents will not experience a sufficient programming current and remain essentially in the same resistive state.

Similarly, within the process described by FIG. 16B, the programming voltage $V_P$ applied to the bit lines provides a sufficient programming current only through those array cells pulled up to that programming voltage ($V_P$) through selectable current limiting elements that are selected (or programmed or enabled, etc.) to allow relatively "high" currents. This programming current will adjust the resistive state of these selected cells from an initial resistive state into a desired second state (for example, into either a SET or RESET condition). Those cells pulled up to $V_P$ through selectable current limiting elements selected (or programmed, or enabled, etc.) to inhibit relatively "high" currents will not experience a sufficient programming current and remain essentially in the same resistive state.

Within this first programming method of the present disclosure, this programming voltage, $V_P$, is selected (as determined by the needs of a particular application and the type of resistive change elements being used within the array) to provide a programming current sufficient to adjust the electrical resistance of the resistive change elements used within the array from a first resistive state to a second resistive state. That is, this selected programming voltage is sufficient to SET (adjust the resistive change elements from a relatively high resistive state to a relatively low resistive state) or RESET (adjust the resistive changes element from a relatively low resistive state to a relatively high resistive state) the selected array cells.

It should be noted that in certain applications of resistive change element arrays, one set of programming conditions are used to drive a resistive change element into a SET state and a second, different, set of programming conditions are used to drive a resistive change element into a RESET state. That is, for example, within such applications a first set of programming conditions (e.g., voltage, current, pulse width, polarity, etc.) will adjust a resistive change element that is initially in a SET state into a RESET state. However when this same set of programming conditions is applied to a resistive change element already in a RESET state, that element will simply remain in a RESET state in response to the applied programming conditions (that is, the resistive state of this element will remain essentially unchanged). As such, within these certain applications the first programming operation of the present disclosure (as described with respect to FIGS. 16A and 16B) can be used to ensure that an entire group of cells (on the cells on a selected word line, for example) are in the same state. For example, within such an application, a first programming operation according to the methods of the present disclosure could be used to perform a global RESET operation on a selected word line. Within such an operation, those cells on the selected word line initially in a SET state would be adjusted into a RESET state, and those cells on the selected word line initially in a RESET state would remain essentially unaffected by the programming operation and remain in a RESET state. In this way, at the conclusion of the programming operation, all cells on the selected word line will be in a RESET state.

Looking now to FIG. 17A, the simplified schematic diagram 300 of FIG. 3 has been modified to realize schematic diagram 1701, which illustrates the electrical stimuli applied to an exemplary resistive change element array during an exemplary programming operation according to the method detailed in FIG. 16A and described above. Specifically, within FIG. 17A, WL[1] has been selected and driven to a required programming voltage ($V_P$) while the remaining word lines (WL[0] and WL[y]) are floated. And each of the bit lines (BL[0]-BL[x]) in the array have been pulled to ground through selectable current limiting devices. These selectable current limiting devices are represented within FIG. 17A as current sources, but as previously discussed this first programming operation of the present disclosure is not limited in this regard. Indeed, a number of elements could be used to selectively limit the current on the bit lines within the array, such as, but not limited to, programmable power supplies and resistive elements.

Within the exemplary programming operation depicted in FIG. 17A, CELL01, CELL21, and CELLx1 have been designated as being selected for the programming operation, and CELL11 has been designated as being unselected. As such, the selectable current limiting elements on BL[0], BL[2], and BL[x] have been configured to permit a relatively "high" current, and this configuration results in programming currents ($I_{BL0}$, $I_{BL2}$, and $I_{BLX}$, respectively) flowing from word line to bit line that are sufficient to adjust the resistive change elements within the selected cells (SW01, SW21, and SWx1, respectively) from an initial resistive state into a desired second state. The selectable current limiting element on BL[1], however, is configured to permit only a relatively "low" current (or, within certain application, essentially no current), and this configuration results in a programming current ($I_{BL1}$) through CELL11 that is low enough that the resistive state of SW11 remains essentially unchanged during the programming operation.

Looking now to FIG. 18A, the schematic diagram 1701 of FIG. 17A has been further reduced to realize schematic diagram 1801, which better illustrates the electrical stimuli applied to the elements on WL[1] (the selected word line) during the exemplary programming operation depicted in FIG. 17A.

As can be seen in FIG. 18A, the voltage on WL[1] ($V_P$) is provided to the first terminal of each of the resistive change elements on that word line (SW01-SWx1). The second terminals of resistive change elements SW01, SW21, and SWx1 are each separately pulled to ground through selectable current limiting elements (via bit lines BL[0], BL[2], and BL[x], respectively) that are configured to permit relatively "high" currents. As such, programming currents $I_{BL0}$, $I_{BL2}$, and $I_{BLx}$ are sufficiently high as to adjust the resistive state (that is, program) those resistive change elements. However, the second terminal of resistive change element SW11 is pulled to ground though a selectable current limiting element (via bit line BL[1]) that is configured to permit only reality "low" currents (or, within certain operations, configured to essentially inhibit current flow). As such, programming current $I_{BL1}$ sufficiently low (or otherwise inhibited) such that the resistive state of SW11 remains essentially unaffected during the exemplary programming operation.

In this way, sufficient programming currents ($I_{BL0}$, $I_{BL2}$, and $I_{BLx}$) are driven through each of the selected array cells on WL[1] (that is, CELL01, CELL12, and CELLx1) such as to adjust or otherwise change the resistive state of the resistive change elements within those cells (that is, SW01, SW12, and SWx1), and such a programming current is inhibited from flowing the unselected array cells on WL[1] (that is, CELL11) preventing any adjustment to the resistive change element within those cells (that is, SW11) during the programming operation. As shown in FIG. 17A, the array cells on the other word lines within the array (that is, CELL00-CELL0x and CELL0y-CELLxy) remain unaffected by the programming operation.

Looking now to FIG. 17B, the simplified schematic diagram 300 of FIG. 3 has been modified to realize schematic diagram 1702, which illustrates the electrical stimuli applied to an exemplary resistive change element array during an exemplary programming operation according to the method detailed in FIG. 16B and described above. Specifically, within FIG. 17B, WL[1] has been selected and pulled down to ground (0V) while the remaining word lines (WL[0] and WL[y]) are floated. And each of the bit lines (BL[0]-BL[x]) in the array have been pulled up to a required programming voltage ($V_P$) through selectable current limiting devices. These selectable current limiting devices are represented within FIG. 17B as current sources, but as previously discussed this first programming operation of the present disclosure is not limited in this regard. Indeed, a number of elements could be used to selectively limit the current on the bit lines within the array, such as, but not limited to, programmable power supplies and resistive elements.

As within the programming operation depicted in FIG. 17A, within the exemplary programming operation depicted in FIG. 17B CELL01, CELL21, and CELLx1 have been designated as being selected for the programming operation, and CELL11 has been designated as being unselected. As such, the selectable current limiting elements on BL[0], BL[2], and BL[x] have been configured to permit a relatively "high" current, and this configuration results in programming currents ($I_{BL0}$, $I_{BL2}$, and $I_{BLx}$, respectively) flowing from bit line to word line that are sufficient to adjust the resistive change elements within the selected cells (SW01, SW21, and SWx1, respectively) from an initial resistive state into a desired second state. The selectable current limiting element on BL[1], however, is configured to permit only a relatively "low" current (or, within certain application, essentially no current), and this configuration results in a programming current ($I_{BL1}$) through CELL11 that is low enough that the resistive state of SW11 remains essentially unchanged during the programming operation.

Looking now to FIG. 18B, the schematic diagram 1702 of FIG. 17B has been further reduced to realize schematic diagram 1802, which better illustrates the electrical stimuli applied to the elements on WL[1] (the selected word line) during the exemplary programming operation depicted in FIG. 17B.

As can be seen in FIG. 18B, the first terminal of each of the resistive change elements on WL[1] (SW01-SWx1) is pulled down to ground (0V). The second terminals of resistive change elements SW01, SW21, and SWx1 are each separately pulled to up to a programming voltage ($V_P$) through selectable current limiting elements (via bit lines BL[0], BL[2], and BL[x], respectively) that are configured to permit relatively "high" currents. As such, programming currents $I_{BL0}$, $I_{BL2}$, and $I_{BLx}$ are sufficiently high as to adjust the resistive state (that is, program) those resistive change elements. However, the second terminal of resistive change element SW11 is pulled up to the programming voltage ($V_P$) though a selectable current limiting element (via bit line BL[1]) that is configured to permit only reality "low" currents (or, within certain operations, configured to essentially inhibit current flow). As such, programming current $I_{BL1}$ sufficiently low (or otherwise inhibited) such that the resistive state of SW11 remains essentially unaffected during the exemplary programming operation.

In this way, sufficient programming currents ($I_{BL0}$, $I_{BL2}$, and $I_{BLx}$) are driven through each of the selected array cells on WL[1] (that is, CELL01, CELL12, and CELLx1) such as to adjust or otherwise change the resistive state of the resistive change elements within those cells (that is, SW01, SW12, and SWx1), and such a programming current is inhibited from flowing the unselected array cells on WL[1] (that is, CELL11) preventing any adjustment to the resistive change element within those cells (that is, SW11) during the programming operation. As shown in FIG. 17B, the array cells on the other word lines within the array (that is, CELL00-CELL0x and CELL0y-CELLxy) remain unaffected by the programming operation.

Figure 19A:
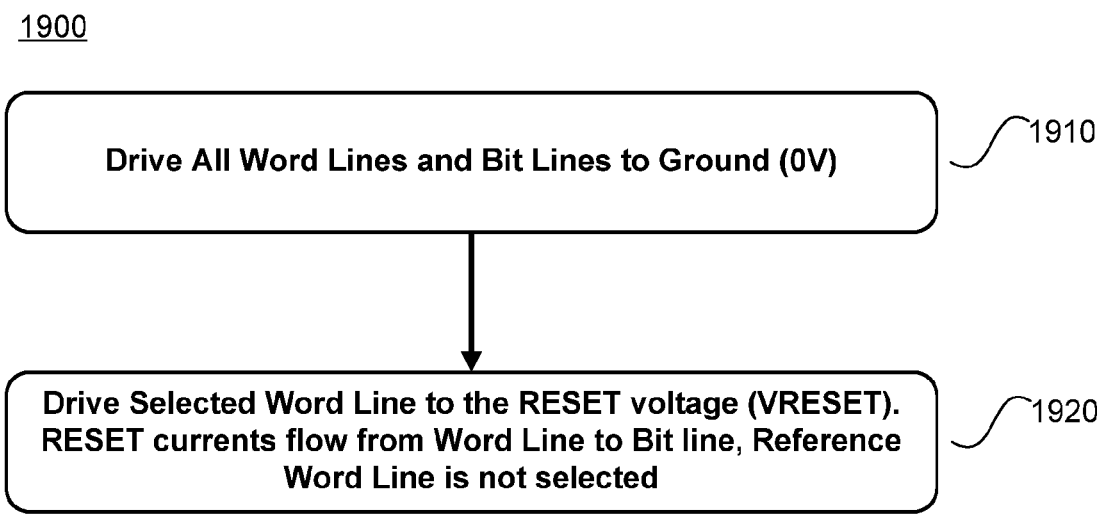
FIG. 19A is a flow chart detailing a method according to the present disclosure for performing a RESET operation on one or more selected cells within a resistive change element array (such as is shown, for example, in FIGS. 3, 5, 6A, and 6B) using a programming method according to the methods of the present disclosure that makes use of directed current paths.
Figure 19B:
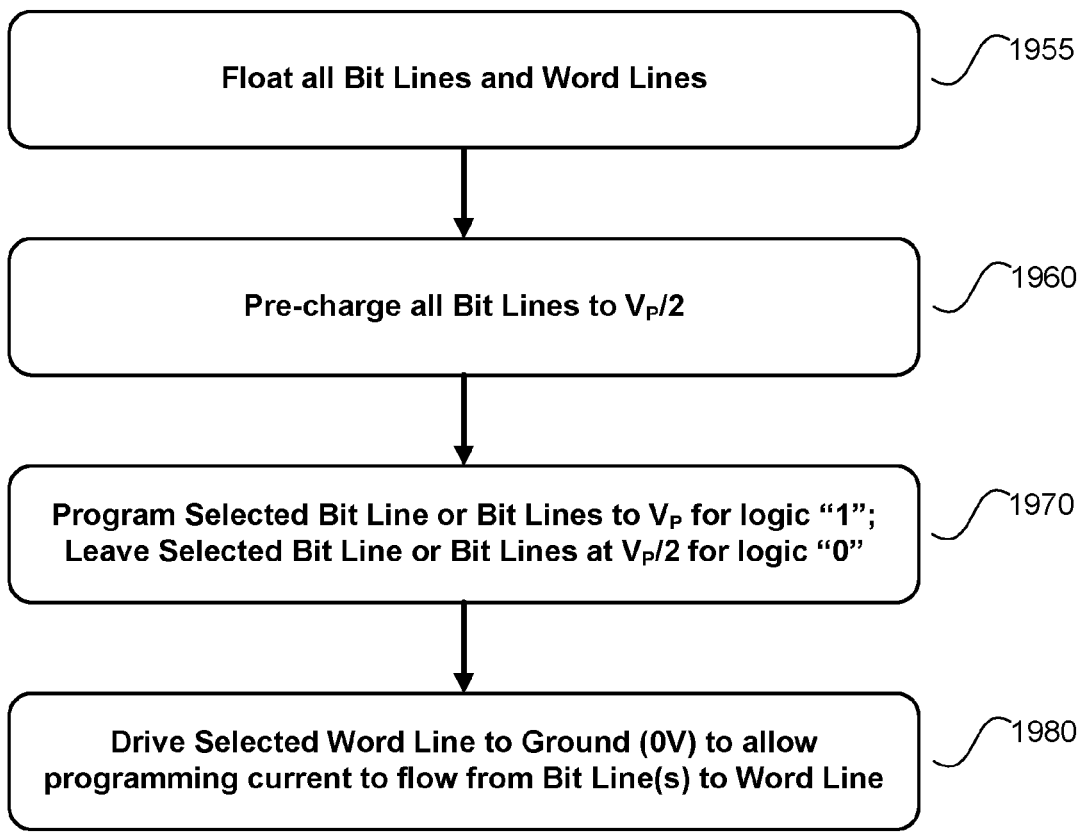
FIG. 19B is a flow chart detailing a method according to the present disclosure for performing a SET operation on one or more selected cells within a resistive change element array (such as is shown, for example, in FIGS. 3, 5, 6A, and 6B) using a programming method according to the methods of the present disclosure that makes use of directed current paths.

FIGS. 19A and 19B illustrate flow charts 1900 and 1950, respectively, describing a second method for programming. Flow chart 1900 illustrates a second method of performing a RESET operation and flow chart 1950 illustrates a second method of performing a SET operation, as defined within the present disclosure, on a selected array cell or cells within a resistive change element array. This second programming method may be applied to memory arrays illustrated by schematic diagram 801 illustrated in FIG. 8A and schematic diagram 901 illustrated in FIG. 9A. Schematic diagram 901 includes a reference word line used during a READ operation as described further above. However, array cells along the reference word line have fixed reference resistance values and so only data word lines are programmed. This second programming method RESETs CNT switches (bits) in the selected array cells along a selected (data) word line within a selected array (or sub-array) as described in flow chart 1900. Those CNT switches in a low resistance SET state $R_L$ transition (switch) to a high resistance RESET state $R_H$, and those CNT switches in a high resistance RESET state remain in the high resistance RESET $R_H$ state. This directed current path programming method according to the present disclosure is well suited for accessing and RESETTING array elements in a single word line within a resistive change element array without disturbing or otherwise affecting the other elements within the array, followed by choosing one or several bit lines to perform a programming operation on array elements in the selected word line. This directed current method can be desirable within certain aspects of certain applications as it does not require the selectable current limiting elements as are used in the first programming method of the present disclosure and is still well suited for programming 1-R arrays of resistive change elements. However, during a programming operation, programming current flows to the selected cells and also to unselected cells in the form of leakage currents. Flow chart 1950 describes an approach to programming the selected bits without disturbing unselected bits.

Referring now to Method 1900 illustrated in FIG. 19A, in a first process step 1910 all word lines and bit lines in the array are driven to zero volts (ground). Next, in process step 1920, a selected word line is driven to a RESET voltage $V_{RESET}$. RESET currents flow from word line to bit lines. RESET voltage $V_{RESET}$ is typically in the range of 2 to 3.0 volts, for example. Only data word lines are selected. Reference word lines have fixed reference resistance values and are never selected during programming operations. Since all bit lines are grounded at zero volts, array cells in adjacent word lines are not disturbed and no RESET voltages appear across comparator (sensing) elements. Although referring to a single selected word line, multiple word lines may be RESET simultaneously, as may be useful if performing a page mode programming operation for example.

Referring now to FIG. 19B, in a first process step 1955 all of the word lines and bit lines within the array are floated. Next, in process step 1960, a bit line or multiple bit lines are pre-charged to half the programming voltage $V_P$ (to $V_P/2$). In a next process step 1970 a programming voltage ($V_P$) is applied to a selected bit line or several selected bit lines (that is, bit line(s) within the array associated with the array cell(s) to be programmed). In a next process step 1980 the selected word line (that is, the data word line within the array associated with the array cell(s) to be programmed) is pulled to ground (0V). This results in a programming current ($I_P$) flowing from bit line(s) to the selected word line through the selected cell(s). It should be noted that the polarity of this programming current can be reversed by driving the word line associated with a selected array element to the programming voltage ($V_P$) and driving the bit line associated with the selected array element to ground (0V). In this way, this second programming method of the present disclosure is well suited for bi-polar programming operations. However, this second programming method may also be used for uni-polar programming operations if desired.

With second programming method 1900 performing a RESET operations by applying RESET voltages to all cells along a selected word line with all bit lines grounded, all array cells along a selected word line are in the RESET state, corresponding to a logic "0", at the completion of second programming method 1900. At this point in the second programming method cycle, since all array cells in the selected word line are in the RESET (high resistance $R_H$ state), second programming method 1950 may apply SET pulses selectively to array cells according to the data input to the memory data I/O buffer/driver shown further below in FIG. 23. Thus, a programming voltage of $V_P = V_{SET}$ of approximately 2 Volts, for example, is applied only to selected bit lines where array cells are made to transition from a RESET state ($R_H$) to a SET state ($R_L$), where a SET state corresponds to a logic "1". Array cells to remain in a RESET state receive no pulse. Corresponding circuits and methods used to perform this function are described further below with respect to FIGS. 23 and 24.

Due to the complex resistive network formed by the unselected cells within the array interconnected with each other through the floated unselected word lines and bit lines, numerous leakage currents ($I_{LEAK}$) will be present within the array during a programming operation using this second method of the present disclosure (as described in FIG. 19). However, as will be discussed in more detail below within the discussion of FIGS. 20A, 20B, 20C, and 20D, by controlling certain parameters within the array, these leakage currents can be limited (for example, by the selection of the programming voltage, the resistance values used within the resistive change elements, or the size of the array) such as to prevent unselected bit line voltages and corresponding leakage currents large enough to induce a change in the resistive state of unselected elements within the array. The resistive change element array can be used with a programming current in either direction through a single element within an array without the need for local, in situ selection circuitry within each array cell.

Figure 20A:
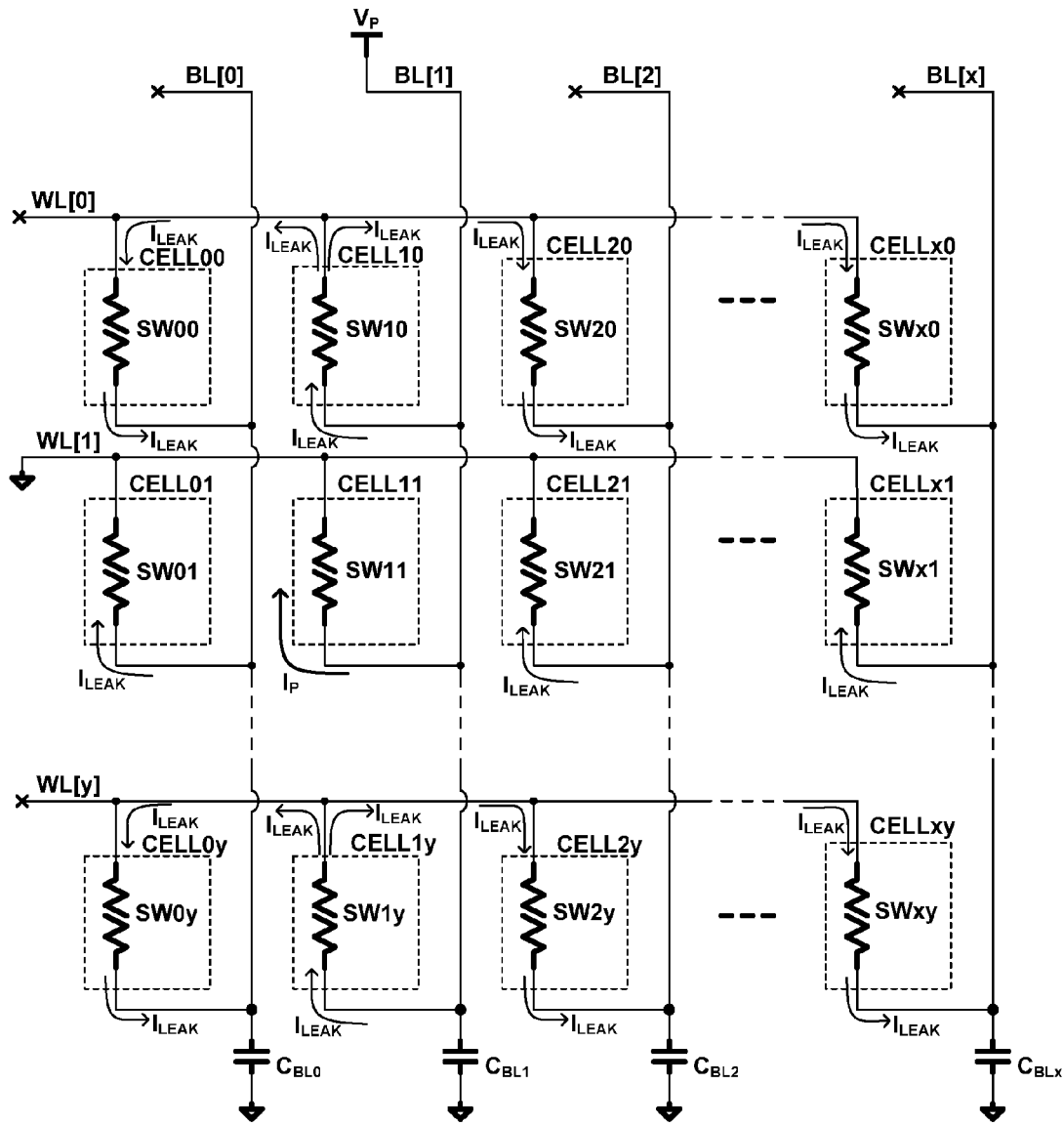
FIG. 20A is a simplified schematic diagram detailing the electrical stimuli provided to an exemplary resistive change element array (as is shown, for example, in of FIGS. 3, 5, 6A, and 6B) during an exemplary programming operation performed according to the methods of the present disclosure as detailed in FIG. 19.

Looking now to FIG. 20A, the simplified schematic diagram 300 of FIG. 3 has been modified to realize schematic diagram 2001, which illustrates the electrical stimuli applied to an exemplary resistive change element array during an exemplary programming operation according to the methods detailed in FIGS. 19A and 19B and described above. Specifically, within FIG. 20A, CELL11 has been designated as the selected cell. As such, BL[1] has been selected and driven to a required programming voltage ($V_P$), and WL[1] has been selected and driven to ground (0V). The unselected word lines (WL[0], WL[2]-WL[y]) as well as the unselected bit lines (BL[0], BL[2]-BL[x]) within the array are floated. While a single bit line BL[1] is used for illustrative purposes, multiple bit lines may also be selected as described further below. This results in a programming current ($I_P$) being induced to flow through the resistive change element within the selected cell (SW11) and numerous leakage currents ($I_{LEAK}$) flowing through the resistive network of the unselected cells within the array from the selected bit line BL[1] to the selected word line WL[1]. The programming current $I_P$ also charges bit line capacitance $C_{BL1}$ and the leakage currents $I_{LEAK}$ flowing through the resistive network also charge the capacitances $C_{BL0}$, $C_{BL2}$-$C_{BLx}$ shown in schematic diagram 2001.

Figure 20B:
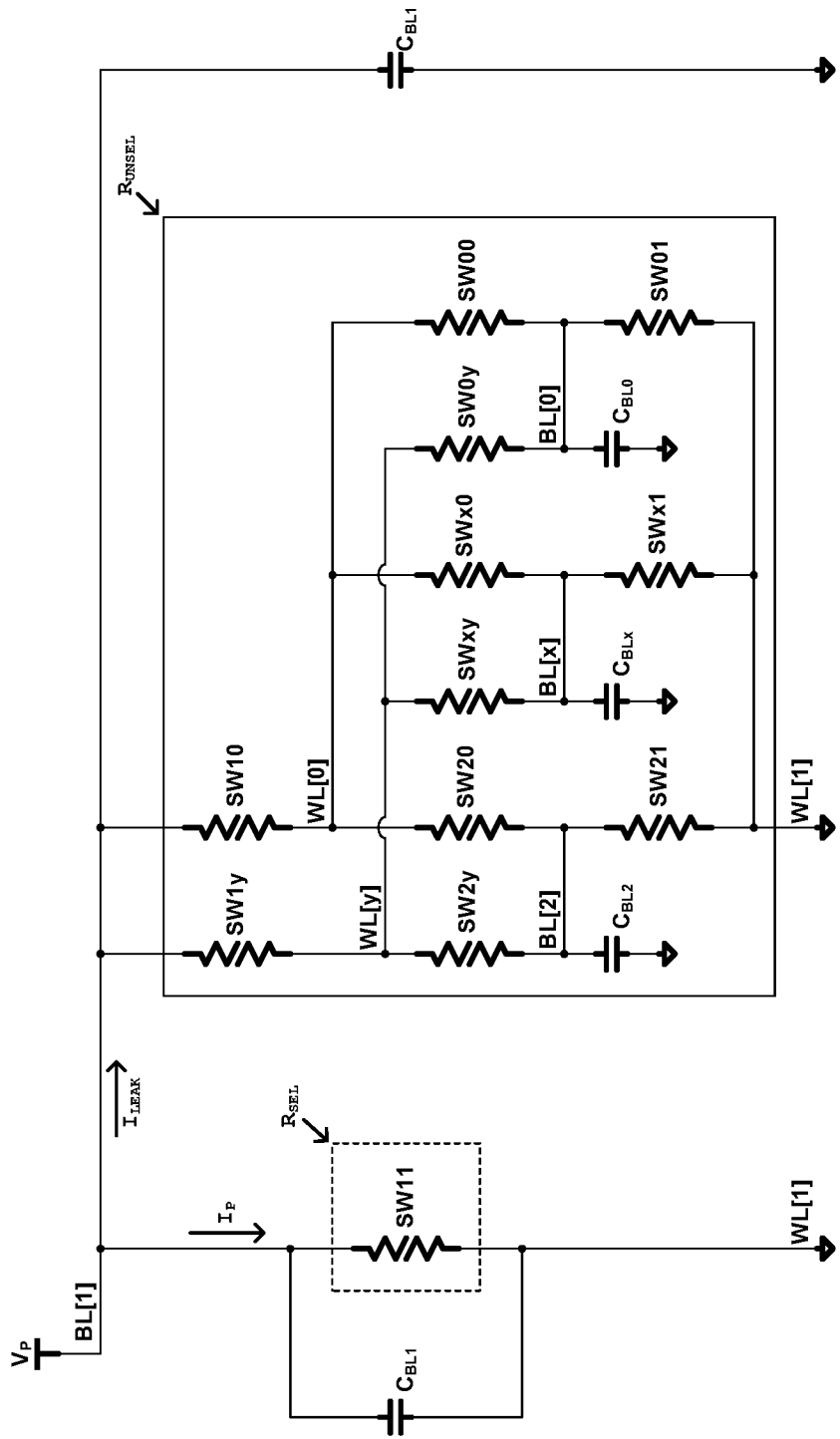
FIG. 20B is a reduced schematic diagram detailing the electrical stimuli provided to the selected bit line and the words lines within the exemplary programming operation shown in FIG. 20A.

Looking now to FIG. 20B, the schematic diagram 2001 of FIG. 20A has been further reduced to realize schematic diagram 2002, which better illustrates the electrical stimuli applied to the elements within the array during the exemplary programming operation depicted in FIG. 20A.

As can be seen in FIG. 20B, the programming methods detailed in FIGS. 19A and 19B result in essentially two currents flowing through two resistive networks connected in parallel between the selected bit line and the selected word line (BL[1] and WL[1] within the exemplary programming operation depicted in FIGS. 20A and 20B). The first resistive network, $R_S$, is essentially the resistive change element of the selected cell and the corresponding bit line capacitance $C_{BL1}$, and this resistive network is responsive to the programming current $I_P$. The second resistive network, $R_U$, is the complex series and parallel resistive combination of the unselected resistive change elements within the array. This second resistive network is responsive to the leakage current $I_{LEAK}$. As previously described, the parameters of the resistive change element array (for example, the programming voltage, the resistance values used within the resistive change elements, or the size of the array) are selected such that the programming voltage $V_P$ and current $I_P$ is sufficient to adjust the resistive state of the selected resistive change element from a initial resistive state to a desired second state and the unselected bit line voltage and corresponding leakage current ($I_{LEAK}$) are sufficiently low as to not disturb (that is, substantially change the resistive state) of any of the unselected elements within the array. The capacitive elements $C_{BL0}$, $C_{BL1}$, $C_{BL2}$-$C_{BLx}$ are included because these bit line capacitances must be charged and discharged during programming operations and limit the rate at which the bit line voltages can charge and, in turn, how fast a programming operation on CELL11 (or any cell on BL[1]) can be performed.

Figure 20C:
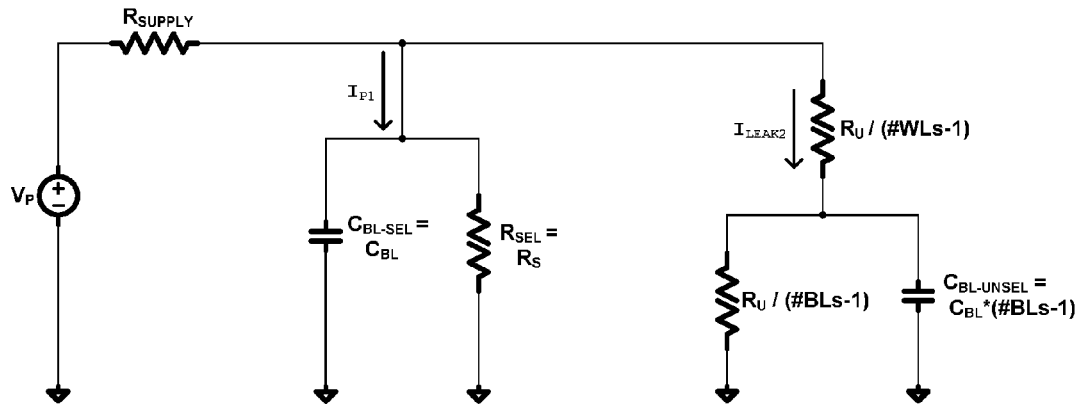
FIG. 20C is an equivalent model schematic diagram detailing the electrical stimuli provided to the selected bit line and the words lines within the exemplary programming operation shown in FIG. 20A.

FIG. 20C is a simplified schematic diagram 2003 that provides an equivalent circuit model for the relatively complex circuit depicted in FIG. 20B. The voltage source $V_P$ and series resistor $R_{SUPPLY}$ are intended to represent the programming voltage as applied to the selected bit line (BL[1] in FIG. 20B). $C_{BL}$ is intended to represent the capacitance of each bit line in the array, including that of the selected bit line ($C_{BL1}$ in FIG. 20B), and $C_{BL}$(#BLs-1) is intended to represent the equivalent combined capacitance from the network of unselected array lines. $R_S$ is intended to represent the resistance of the selected array element (SW11 in FIG. 20A) and $R_U$ is intended to represent the resistance of the unselected array elements. The leakage current $I_{LEAK}$ is determined by the voltage applied to $R_U$(#WLs-1) in series with the combination of $R_U$(#BLs-1) in parallel with $C_{BL}$(#BLs-1).

Figure 20D:
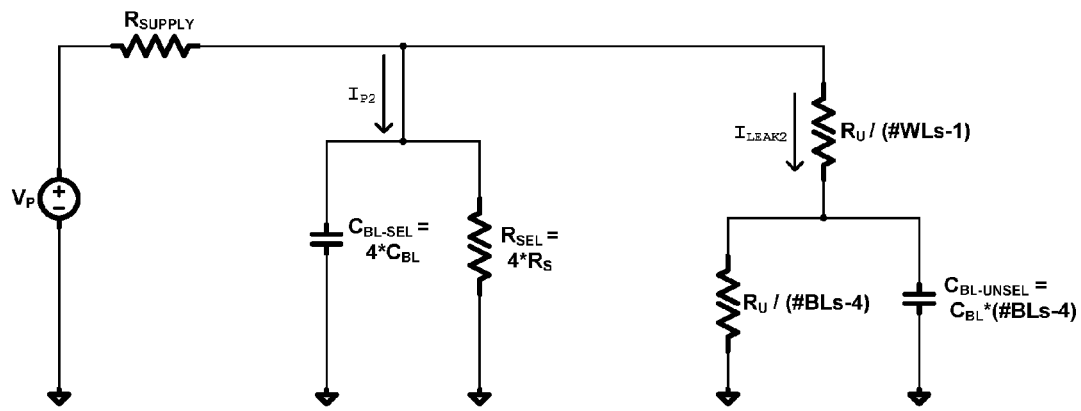
FIG. 20D is a simplified schematic diagram that provides an equivalent circuit model for the relatively complex circuit depicted in FIG. 20B.

FIG. 20D is a simplified schematic diagram 2004 that provides an equivalent circuit model for the relatively complex circuit depicted in FIG. 20B. By way of comparison with schematic 2003, schematic diagram 2004 provides an equivalent circuit in which four bit lines are programmed simultaneously. In this example, the total programming current $I_P$ is 4 times greater than programming current $I_P$ in schematic diagram 2003 because 4 selected bits are programmed in parallel on four separate bit lines. A more detailed comparison of the operation of single bit line programming and multiple bit line programming are described in more detail further below.

Referring now to FIG. 20C, the term $R_U$ is intended to be a resistive value of the unselected elements within the array. Since a single word line in the array was selected, the resistive element $R_U$(#WLs-1) is intended to represent this estimated resistance value ($R_U$) divided by the number of word lines in the array minus one (essentially, the parallel resistive combination of the unselected elements on each of the word lines). And since a single bit line performs a SET operation, the resistive element $R_U$/#BLs-1 is intended to represent this estimated resistance value ($R_U$) divided by the number of bit lines in the array minus one (essentially, the parallel resistive combination of the unselected elements on each of the bit lines). In the FIG. 24 example described further below, the data I/O buffer driver sends and receives 4 bits at a time. Since only one bit line received a programming voltage in FIG. 20C, the data input to the data I/O buffer/driver consisted of three logic "0s" and one logic "1".

Referring now to FIG. 20D, since a single word line was selected, the resistive element $R_U$/(#WLs-1) shown in FIG. 20C remains unchanged. However, since four bit lines were selected, the resistive element $R_U$/(#BLs-4) is intended to represent this estimated resistance value ($R_U$) divided by the number of bit lines in the array minus four (essentially, the parallel resistive combination of the unselected elements on each of the bit lines). In the FIG. 24 example described further below, the data I/O buffer driver sends and receives 4 bits at a time. Since four bit lines received programming voltages in FIG. 20D, the data input to the data I/O buffer/driver consisted of four logic "1s".

The values of $R_U$, $R_S$, $C_{BL-SEL}$, and $C_{BL-UNSEL}$ are determined by the type and characteristics (for example, but not limited to, physical dimensions, nominal SET and RESET values, fabrication methods) of the resistive change element being used, the size and architecture of the array itself, and the voltage and currents levels required to program (that is to SET or RESET) the resistive change elements within the array. By carefully selecting and tailoring these values as well as the parameters of the elements within the equivalent circuit models 2003 and 2004 of FIGS. 20C and 20D, respectively, programming parameters within the directed current programming method of the present disclosure (as is described in FIG. 19) can be selected such that programming currents such as $I_{P1}$ (FIG. 20C) or IP2 (FIG. 20D) are sufficient to adjust the resistance of selected resistive change elements from a initial resistive state to a desired second state, and, at the same time, prevent the leakage currents within the array, such as $I_{LEAK1}$ (FIG. 20C) or $I_{LEAK2}$ (FIG. 20D), from disturbing or otherwise adjusting the unselected elements within the array. In this way, the directed current method of the present disclosure can be used to adjust the resistive state (that is, program) a selected cell within a resistive change element array.

At this point in the specification, the array voltages and currents resulting from programming (WRITE) operations described in FIGS. 19A and 19B are calculated. These calculations adapt methods of calculating READ voltages summarized in FIGS. 14 and 15 to calculating programming (WRITE) array voltages and currents as described further below with respect to FIG. 21A and results are summarized in FIG. 22. Schematic diagram simplification methods similar to methods 801 and 902 that were applied to FIGS. 8A and 9A, respectively, and were applied to schematic diagram 2001 for programming (WRITE) operations illustrated in FIG. 20A resulting in further simplified schematic diagrams 2002, 2003, and 2004 shown in FIGS. 20B, 20C, and 20D, respectively. Then, still further simplification using Thevenin equivalent circuit methods, described with respect to Thevenin Equivalent circuits 1201 and 1202 illustrated further above with respect to FIGS. 12A and 12B, respectively, were adapted for programming (WRITE) operations as described with respect to FIGS. 21A-21D. Corresponding equations, similar to equations 1-10 described further above, were used to calculate the voltages and currents summarized in FIG. 22.

Referring now to process step 1920 in flow chart 1900 shown in FIG. 19A, all cells in the selected word line have been RESET to a high resistance state $R_S$=$R_H$. Also, referring to process step 1960 in flow chart 1950 shown in FIG. 19B, all bit lines have been pre-charged to half the programming voltage of $V_P/2$. By an arbitrarily assigned convention, a logic "0" input to the data I/O buffer/drivers (FIG. 23) corresponds to a high resistance RESET state, and a logic "1" corresponds to a low resistance SET state. By design of memory circuits described further below with respect to FIG. 24, a logic "0" input signal does not result in an applied programming voltage to corresponding bit line because all cells on the selected word line are in a RESET state. However, a logic "1" input signal requires the selected cell location (or cell locations in case of more than one logic "1" input) of the corresponding array cell(s) to transition to a low resistance SET state. By design, a programming voltage $V_P$ is applied to the selected bit line (or bit lines). However, since all bits are RESET prior to the programming (WRITE) operation, the programming voltage chosen is the SET voltage, so $V_P=V_{SET}$ as shown in schematic diagram 2100 in FIG. 21A. Therefore, the pre-charge voltage $V_P/2=V_{SET}/2$. When $V_{SET}$ is applied one or more bit lines, the selected cell(s) switch from a high resistance RESET value to a low resistance SET value ($R_H \rightarrow R_L$) as the selected word line is driven to zero (ground) voltage per process step 1980 in flow chart 1950.

Figure 21A:
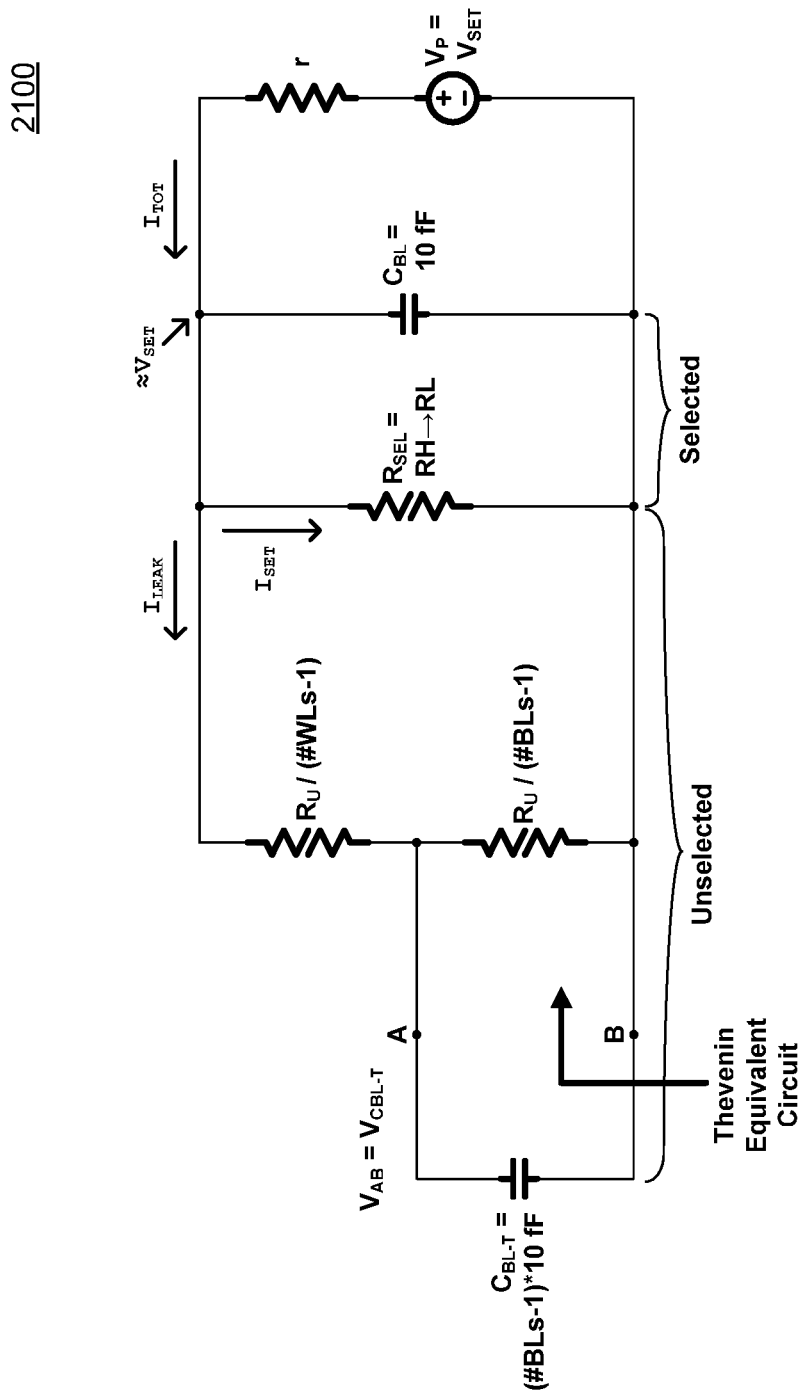
FIGS. 21A-21D are Thevenin equivalent circuits used to calculate equivalent resistances and voltages for the WRITE voltages detailed in FIGS. 20A-20D.
Figure 21B:
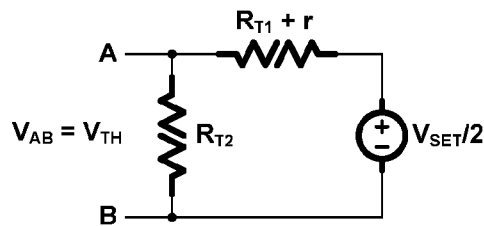
Figure 21C:
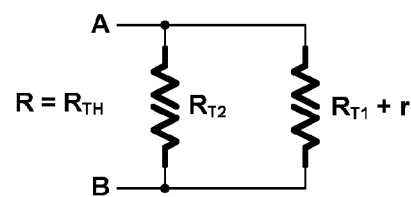
Figure 21D:
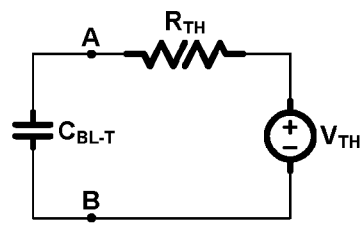

Referring now to schematic diagram 2100 illustrated in FIG. 21A, the selected bit line applies programming voltage $V_P=V_{SET}$ to the selected bit line through a series resistor r. A total current $I_{TOT}$ branches into two paths, a first SET current path through the selected cell with a current $I_{SET}$ from the selected bit line to the grounded selected word line, and a second leakage current path with a current $I_{LEAK}$ flowing through unselected cells and charging unselected bit lines in series/parallel combinations also from the selected bit line to the grounded selected word line. This combination of series/parallel paths is represented in schematic diagram 2100 by first resistor Ru/#WLs-1) connected to the selected bit line and connected at node A to a second resistor terminal Ru/(#BLs-1) which in turn is connected to the grounded selected word line at node B. The combined capacitance of all bit lines, except for the selected bit line, form unselected bit line capacitor $C_{BL-T}$=(#BLs-1)×10 fF, where each array bit line capacitance $C_{BL}$=10 fF in this example, has been pre-charged to $V_{AB}=V_{SET}/2$ by process step 1960. As the selected cell is charged to $V_{SET}$ and $I_{SET}$ current flows through the selected cell, $I_{LEAK}$ flows through the unselected portion of the array and some additional charge flows to unselected bit line capacitor $C_{BL-T}$, thereby increasing the voltage $V_{AB}$ as selected switch resistance Rs transitions from the high resistance RESET state $R_H$ to the low resistance SET state $R_L$ and the SET voltage transitions back toward zero. It is important to complete the SET operation while minimizing the increase in voltage $V_{AB}$ across the unselected portion of the memory array.

The voltage across the selected bit line transitions to $V_{SET}$. It is important to calculate the increase in voltage on $C_{BL-T}$ above $V_{SET/2}$ during the SET operation resulting in an increased $V_{AB}$. Further simplification is used to calculate the Thevenin equivalent voltage $V_{TH}$ [EQ 23] across the terminals A-B and the corresponding Thevenin equivalent resistance $R_{TH}$ [EQ 24], as illustrated by schematic diagrams 2110 and 2120 illustrated in FIGS. 21B and 21C. Next, Thevenin equivalent circuit 2130 illustrated in FIG. 21D may be used to calculate the increase in $V_{AB}$ across unselected bit line capacitance $C_{BL-T}$ using equations 23, 24, and 25. The largest increase in the voltage $V_{AB}$ is equal to the Thevenin voltage $V_{TH}$ if the duration of the SET pulse is equal to or greater than 3 times the time constant $R_{TH}C_{BL-T}$. However, if the duration of the SET pulse is less than the 3 times the $R_{TH}C_{BL-T}$ time constant, then the increase in $V_{AB}$, $\Delta V_{AB}$, will be less than $V_{TH}$ as may be calculated using [EQ 25]. The results of calculations using equations 23, 24, and 25 are summarized in Table 2200 shown in FIG. 22 for various values of array parameters. The SET time is assumed to be longer than 3 times the $R_{TH}C_{BL-T}$ time constant such that $\Delta V_{AB}=VT_H$, the largest change in $V_{AB}$ voltage.

$$V_{TH}=[V_{SET}/2]\times[(Ru/(BLs-1))/(Ru/(\#WLs-1)+Ru/(\#BLs-1)+r)] \quad [EQ\ 23]$$

$$R_{TH}=[(Ru/(\#BLs-1))\times(Ru/(\#WLs-1)+r)]/[Ru/(\#WLs-1)+Ru/(\#WBLs-1)+r] \quad [EQ\ 24]$$

$$\Delta V_{AB}=V_{TH}(1-e^{-t/R_{TH}C_{BL-T}}) \quad [EQ\ 25]$$

Referring now to Table 2200 shown in FIG. 22, there are 4 cases shown. In Cases 1A and 1B, the values of low resistance SET state $R_L$=1 MΩ and high resistance RESET state $R_H$=20 MΩ. The SET voltage $V_{SET}$=2V in these examples. When $R_L$=1 MΩ, the maximum $I_{SET}$ current is 2 uA for the selected cell. There are 256 bit lines and 128 data word lines. The selected bit transitions from $R_H$ to $R_L$ in a SET WRITE operation. The maximum array current case assumes that all unselected cells are in a low resistance SET state $R_L$. The minimum array current case assumes that all unselected cells are in a high resistance RESET state $R_H$.

Case 1A is for the 1 bit data bus shown in FIG. 20C in which 1 input is logic "1" and 3 inputs are logic "0". Case 1B is for the 4 bit data bus shown in FIG. 20D in which all 4 inputs are logic "1".

In Cases 2A and 2B, the values of low resistance SET state $R_L$=100 kΩ and high resistance RESET state $R_H$=2 MΩ. The SET voltage $V_{SET}$=2V in these examples. When RL=100 kΩ, the maximum $I_{SET}$ current is 20 uA for the selected cell. There are 256 bit lines and 128 data word lines. The selected bit transitions from $R_H$ to $R_L$ in a SET WRITE operation. The maximum array current case assumes that all unselected cells are in a low resistance SET state $R_L$. The minimum array current case assumes that all unselected cells are in a high resistance RESET state $R_H$.

Case 2A is for the 1 bit data bus shown in FIG. 20C in which 1 input is logic "1" and 3 inputs are logic "0". Case 1B is for the 4 bit data bus shown in FIG. 20D in which all 4 inputs are logic "1".

In cases 2A and 2B, the SET current $I_{SET}$ is 10× higher than in cases 1A and 1B. The leakage currents are somewhat higher. However, in all cases, the total array leakage current in the worst case is less than 1 mA. In a typical memory operation, the array configurations will rarely, if ever, approach either maximum or minimum array current so the average current will be much lower than the maximum case.

Figure 23:
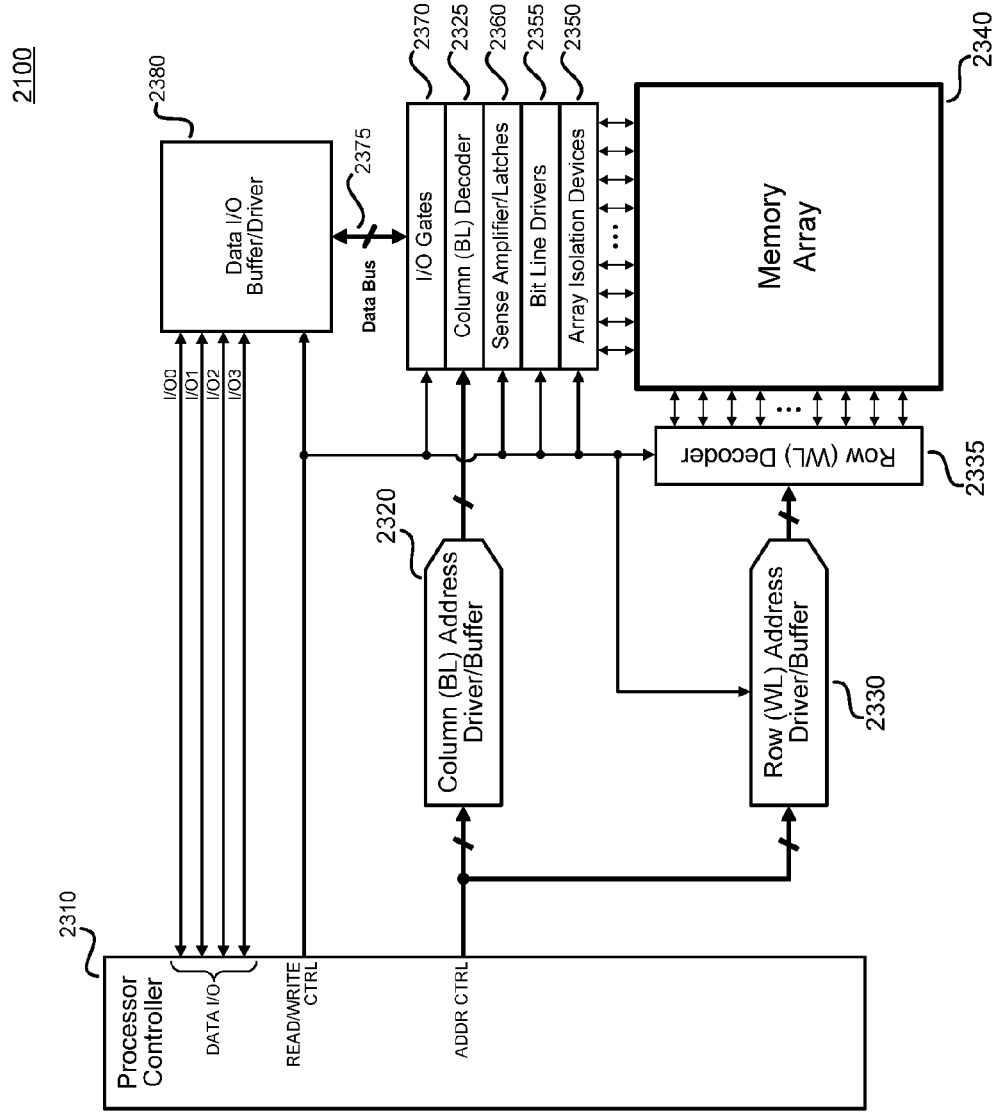
FIG. 23 is a simplified block diagram illustrating an access and addressing system capable of performing the programming and READ methods of the present disclosure on a resistive change element array.

Referring now to FIG. 23, a system level block diagram is shown illustrating a resistive change element array within an exemplary access and addressing system 2300 well suited for applying READ operations (as detailed in FIGS. 7A and 7B), first programming operations (as detailed in FIGS. 16A and 16B), and second programming operations (as detailed in FIGS. 19A and 19B) of the present disclosure.

At the core of the access and addressing system 2300 is a 1-R resistive change element array 2340 similar in architecture to the arrays shown in FIGS. 3, 5, 6A, and 6B. A processor control element 2310 provides an array of address control lines to a bit line driver/buffer circuit 2320 and to a word line driver/buffer circuit 2330. The bit line driver/buffer circuit 2320 then selects bit lines through bit line decoder element 2325 and connects those bit lines to resistive change element array 2340 through corresponding sense amplifier/latches 2360. Similarly, the word line driver/buffer circuit 2330 is connected to word line decoder element 2335 and selects those word lines to resistive change element array 2340. In this way, the programming methods of the present disclosure as described in detail within the discussions of FIGS. 16A, 16B, and 19A, 19B above can be performed via electrical stimuli provided by processor control element 2310.

The 1-R resistive change element array 2340 is coupled to an array of measurement and storage elements, such as sense amplifier/latches 2360, through array isolation devices 2350. Array isolation devices prevent exposure of terminals of the sense amplifier/latches 2360 to the higher array voltages during WRITE operations as described further below with respect to memory data path circuits schematic diagram 2400 illustrated in FIG. 24. Measurement and storage elements, such as sense amplifier/latches 2360, are discussed with respect to the READ methods of the present disclosure described in FIGS. 7A and 7B and explained in more detail further below with respect to memory data path circuits schematic diagram 2400. Responsive to control signals from the processor control element 2310, the various interconnections of bit lines, words lines, reference word lines (as shown in FIG. 6B, for example), sense amplifier/latches 2360, bit line drivers 2355, I/O gates 2370, data bus 2375, and data I/O buffer/driver 2380 during READ operations. Data I/O buffer/driver 2380 and sense amplifier/latches 2360, responsive to control signals from the processor control element 2310 are used to temporally latch and store logic values read from the resistive change element array. Responsive to the I/O gate element 2370 connected to data buffer driver element 2380 via data bus 2375 provides the logic values read from the array back to the processor control element 2310. In this way, the READ method of the present disclosure as described in detail within the discussion of FIGS. 7A and 7B above can be performed via electrical stimuli provided by processor control element 2310. Similarly, data may be provided from process controller 2310 to data I/O buffer/driver 2380 via the I/O bus lines I/O0, I/O1, I/O2, and I/O3. While a 4-bit external I/O bus is shown in this illustrative example, I/O bus widths may vary from 1 bit to many bits in width (32, 64, 128, etc.) for example. Data temporarily stored in the data I/O buffer/driver 2380 may stored in nonvolatile memory array 2340 using a first programming (WRITE) operation described in FIGS. 16A and 16B. Alternatively, data temporarily stored in the data I/O buffer/driver 2380 may be stored in nonvolatile memory 2340 using a second programming (WRITE) operation described in FIGS. 19A and 19B. READ and programming (WRITE) operations are described in more detail further below with respect to memory data path circuits schematic diagram 2400 illustrated in FIG. 24.

The processor control element 2310 within the exemplary access and addressing system of FIG. 23 is used to represent a programming operation circuit (or the like) that can be used to apply the different voltages and other conditions to the arrays of bit lines and word lines within a resistive change element array as required by the methods of the present disclosure and discussed with respect to FIGS. 7A, 7B, 16A, 16B, 19A, and 19B above. The electrical stimuli required by the programming (WRITE) and READ operations of the present disclosure can be implemented through a variety of structures as best fits the needs of a specific application. For example, FPGAs, PLDs, microcontrollers, logic circuits, or a software program executing on a computer could all be used to execute the programming operations and READ operations as detailed in FIGS. 7A, 7B, 16A, 16B, 19A, and 19B as discussed above.

It should be noted that though the 1-R resistive change element array architectures used to illustrate the programming and READ methods of the present disclosure are presented using the exemplary schematic drawings in FIGS. 3, 6A, and 6B, the methods of the present disclosure should not be limited to those specific electrical circuits depicted. Indeed, it will be clear to those skilled in the art that the electrical circuits depicted in FIGS. 3, 6A, and 6B can be altered in a plurality of ways and still realize an array architecture well suited to the programming and READ operations of the present disclosure. It is preferred, then, that the preceding description of resistive change element array architectures as they relate to the methods of the present disclosure be representative and inclusive of these variations and not otherwise limited to the specific illustrative parameters detailed.

Figure 24:
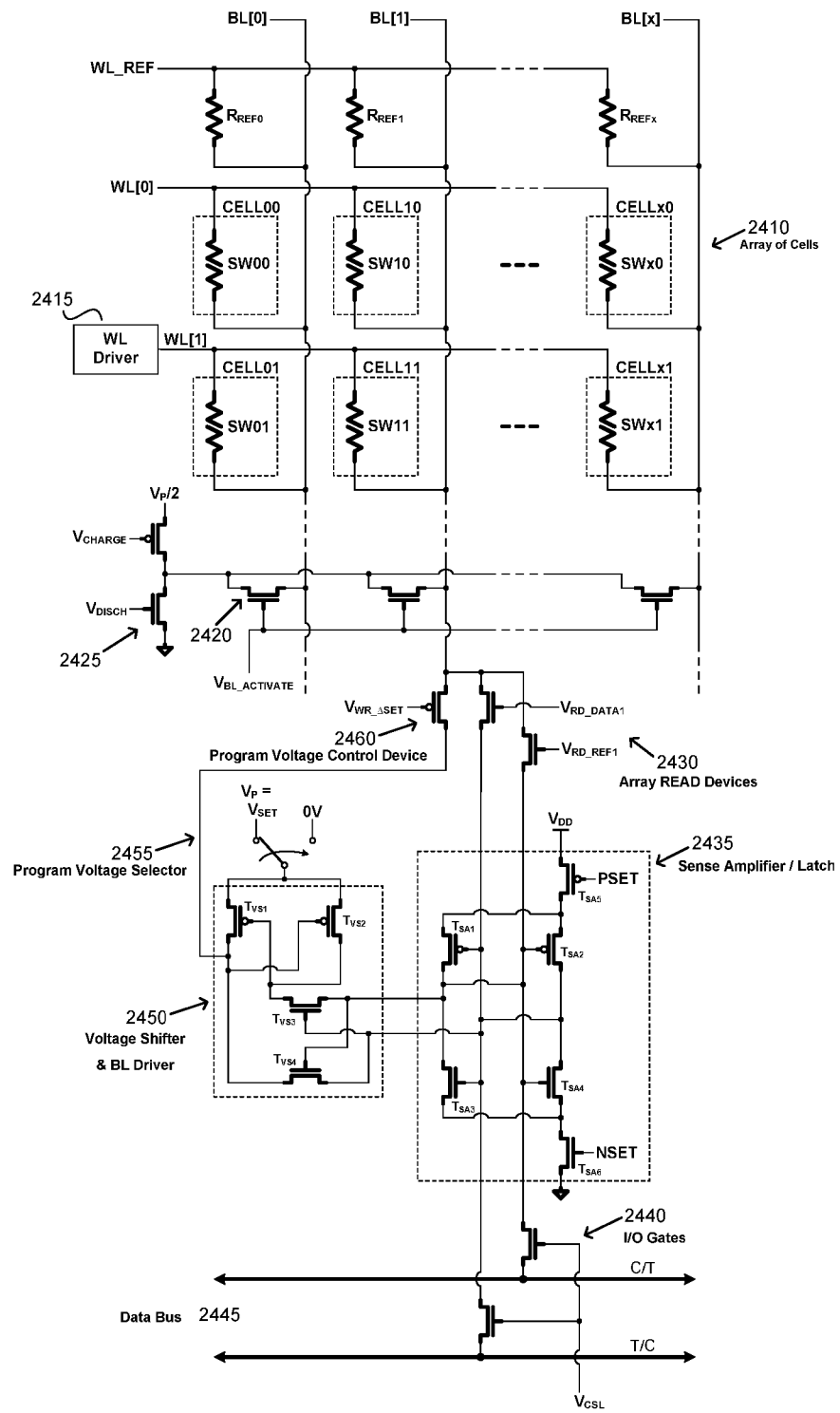
FIG. 24 is a simplified schematic diagram of an exemplary memory data path circuit well suited for implementing the READ operations of the present disclosure as detailed in FIG. 7B and the programming operations detailed in FIGS. 19A and 19B.

Referring now to FIG. 24, memory data path circuits schematic diagram 2400 may be used to illustrate an implementation of the READ operations as detailed in FIG. 7B and the programming operations detailed in FIGS. 19A and 19B. Note that the terms programming and WRITE are used interchangeably in this specification. Schematic diagram 2400 includes an array of cells 2410 formed by CNT switches and correspond to memory array 2340 illustrated in FIG. 23; representative word line (WL) driver 2415 corresponds to row (WL) address driver/buffer 2330; array READ devices 2430 correspond to array isolation devices 2350; sense amplifier/latch 2435 corresponds to sense amplifier/latches 2360; I/O gates 2440 correspond to I/O gates 2370; data bus 2445 corresponds to data bus 2375; voltage shifter & BL driver 2450, program voltage selector 2455, and program control device 2060 correspond to bit line driver 2355; BL coupling devices 2420 and BL charge/discharge circuit 2425 are used to simultaneously pre-charge and discharge all array 2410 bit lines. Exemplary schematic diagram 2400 shows details of devices and circuits that may be used to implement READ operations detailed in FIG. 7B and program operations detailed in FIGS. 19A and 19B for selected word line WL1 and selected bit line BL1. The data path circuits in schematic diagram 2400 are designed and operated such that sense amplifier/latch 2435, bidirectional data bus 2445, both shown in FIG. 24, and the bidirectional data I/O buffer/driver 2380 shown in FIG. 23 all operate at chip voltage $V_{DD}$ for both READ and WRITE operations. This is because even when relatively high $V_P$ programming voltages greater than $V_{DD}$ are applied to array of cells 2440, array READ devices 2430 act as array isolation devices during programming and prevent $V_P$ from appearing across sense amplifier/latch 2435 terminals. And also because voltage shifter & BL driver 2450, connected to sense amplifier/latch 2435 as described further below, generates programming voltage $V_P$ from sense amplifier output signals switching between ground (zero) and $V_{DD}$ levels.

The operation of array of cells 2410 and array READ devices 2430 are described further above for READ operations by flow chart 702 in FIG. 7B and in corresponding schematic diagrams 901 and 903 shown in FIGS. 9A and 9C, respectively. The operation of array of cells 2410, bit line coupling devices 2420, and bit line charge/discharge circuit 2425 are explained further above for programming operations by flow charts 1900 and 1950 in FIGS. 19A and 19B, respectively, and in corresponding schematic diagram 2001 shown in FIG. 20A.

Sense amplifier/latch 2435 is used to temporarily store data from array of cells 2410 during a READ operation and to temporarily store data from data bus 2045 during a programming operation. Sense amplifier/latch 2435 is formed as follows. PFET devices $T_{SA1}$ and $TS_{A2}$ source terminals are connected together and to PFET device $T_{SA5}$, whose source is connected chip voltage $V_{DD}$ and whose gate is connected to PSET control. NFET devices $T_{SA3}$ and $T_{SA4}$ source terminals are connected together and to NFET device $T_{SA6}$, whose source is connected to ground and whose gate is connected NSET control. The drains of $T_{SA1}$ and $T_{SA3}$ are connected together and to an output at node X1. The gates of $T_{SA1}$ and $T_{SA3}$ are connected together and connected to one of the pair of array read devices 2430 and one of the pair of bidirectional I/O gates 2440. The drains of $T_{SA2}$ and $T_{SA4}$ are connected together and to an output at node X2. The gates of $T_{SA2}$ and $T_{SA4}$ are connected together and connected to another of the pair of array READ devices 2430 and another of the pair of bidirectional I/O gates 2440. Node X1 is connected to the gates of $T_{SA2}$ and $T_{SA4}$ and node X2 is connected to the gates of $T_{SA1}$ and $T_{SA3}$, thereby forming sense amplifier/latch 2435. Sense amplifier/latch 2435 is only operational when pull-up device $T_{SA5}$ and pull-down device $T_{SA6}$ are activated. The READ voltage $V_{READ}$ used in the examples illustrated in FIGS. 14 and 15 is equal to 1 Volt.

The pair of bidirectional I/O gates 2440 are also connected to true (T/C) and complement (C/T) bidirectional data bus 2435 that is in turn connected to bidirectional data I/O buffer/driver 2380 illustrated in FIG. 23 (bidirectional data bus 2445 corresponds to data bus 2375).

Voltage shifter & BL driver 2450 is activated only during programming operations described with respect to flow charts 1900 and 1950 shown in FIGS. 19A and 19B, respectively, and as discussed above with respect to corresponding FIGS. 21 and 22. The voltage shifter & BL driver 2450 circuit is formed as follows. PFET devices $T_{VS1}$ and $T_{VS2}$ sources are connected together and to program voltage selector 2455. The drain of $T_{VS1}$ is connected to the drain of NFET device $T_{VS4}$ and the gate of $T_{VS2}$ at node $O_{VS}$. The drain of $T_{VS2}$ is connected to the drain of NFET $T_{VS3}$ and the gate of $T_{VS1}$. The source of $T_{VS3}$ is connected to the gate of $T_{VS4}$ and to terminal X1 of sense amplifier/latch 2435. The source of $T_{VS4}$ is connected to the gate of $T_{VS3}$ and to terminal X2 of sense amplifier/latch 2435. The output node $O_{VS}$ of voltage shifter & BL driver 2450 is connected to the source of program voltage control device 2460, a PFET device, controlled by signal $V_{WR\_ASET}$ connected to the gate. The drain of program voltage control device 2460 is connected to bit line BL1 of array of cells 2410 in this example. Voltage shifter & BL driver 2450 is activated when program voltage selector 2455 is connected to voltage $V_{SET}$, and is de-activated when connected to 0 Volts. In this example, $V_{SET}=2$ V and $V_{SET}/2=1$ V.

As described with respect to flow chart 1950 illustrated in FIG. 19B, process step 1960 pre-charges all bit lines in array of cells 2410 while word lines float. Accordingly, bit line coupling devices 2420 are activated and bit lines are pre-charged by bit line charge/discharge circuit 2425 to half the programming voltage $V_P/2$ and then bit line coupling devices 2420 are turned OFF prior to programming BL1. As explained further above, $V_P=V_{SET}$ since all cells in array of cells 2410 are in a high resistance RESET state. Signal $V_{WR\_ASET}$ is at $V_{SET}/2$ such that if the input data is a logic "0", and node $O_{VS}$ is at zero volts, program control voltage device 2460 is OFF isolating bit line BL1 from voltage shifter & BL driver 2450, and bit line BL1 remains pre-charged to $V_{SET}/2$. However, if the input data is a logic "1", then node $O_{VS}$ transitions from 0 to SET voltage $V_{SET}$. When node $O_{VS}$ exceeds $V_{SET}/2$, then program voltage control device 2460 turns ON and drives bit line BL1 to $V_{SET}$ as described by process step 1970 shown in FIG. 19B. At this time, the selected word line WL1 is driven to ground by WL driver 2415 as described in FIG. 19B process step 1980 and the cell, in this example CELL11 shown in array of cells 2410, switches from the high resistance $R_H$ RESET state to the low resistance $R_L$ SET state. Referring to the examples in table 2200 in FIG. 22, the unselected bit line voltages increase from a pre-charge value of 1.0 V. to 1.3V after a SET operation. Referring to program voltage control device 2460, optionally, voltage $V_{WR\_ASET}$ may be lowered from 1 V to 0.85 V, for example, prior to voltage shifter & BL driver 2450 transition to $V_{SET}$ thereby reducing unselected bit voltages from approximately 1.3V to approximately 1.15V, and therefore closer to the pre-charge value of 1V.

Figure 25:
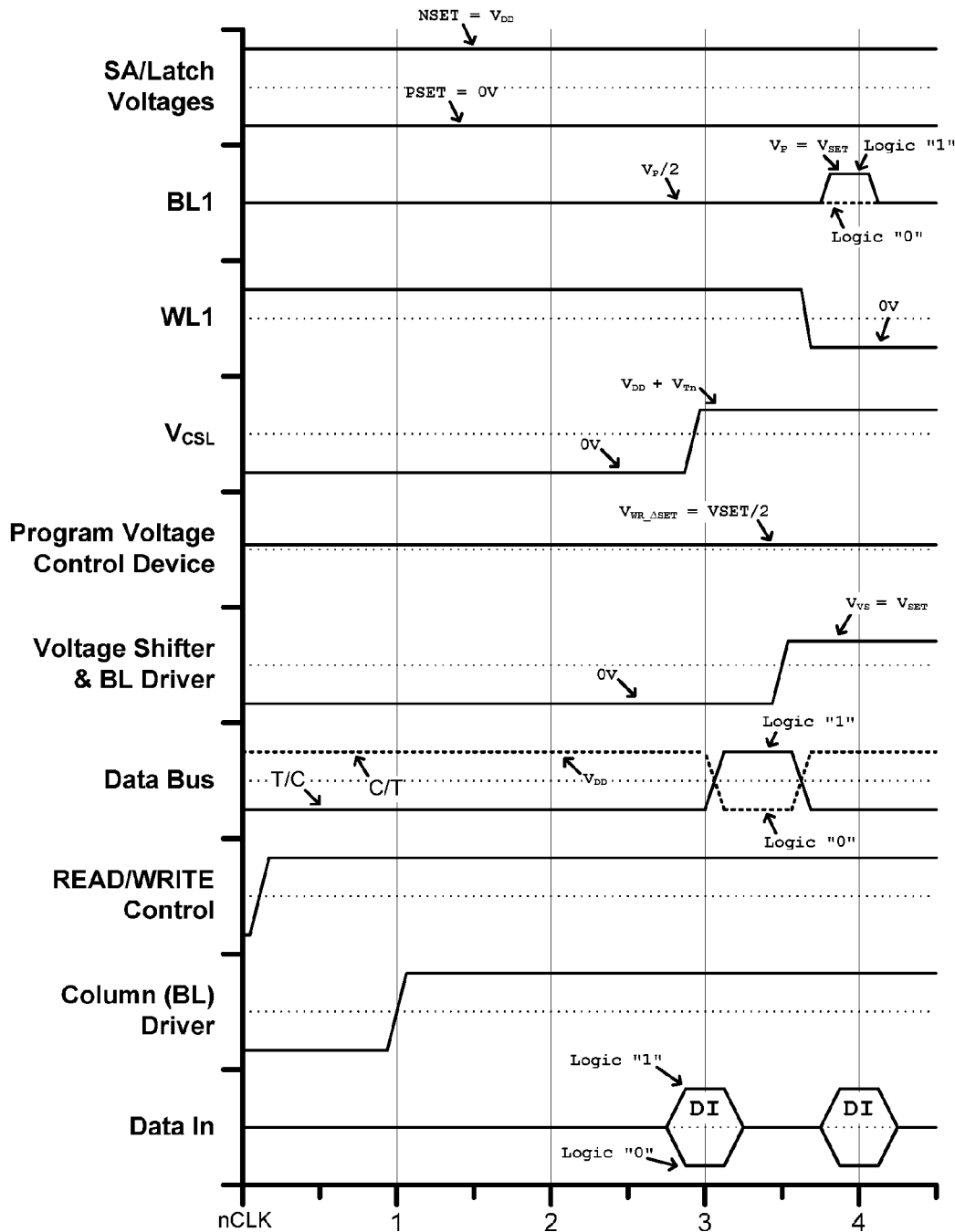
FIG. 25 is a series of waveform diagrams illustrating the various operational waveforms resulting from calculations of the electrical performance of memory data path circuits schematic diagram detailed in FIG. 24.

Referring now to FIG. 25, programming (WRITE) operation 2500 illustrates the various operational waveforms resulting from calculations of the electrical performance of memory data path circuits schematic diagram 2400. In this example, a READ/WRITE control signal process controller 2310, in the block diagram access and addressing system 2300 shown in FIG. 23, initiates a WRITE operation via a READ/WRITE control signal and provides word and column addresses which are decoded by the cross point memory system. FIG. 25 waveforms focus on the data path circuits shown in schematic diagram 2400 illustrated in FIG. 24. Data provided by process controller 2310 to data I/O buffer/driver 2380 shown in FIG. 23 is transmitted to bidirectional data bus 2375, which corresponds to data bus 2445 in FIG. 24. Sense amplifier/latch 2435 is activated and connected to chip power supply $V_{DD}$ and ground by pull-up transistor $T_{SA5}$ and pull-down transistors $T_{SA6}$. Voltage shifter & BL driver 2450 is activated by program voltage selector 2455 and connected to voltage $V_P=V_{SET}$ which is equal to 2V in this example. Program voltage control device 2460 is in OFF state isolating BL1 from the output node $O_{VS}$ of voltage shifter & BL driver 2450 until node $O_{VS}$ exceeds $V_{SET}/2=1$ V in this example. During this time, word line WL1 is selected, all bit lines in array of cells 2410 are pre-charged to $V_{SET}/2$, and bit line BL1 is selected.

At this time, $V_{CSL}$ is applied to I/O gates 2440 and the logic signal is transmitted from data bus 2445 to sense amplifier/latch 2435 inputs. A logic "1" input results in a $V_{DD}$ voltage on the T/C bus line (zero voltage on the C/T bus line) and a logic "0" voltage results in a zero voltage on the T/C bus line ($V_{DD}$ on the C/T bus line). In this example, a logic "1" data input is provided and sense amplifier/latch 2435 temporarily stores the signal. The sense amplifier output X1 transitions to 0V and output X2 transitions to $V_{DD}$. This input to voltage shifter & BL driver 2450 causes the voltage shifter & bit line driver 2450 output node $O_{VS}$ to transition to $V_{SET}$, 2 V in this example. With program voltage control device gate at $V_{WR\_ASET}=V_{SET}/2=1V$, bit line BL1 transitions from $V_{SET}/2$ to $V_{SET}$ for a logic "1" signal (for a logic "0" signal, $V_{BL1}$ would have remained at $V_{SET}/2$). Word line WL1 transitions to zero volts. $V_{SET}$, in this example 2V, appears between selected bit line BL1 and selected word line WL1 and CELL11 in array of cells 2410 switches from high resistance $R_H$ RESET state to low resistance $R_L$ SET state completing the storage of a data input from process controller 2310 to a memory array cell corresponding to CELL11 in array of cells 2410.

The values of voltages, currents, and timings have been calculated as described further above with respect to FIGS. 21 and 22. However, for a selected CMOS technology, physical and electrical parameters and models are provided by the fabricator that can be used with design, layout, and simulation software for accurate simulations. A model for nonlinear CNT switches can be derived from CNT switch I-V electrical characteristics, such as semi-log plot 1300 shown in FIG. 13. For example, semi-log plot 1300 can be approximated using nonlinear polynomial equations to provide a CNT switch model that can be introduced in the simulation software.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A resistive change element array, comprising:
   a plurality of word lines;
   a plurality of bit lines;
   a plurality of resistive change elements, wherein each resistive change element has a first terminal and a second terminal and wherein said first terminal of each resistive change element is in electrical communication with a word line and said second terminal of each resistive change element is in electrical communication with a bit line;
   at least one resistive reference element, said resistive reference element having a first terminal in electrical communication with a word line and a second terminal in electrical communication with a bit line; and
   control circuitry in electrical communication with said word lines and bit lies, said control circuitry capable of discharging a preselected voltage and observing a resulting discharge current through at least one of said plurality of resistive change elements and said at least one resistive reference element.

2. The resistive change element array of claim 1 wherein said control circuitry is capable of discharging preselected voltages and observing resulting discharge currents through multiple resistive change elements in a single operation.

3. The resistive change element array of claim 1 wherein said control circuitry is capable of discharging preselected voltages and observing resulting discharge currents through a resistive change element and a resistive reference element in a single operation.

4. The resistive change element array of claim 1 wherein said control circuitry is capable of comparing observed discharge currents through a selected resistive change element and a resistive reference element to determine the resistive state of said selected resistive change element.

5. The resistive change element array of claim 4 wherein said control circuitry is capable of determining the resistive state of every resistive change element in electrical communication with a selected word line in a single operation.

6. The resistive change element array of claim 4 wherein a discharge current observed through said selected resistive change element higher than a discharge current through said resistive reference element corresponds to a first logic state and a discharge current observed through said selected resistive change element lower than a discharge current through said resistive reference element corresponds to a second logic state.

7. The resistive change element array of claim 1 wherein said control circuitry is capable of providing at least one programming current through at least one resistive change element.

8. The resistive change element array of claim 7 wherein said at least one programming current is capable of adjusting the electrical resistance of at least one resistive change element from a first resistive state to a second resistive state.

9. The resistive change element array of claim 8 wherein said first resistive state is lower than said second resistive state.

10. The resistive change element array of claim 8 wherein said first resistive state is higher than said second resistive state.

11. The resistive change element array of claim 8 wherein the resistive state of every resistive change element in electrical communication with a selected word line is adjusted in a single operation.

12. The resistive change element array of claim 8 wherein said first resistive state corresponds to a first logic value and said second logic state corresponds to a second logic value.

13. The resistive change element array of claim 1 wherein each bit line has a resistive reference element.

14. The resistive change element array of claim 1 wherein said resistive change elements are two-terminal nanotube switching elements.

15. The resistive change element array of claim 14 wherein said two-terminal nanotube switching elements comprise a nanotube fabric.

16. The resistive change element array of claim 1 wherein said resistive change elements are metal oxide memory elements.

17. The resistive change element array of claim 1 wherein said resistive change elements are phase change memory elements.

18. The method of claim 1 wherein said resistive change element array is a memory array.

* * * * *